(12) United States Patent
Sauer et al.

(10) Patent No.: US 12,080,201 B2
(45) Date of Patent: Sep. 3, 2024

(54) TOUCH SENSING UTILIZING INTEGRATED MICRO CIRCUITRY

(71) Applicant: Apple Inc., Cupertino, CA (US)

(72) Inventors: Christian M. Sauer, Los Altos, CA (US); Christoph H. Krah, Cupertino, CA (US); Derek K. Shaeffer, Redwood City, CA (US); Hasan Akyol, Los Altos, CA (US); Henry C. Jen, Los Altos, CA (US); John T. Wetherell, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/468,654

(22) Filed: Sep. 15, 2023

(65) Prior Publication Data

US 2024/0004491 A1    Jan. 4, 2024

Related U.S. Application Data

(63) Continuation of application No. 17/384,415, filed on Jul. 23, 2021, now Pat. No. 11,775,095, which is a
(Continued)

(51) Int. Cl.
   G06F 3/044    (2006.01)
   G06F 3/041    (2006.01)
(Continued)

(52) U.S. Cl.
   CPC ............ *G09G 3/32* (2013.01); *G06F 3/0412* (2013.01); *G06F 3/0418* (2013.01); *G06F 3/044* (2013.01);
(Continued)

(58) Field of Classification Search
   None
   See application file for complete search history.

(56) References Cited

U.S. PATENT DOCUMENTS

| 5,857,109 A | 1/1999 | Taylor |
| 7,364,928 B2 | 4/2008 | Imamura |

(Continued)

FOREIGN PATENT DOCUMENTS

| CN | 102239561 A | 11/2011 |
| CN | 204537087 U | 8/2015 |

(Continued)

OTHER PUBLICATIONS

Final Office Action received for U.S. Appl. No. 16/517,513, mailed on Nov. 6, 2020, 20 pages.
(Continued)

*Primary Examiner* — Parul H Gupta
(74) *Attorney, Agent, or Firm* — Kubota & Basol LLP

(57) ABSTRACT

An integrated touchscreen can include light emitting diodes or organic light emitting diodes (LEDs/OLEDs), display chiplets and touch chiplets disposed in a visible area of the integrated touch screen. For example, the LEDs/OLEDs, display chiplets and touch chiplets can be placed on a substrate by a micro-transfer tool. The integrated touchscreen can also include electrodes disposed in the visible area of the integrated touch screen. The electrodes can be capable of providing display functionality via the one or more display chiplets during display operation (e.g., operating as cathode terminals of the LEDs during the display operation) and capable of providing touch functionality via the touch chiplets during touch operation (e.g., touch node electrodes can be formed from groups of the electrodes and sensed). In some examples, the touch node electrodes can be formed and coupled to touch chiplets via the display chiplets.

20 Claims, 26 Drawing Sheets

Related U.S. Application Data continuation of application No. 16/517,513, filed on Jul. 19, 2019, now Pat. No. 11,073,927.

(60) Provisional application No. 62/703,871, filed on Jul. 26, 2018.

(51) Int. Cl.
 *G09G 3/32* (2016.01)
 *H01L 27/15* (2006.01)

(52) U.S. Cl.
 CPC ....... *H01L 27/156* (2013.01); *G09G 2354/00* (2013.01)

(56) References Cited

U.S. PATENT DOCUMENTS

| | | | |
|---|---|---|---|
| 9,153,171 | B2 | 10/2015 | Sakariya et al. |
| 9,367,094 | B2 | 6/2016 | Bibl et al. |
| 9,588,626 | B2 | 3/2017 | Narayanasamy et al. |
| 9,865,832 | B2 | 1/2018 | Bibl et al. |
| 11,662,867 | B1 * | 5/2023 | Krah .................. G06F 3/0446 345/174 |
| 2005/0162408 | A1 | 7/2005 | Martchovsky |
| 2009/0009483 | A1 * | 1/2009 | Hotelling .............. G06F 3/0445 345/173 |
| 2011/0050586 | A1 | 3/2011 | Miller et al. |
| 2011/0291992 | A1 | 12/2011 | Burroughes et al. |
| 2012/0206421 | A1 | 8/2012 | Cok et al. |
| 2012/0249401 | A1 | 10/2012 | Omoto |
| 2012/0307123 | A1 | 12/2012 | Cok et al. |
| 2014/0049256 | A1 | 2/2014 | Smith et al. |
| 2014/0085214 | A1 | 3/2014 | Cok |
| 2016/0098114 | A1 | 4/2016 | Pylvas |
| 2016/0210895 | A1 | 7/2016 | Fan et al. |
| 2017/0068362 | A1 | 3/2017 | Den Boer et al. |
| 2017/0090615 | A1 | 3/2017 | Bohannon et al. |
| 2017/0277315 | A1 | 9/2017 | Wu |
| 2017/0285859 | A1 | 10/2017 | Shepelev et al. |
| 2017/0315650 | A1 | 11/2017 | Reynolds |
| 2017/0322669 | A1 | 11/2017 | Hotelling et al. |
| 2018/0032176 | A1 * | 2/2018 | Krah .................. G06F 3/0418 |
| 2019/0050604 | A1 | 2/2019 | Weber et al. |
| 2019/0056803 | A1 * | 2/2019 | Nussbaum ........... G06F 3/0383 |
| 2019/0204954 | A1 | 7/2019 | Kim et al. |
| 2020/0033979 | A1 | 1/2020 | Sauer et al. |
| 2021/0357063 | A1 | 11/2021 | Sauer et al. |

FOREIGN PATENT DOCUMENTS

| | | |
|---|---|---|
| KR | 10-2015-0066791 A | 6/2015 |
| WO | 2017/060487 A2 | 4/2017 |
| WO | 2017/154278 A1 | 9/2017 |

OTHER PUBLICATIONS

International Search Report received for PCT Patent Application No. PCT/US2019/42710, mailed on Sep. 12, 2019, 4 pages.
Non-Final Office Action received for U.S. Appl. No. 16/517,513, mailed on Jun. 25, 2020, 18 pages.
Non-Final Office Action received for U.S. Appl. No. 17/384,415, mailed on Dec. 15, 2022, 16 pages.
Notice of Allowance received for U.S. Appl. No. 16/517,513, mailed on Mar. 25, 2021, 9 pages.
Notice of Allowance received for U.S. Appl. No. 17/384,415, mailed on May 12, 2023, 9 pages.
Peer ISA contribution from CNIPA under PCT Collaborative Search and Examination (CS&E) Pilot in PCT Patent Application No. PCT/US2019/042710 uploaded to ePCT on Sep. 2, 2019, 10 pages.
Peer ISA contribution from JPO under PCT Collaborative Search and Examination (CS&E) Pilot in PCT Patent Application No. PCT/US2019/042710 uploaded to ePCT on Sep. 3, 2019, 8 pages.
Peer ISA contribution from KIPO under PCT Collaborative Search and Examination (CS&E) Pilot in PCT Patent Application No. PCT/US2019/042710 uploaded to ePCT on Sep. 2, 2019, 24 pages.
Peer ISA contribution from USPTO under PCT Collaborative Search and Examination (CS&E) Pilot in PCT Patent Application No. PCT/US2019/042710 uploaded to ePCT on Aug. 17, 2019, 8 pages.

* cited by examiner

|  |  |  |  |
|---|---|---|---|
| $F_1/I$ | $F_3/I$ | $F_5/I$ | $F_7/I$ |
| $F_1/Q$ | $F_3/Q$ | $F_5/Q$ | $F_7/Q$ |
| $F_2/I$ | $F_4/I$ | $F_6/I$ | $F_8/I$ |
| $F_2/Q$ | $F_4/Q$ | $F_6/Q$ | $F_8/Q$ |

*FIG. 12A*

|  |  |  |  |
|---|---|---|---|
| $F_1/I$ | $F_2/Q$ | $F_3/I$ | $F_4/Q$ |
| $F_1/Q$ | $F_2/I$ | $F_3/Q$ | $F_4/I$ |
| $F_1/I$ | $F_2/Q$ | $F_3/I$ | $F_4/Q$ |
| $F_1/Q$ | $F_2/I$ | $F_3/Q$ | $F_4/I$ |

*FIG. 12B*

|  |  |  |  |
|---|---|---|---|
| $F_5/I$ | $F_6/Q$ | $F_7/I$ | $F_8/Q$ |
| $F_5/Q$ | $F_6/I$ | $F_7/Q$ | $F_8/I$ |
| $F_5/I$ | $F_6/Q$ | $F_7/I$ | $F_8/Q$ |
| $F_5/Q$ | $F_6/I$ | $F_7/Q$ | $F_8/I$ |

| 1502 | SIMULTANEOUSLY SENSE THE PLURALITY OF TOUCH NODES ELECTRODES OF A PLURALITY OF REGIONS IN A SPECTRAL ANALYSIS MODE WHILE THE TOUCH CHIPLETS DO NOT STIMULATE THE PLURALITY OF TOUCH NODE ELECTRODES, SUCH THAT NOISE AT MULTIPLE FREQUENCIES ARE SIMULTANEOUSLY SENSED FOR EACH OF THE PLURALITY OF REGIONS |

FOR EACH RESPECTIVE FREQUENCY OF THE MULTIPLE FREQUENCIES: CONFIGURE A FIRST OF THE TOUCH CHIPLETS TO DEMODULATE USING A FIRST DEMODULATION SIGNAL AT THE RESPECTIVE FREQUENCY AND HAVING A FIRST PHASE; AND CONFIGURE A SECOND OF THE TOUCH CHIPLETS TO DEMODULATE USING A SECOND DEMODULATION SIGNAL AT THE RESPECTIVE FREQUENCY AND HAVING A SECOND PHASE, 90 DEGREES OUT OF PHASE WITH THE FIRST PHASE ~1504

FOR EACH RESPECTIVE FREQUENCY OF THE MULTIPLE FREQUENCIES: CONFIGURE TOUCH CHIPLETS CORRESPONDING TO A FIRST COLUMN OF THE TOUCH NODE ELECTRODES TO DEMODULATE USING A FIRST DEMODULATION SIGNAL AT THE RESPECTIVE FREQUENCY AND HAVING A FIRST PHASE; AND CONFIGURE TOUCH CHIPLETS CORRESPONDING TO A SECOND COLUMN OF THE TOUCH NODE ELECTRODES TO DEMODULATE USING A SECOND DEMODULATION SIGNAL AT THE RESPECTIVE FREQUENCY AND HAVING A SECOND PHASE, 90 DEGREES OUT OF PHASE WITH THE FIRST PHASE ~1506

CONFIGURE SIXTEEN CORRESPONDING TOUCH CHIPLETS (CORRESPONDING TO A REGION INCLUDING SIXTEEN TOUCH NODE ELECTRODES) TO SENSE THE NOISE AT EIGHT DIFFERENT FREQUENCIES ~1508

CONFIGURE SIXTEEN CORRESPONDING TOUCH CHIPLETS (CORRESPONDING TO A REGION INCLUDING SIXTEEN TOUCH NODE ELECTRODES) TO SENSE THE NOISE AT FOUR DIFFERENT FREQUENCIES ~1510

CONFIGURE SIXTY-FOUR CORRESPONDING TOUCH CHIPLETS (CORRESPONDING TO A REGION INCLUDING SIXTY-FOUR TOUCH NODE ELECTRODES) TO SENSE THE NOISE AT THIRTY-TWO DIFFERENT FREQUENCIES ~1512

CONFIGURE SIXTY-FOUR CORRESPONDING TOUCH CHIPLETS (CORRESPONDING TO A REGION INCLUDING SIXTY-FOUR TOUCH NODE ELECTRODES) TO SENSE THE NOISE AT EIGHT DIFFERENT FREQUENCIES ~1514

DEMODULATE, AT EACH OF THE TOUCH CHIPLETS, AN OUTPUT OF THE CAPACITIVE SENSOR ACCORDING SENSOR ACCORDING TO A DEMODULATION SIGNAL (E.G., DEMODULATION SIGNALS PROVIDED TO THE TOUCH CHIPLETS FROM AN INTEGRATED TOUCH AND DISPLAY CONTROLLER) ~1516

IDENTIFY ONE OR MORE FREQUENCIES MEETING ONE OR MORE CRITERIA TO BE CLASSIFIED AS LOW-NOISE FREQUENCIES BASED ON THE DIGITAL OUTPUTS FROM THE TOUCH CHIPLETS ~1518

*FIG. 15*

TOUCH SENSING UTILIZING INTEGRATED MICRO CIRCUITRY

CROSS REFERENCE TO RELATED APPLICATIONS

This application is a continuation of U.S. patent application Ser. No. 17/384,415, filed Jul. 23, 2021, and published on Nov. 18, 2021 as U.S. Publication No. 2021-0357063, which is a continuation of U.S. patent application Ser. No. 16/517,513, filed Jul. 19, 2019, and issued on Jul. 27, 2021 as U.S. Pat. No. 11,073,927, which claims benefit of U.S. Provisional Application No. 62/703,871, filed Jul. 26, 2018, the contents of which are hereby incorporated by reference in their entireties for all purposes.

FIELD OF THE DISCLOSURE

This relates generally to a touch and/or proximity detection device and more particularly to a touch and/or proximity detection device including integrated micro circuitry.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are popular because of their ease and versatility of operation as well as their declining price. Touch screens can include a touch sensor panel, which can be a clear panel with a touch-sensitive surface, and a display device such as a liquid crystal display (LCD), light emitting diode (LED) display or organic light emitting diode (OLED) display that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing electric fields used to detect touch can extend beyond the surface of the display, and objects approaching near the surface may be detected near the surface without actually touching the surface.

Capacitive touch sensor panels can be formed by a matrix of transparent, semi-transparent or non-transparent conductive plates made of materials such as Indium Tin Oxide (ITO). In some examples, the conductive plates can be formed from other materials including conductive polymers, metal mesh, graphene, nanowires (e.g., silver nanowires) or nanotubes (e.g., carbon nanotubes). It is due in part to their substantial transparency that some capacitive touch sensor panels can be overlaid on a display to form a touch screen, as described above. Some touch screens can be formed by at least partially integrating touch sensing circuitry into a display pixel stackup (i.e., the stacked material layers forming the display pixels).

In some cases, parasitic or stray capacitances can exist between the touch node electrodes used for sensing touch on the touch sensor panels, and other components of the devices in which the touch sensor panels are included, which can be referenced to a chassis ground (also referred to herein as device ground or earth ground). These parasitic or stray capacitances can introduce errors and/or offsets into the touch outputs of the touch sensor panels. Therefore, it can be beneficial to reduce or eliminate such parasitic or stray capacitances.

SUMMARY OF THE DISCLOSURE

This relates generally to an integrated touchscreen. The integrated touchscreen can include light emitting diodes or organic light emitting diodes (LEDs/OLEDs), display chiplets and touch chiplets. In some examples, the LEDs/OLEDs, display chiplets and touch chiplets can be disposed in a visible area of the integrated touch screen. In some examples, some or all of the display chiplets and/or touch chiplets can be disposed outside of the visible area of the integrated touch screen. The LEDs/OLEDs, display chiplets and touch chiplets can be placed on a substrate by a micro-transfer tool, for example. The integrated touchscreen can also include electrodes (e.g., ITO) disposed in the visible area of the integrated touch screen. The electrodes can be capable of providing display functionality via the one or more display chiplets during display operation and capable of providing touch functionality via the touch chiplets during touch operation. For example, the electrodes can be capable of operating as cathode terminals of the LEDs during the display operation. During the touch operation, touch node electrodes can be formed from groups of the electrodes and sensed. In some examples, the touch node electrodes can be formed and coupled to touch chiplets via the display chiplets.

Additionally, the integrated touchscreen can comprise an integrated touch and display controller. The touch and display controller can provide control and timing signals to the touch and display chiplets, and can read out touch data (and/or temperature data) from the touch chiplets. Additionally, in some examples, each touch node electrode can be coupled to more than one touch chiplets (e.g., a pair of touch chiplets). One of the touch chiplets can be a "main" touch chiplet and the second (or additional) of the touch chiplets can be a "redundant" touch chiplet. The touch chiplets can be programmed by the touch and display controller with state information, so that one touch chiplet per touch node electrode can perform touch operations associated with the corresponding touch node electrode.

Additionally or alternatively, the integrated touch screen can include multiple regions, and each of the multiple regions can include multiple touch node electrodes. The touch chiplets can be configured to simultaneously sense the touch nodes electrodes of each of the regions in a spectral analysis mode while the touch chiplets do not stimulate the touch node electrodes. As a result, the touch chiplets can simultaneously sense noise at multiple frequencies for each of the regions (e.g., without aggregation and/or storing the touch data for subsequent processing).

BRIEF DESCRIPTION OF THE DRAWINGS

FIGS. 12A-12C illustrates exemplary configurations of touch chiplets for spectral analysis according to examples of the disclosure.

FIG. 15 illustrates an exemplary process of spectral analysis using touch chiplets according to examples of the disclosure.

DETAILED DESCRIPTION

Figure 1A:
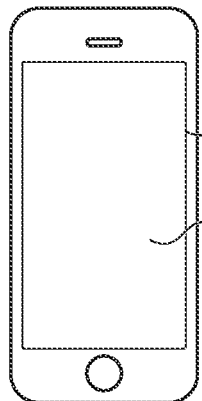
FIGS. 1A-1E illustrate example systems in which an integrated touch screen according to examples of the disclosure may be implemented.

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

This relates generally to an integrated touchscreen. The integrated touchscreen can include light emitting diodes or organic light emitting diodes (LEDs/OLEDs), display chiplets and touch chiplets. In some examples, the LEDs/OLEDs, display chiplets and touch chiplets can be disposed in a visible area of the integrated touch screen. In some examples, some or all of the display chiplets and/or touch chiplets can be disposed outside of the visible area of the integrated touch screen. The LEDs/OLEDs, display chiplets and touch chiplets can be placed on a substrate by a micro-transfer tool, for example. The integrated touchscreen can also include electrodes (e.g., ITO) disposed in the visible area of the integrated touch screen. The electrodes can be capable of providing display functionality via the one or more display chiplets during display operation and capable of providing touch functionality via the touch chiplets during touch operation. For example, the electrodes can be capable of operating as cathode terminals of the LEDs during the display operation. During the touch operation, touch node electrodes can be formed from groups of the electrodes and sensed. In some examples, the touch node electrodes can be formed and coupled to touch chiplets via the display chiplets.

Additionally, the integrated touchscreen can comprise an integrated touch and display controller. The touch and display controller can provide control and timing signals to the touch and display chiplets, and can read out touch data (and/or temperature data) from the touch chiplets. Additionally, in some examples, each touch node electrode can be coupled to more than one touch chiplets (e.g., a pair of touch chiplets). One of the touch chiplets can be a "main" touch chiplet and the second (or additional) of the touch chiplets can be a "redundant" touch chiplet. The touch chiplets can be programmed by the touch and display controller with state information, so that one touch chiplet per touch node electrode can perform touch operations associated with the corresponding touch node electrode.

Additionally or alternatively, the integrated touch screen can include multiple regions, and each of the multiple regions can include multiple touch node electrodes. The touch chiplets can be configured to simultaneously sense the touch nodes electrodes of each of the regions in a spectral analysis mode while the touch chiplets do not stimulate the touch node electrodes. As a result, the touch chiplets can simultaneously sense noise at multiple frequencies for each of the regions (e.g., without aggregation and/or storing the touch data for subsequent processing).

Figure 1B:
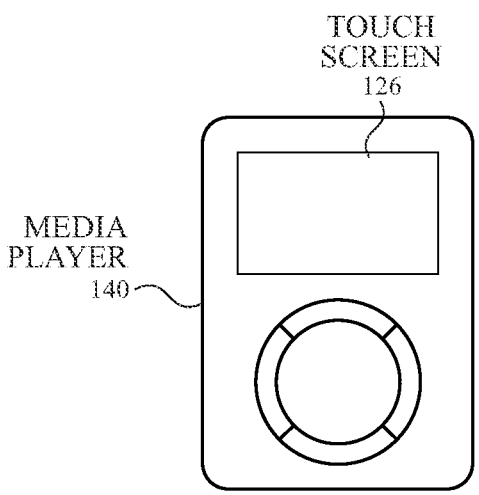
Figure 1C:
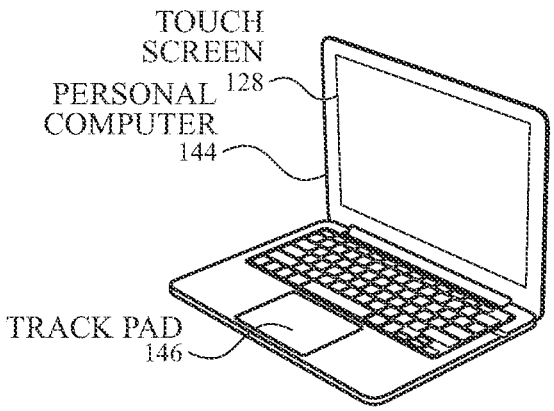
Figure 1D:
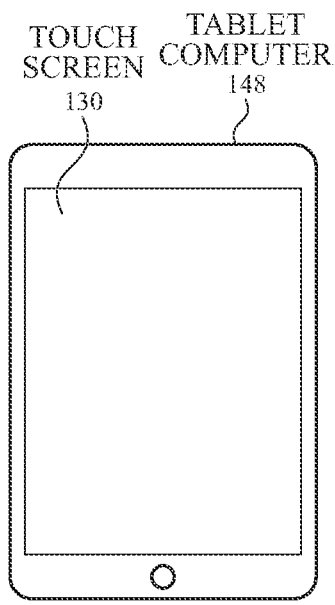
Figure 1E:
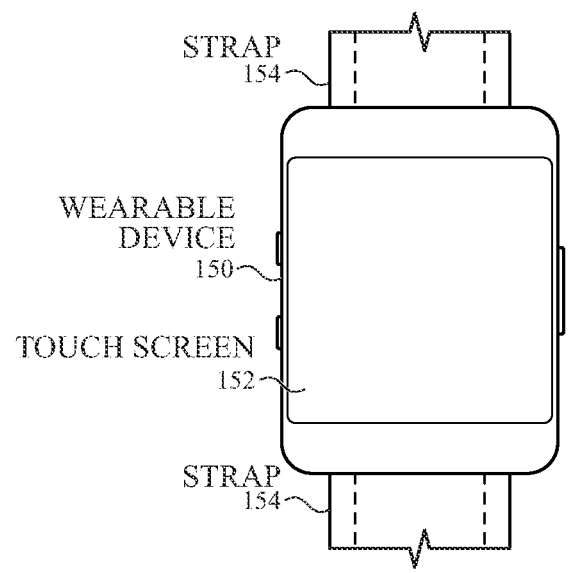

FIGS. 1A-1E illustrate example systems in which an integrated touch screen according to examples of the disclosure may be implemented. FIG. 1A illustrates an example mobile telephone 136 that includes an integrated touch screen 124. FIG. 1B illustrates an example digital media player 140 that includes an integrated touch screen 126. FIG. 1C illustrates an example personal computer 144 that includes a trackpad 146 and an integrated touch screen 128. FIG. 1D illustrates an example tablet computer 148 that includes an integrated touch screen 130. FIG. 1E illustrates an example wearable device 150 (e.g., a watch) that includes an integrated touch screen 152. It is understood that the above integrated touch screens can be implemented in other devices as well. Additionally it should be understood that although the disclosure herein primarily focuses on integrated touch screens, some of the disclosure is also applicable to touch sensor panels without a corresponding display.

In some examples, touch screens 124, 126, 128, 130 and 152 can be based on self-capacitance. A self-capacitance based touch system can include a matrix of small, individual plates of conductive material or groups of individual plates of conductive material forming larger conductive regions that can be referred to as touch node electrodes (as described below with reference to FIG. 4). For example, a touch screen can include a plurality of individual touch node electrodes, each touch node electrode identifying or representing a unique location (e.g., a touch node) on the touch screen at which touch or proximity is to be sensed, and each touch node electrode being electrically isolated from the other touch node electrodes in the touch screen/panel. Such a touch screen can be referred to as a pixelated self-capacitance touch screen, though it is understood that in some examples, the touch node electrodes on the touch screen can be used to perform scans other than self-capacitance scans on the touch screen (e.g., mutual capacitance scans). During operation, a touch node electrode can be stimulated with an AC waveform, and the self-capacitance to ground of the touch node electrode can be measured. As an object approaches the touch node electrode, the self-capacitance to ground of the touch node electrode can change (e.g., increase). This change in the self-capacitance of the touch node electrode can be detected and measured by the touch sensing system to determine the positions of multiple objects when they touch, or come in proximity to, the touch screen. In some examples, the touch node electrodes of a self-capacitance based touch system can be formed from rows and columns of conductive material, and changes in the self-capacitance to ground of the rows and columns can be detected, similar to above. In some examples, a touch screen can be multi-touch, single touch, projection scan, full-imaging multi-touch, capacitive touch, etc.

In some examples, touch screens 124, 126, 128, 130 and 152 can be based on mutual capacitance. A mutual capacitance based touch system can include electrodes arranged as drive and sense lines that may cross over each other on different layers, or may be adjacent to each other on the same layer. The crossing or adjacent locations can form touch nodes. During operation, the drive line can be stimulated with an AC waveform and the mutual capacitance of the touch node can be measured. As an object approaches the touch node, the mutual capacitance of the touch node can change (e.g., increase). This change in the mutual capacitance of the touch node can be detected and measured by the touch sensing system to determine the positions of multiple objects when they touch, or come in proximity to, the touch screen. As described herein, in some examples, a mutual capacitance based touch system can form touch nodes from a matrix of small, individual plates of conductive material.

In some examples, touch screens 124, 126, 128 and 130 can be based on mutual capacitance and/or self-capacitance. The electrodes can be arrange as a matrix of small, individual plates of conductive material (e.g., as in touch screen 400 in FIG. 4) or as drive lines and sense lines, or in another pattern. The electrodes can be configurable for mutual capacitance or self-capacitance sensing or a combination of mutual and self-capacitance sensing. For example, in one mode of operation electrodes can be configured to sense mutual capacitance between electrodes and in a different mode of operation electrodes can be configured to sense self-capacitance of electrodes. In some examples, some of the electrodes can be configured to sense mutual capacitance therebetween and some of the electrodes can be configured to sense self-capacitance thereof.

Figure 2A:
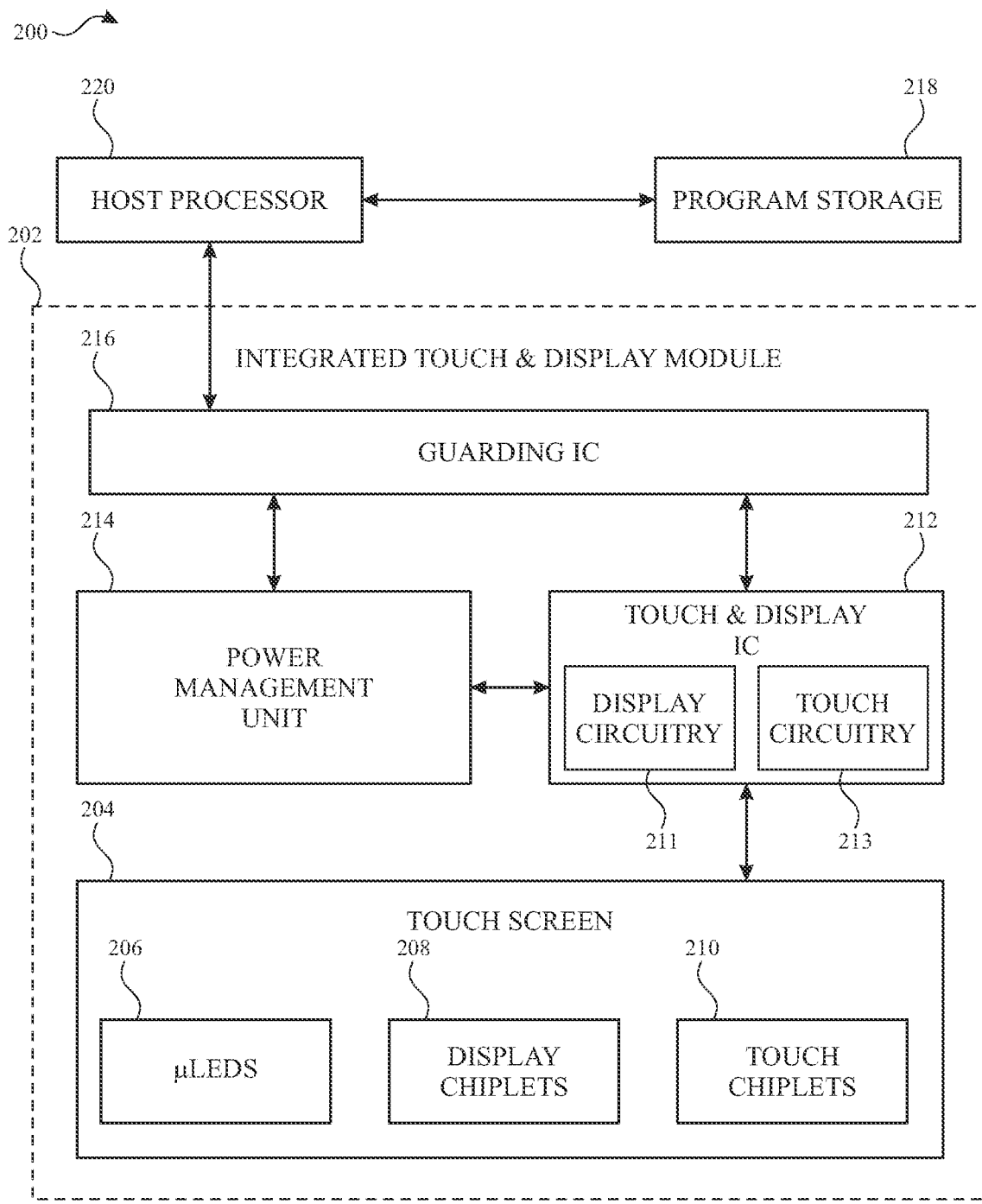
FIG. 2A is a block diagram of an example computing system 200 that illustrates one implementation of an example integrated touch screen 204 according to examples of the disclosure.

FIG. 2A is a block diagram of an example computing system 200 that illustrates one implementation of an example integrated touch screen 204 according to examples of the disclosure. As described in more detail herein, the integrated touch screen 204 can include light emitting diodes (LEDs) or organic light emitting diodes (OLEDs) represented by micro-LEDs 206, display chiplets 208 (e.g., including LED/OLED drivers) and touch chiplets 210 (e.g., including touch sensing circuitry). Computing system 200 can be included in, for example, mobile telephone 136, digital media player 140, personal computer 144, tablet computer 148, wearable device 150 or any mobile or non-mobile computing device that includes a touch screen. Computing system 200 can include integrated touch and display module 202, host processor 220 and program storage 218. Integrated touch and display module 202 can include integrated touch screen 204 and integrated circuits for operation of integrated touch screen 204. In some examples, integrated touch and display module 202 can be formed on a single substrate with micro-LEDs 206, display chiplets 208 and touch chiplets 210 of integrated touch screen 204 on one side of the touch screen and integrated circuits controlling operation of micro-LEDs 206, display chiplets 208 and touch chiplets 210 mounted on an opposite side of the single substrate. Forming integrated touch and display module 202 in this way can provide for simplified manufacturing and assembly of devices with a touch screen.

Integrated circuits for operation of integrated touch screen 204 can include an integrated touch and display integrated circuit (touch and display controller) 212, a power management unit (PMU) 214, and optionally a guard integrated circuit (guard IC) 216. As described in more detail herein, self-capacitance touch sensing performance can be improved (and parasitic capacitance effects reduced) by performing touch sensing operations in a different power domain than in the chassis power domain. In some examples, guard IC 216 can be used to operate integrated touch and display module 202 in a guard power domain during guarded touch operation and operate touch and display module 202 in the chassis power domain otherwise (e.g., during non-guarded touch operations or during display operations). Power management unit 214 can be an integrated circuit configured to provide the voltages necessary for the touch and display controller 212, including guard-referenced power supplies when operating in a guarded power domain. The touch and display controller 212 can include circuitry to perform touch sensing and display operations (e.g., according to the touch and display operations illustrated in FIGS. 7A-7B). Although illustrated in FIG. 2A as a single integrated circuit, the various components and/or functionality of the touch and display controller 212 can be implemented with multiple circuits, elements, chips, and/or discrete components (e.g., a separate touch integrated circuit and a separate display integrated circuit with an integrated circuit to handle the handoff between the two).

The touch and display controller 212 can include display circuitry 211 to perform display operations. Display circuitry 211 can include hardware to process one or more still images and/or one or more video sequences for display on integrated touch screen 204. The display circuitry 211 can be configured to generate read memory operations to read the data representing the frame/video sequence from a memory (not shown) through a memory controller (not shown), for example, or can receive the data representing the frame/video sequence from host processor 220. The display circuitry 211 can be configured to perform various processing on the image data (e.g., still images, video sequences, etc.). In some examples, the display circuitry 211 can be configured to scale still images and to dither, scale and/or perform color space conversion on the frames of a video sequence. Display circuitry 211 can be configured to blend the still image frames and the video sequence frames to produce output frames for display. The display circuitry 211 can also be more generally referred to as a display controller, display pipe, display control unit, or display pipeline. The display control unit can be generally any hardware and/or firmware configured to prepare a frame for display from one or more sources (e.g., still images and/or video sequences). More particularly, the display circuitry 211 can be configured to retrieve source frames from one or more source buffers stored in memory, composite frames from the source buffers, and display the resulting frames on integrated touch screen 204. Accordingly, the display circuitry 211 can be configured to read one or more source buffers and composite the image data to generate the output frame. Display circuitry 211 can provide various control and data signals to the display, via display chiplets 208 (described in more detail with respect to FIGS. 5A-5D), including timing signals (e.g., one or more clock signals) and pixel selection signals. The timing signals can include a pixel clock that can indicate transmission of a pixel. The data signals can include color signals (e.g., red, green, blue) for micro-LEDs 206. The display circuitry can control integrated touch screen 204 in real-time, providing the data indicating the pixels to be displayed as the touch screen is displaying the image indicated by the frame. The interface to such an integrated touch screen 204 can be, for example, a video graphics array (VGA) interface, a high definition multimedia interface (HDMI), a mobile industry processor interface (MIPI), a digital video interface (DVI), a LCD/LED/OLED interface, a plasma interface, or any other suitable interface.

The touch and display controller 212 can include touch circuitry 213 to perform touch operations. Touch circuitry 213 can include one or more touch processors, peripherals (e.g., random access memory (RAM) or other types of memory or storage, watchdog timers and the like), and a touch controller. The touch controller can include, but is not limited to, channel scan logic (e.g., implemented in programmable logic circuits or as discrete logic circuits) which can provide configuration and control for touch chiplets 210. For example, as described with reference to FIGS. 8A-8F, touch chiplets 210 can be configured to drive, sense and/or ground touch node electrodes depending on the mode of touch sensing operations. The mode of touch sensing operations can, in some examples, be determined by a scan plan stored in memory (e.g., RAM) in touch circuitry 213. The scan plan can provide a sequence of scan events to perform during a frame. The scan plan can also include information necessary for providing control signals to and programming touch chiplets 210 for the specific scan event to be performed, and for analyzing data from touch chiplets 210 according to the specific scan event to be performed. The scan events can include, but are not limited to, a mutual capacitance scan, a self-capacitance scan, a stylus scan, touch spectral analysis scan, and stylus spectral analysis scan. The channel scan logic or other circuitry in touch circuitry 213 can provide the stimulation signals at various frequencies and phases that can be selectively applied to the touch node electrodes of integrated touch screen 204 or used for demodulation, as described in more detail below. The touch circuitry 213 can also receive touch data from the touch chiplets 210, store touch data in memory (e.g., RAM), and/or process touch data (e.g., by one or more touch processors or touch controller) to determine locations of touch and/or clean operating frequencies for touch sensing operations (e.g., spectral analysis).

Integrated touch screen 204 can be used to derive touch data at multiple discrete locations of the touch screen, referred to herein as touch nodes. For example, integrated touch screen 204 can include touch sensing circuitry that can include a capacitive sensing medium having a plurality of electrically isolated touch node electrodes. Touch node electrodes can be coupled to touch chiplets 210 for touch sensing. As used herein, an electrical component "coupled to" or "connected to" another electrical component encompasses a direct or indirect connection providing electrical path for communication or operation between the coupled components. Thus, for example, touch node electrodes of integrated touch screen 204 may be directly connected to touch chiplets 210 or indirectly connected to touch chiplets 210 via display chiplets 208, but in either case provided an electrical path for driving and/or sensing the touch node electrodes. Labeling the conductive plates (or groups of conductive plates) used to detect touch as touch node electrodes corresponding to touch nodes (discrete locations of the touch screen) can be particularly useful when integrated touch screen 204 is viewed as capturing an "image" of touch (or "touch image"). The touch image can be a two-dimensional representation of values indicating an amount of touch detected at each touch node electrode corresponding to a touch node in integrated touch screen 204. The pattern of touch nodes at which a touch occurred can be thought of as a touch image (e.g., a pattern of fingers touching the touch screen). In such examples, each touch node electrode in a pixelated touch screen can be sensed for the corresponding touch node represented in the touch image.

Host processor 220 can be connected to program storage 218 to execute instructions stored in program storage 218 (e.g., a non-transitory computer-readable storage medium). Host processor 220 can, for example, provide control and data signals so that touch and display controller 212 can generate a display image on integrated touch screen 204, such as a display image of a user interface (UI). Host processor 220 can also receive outputs from touch and display controller 212 (e.g., touch inputs from the one or more touch processors) and performing actions based on the outputs. The touch input can be used by computer programs stored in program storage 218 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 220 can also perform additional functions that may not be related to touch processing and display.

Note that one or more of the functions described herein, including the configuration of touch chiplets, can be performed by firmware stored in memory (e.g., one of the peripherals in touch and display controller 212) and executed by one or more processors (in touch and display controller 212), or stored in program storage 218 and executed by host processor 220. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

It is to be understood that the computing system 200 is not limited to the components and configuration of FIG. 2A, but can include other or additional components in multiple configurations according to various examples. Additionally, the components of computing system 200 can be included within a single device, or can be distributed between multiple devices.

As described herein, in some examples integrated touch and display module 202 can perform touch sensing operations (e.g., self-capacitance scans) in a different power domain than in the chassis power domain. In some examples, integrated touch and display module 202 can perform non-guarded touch sensing operations (e.g., mutual capacitance scans) or display operations in the chassis power domain.

Figure 2B:
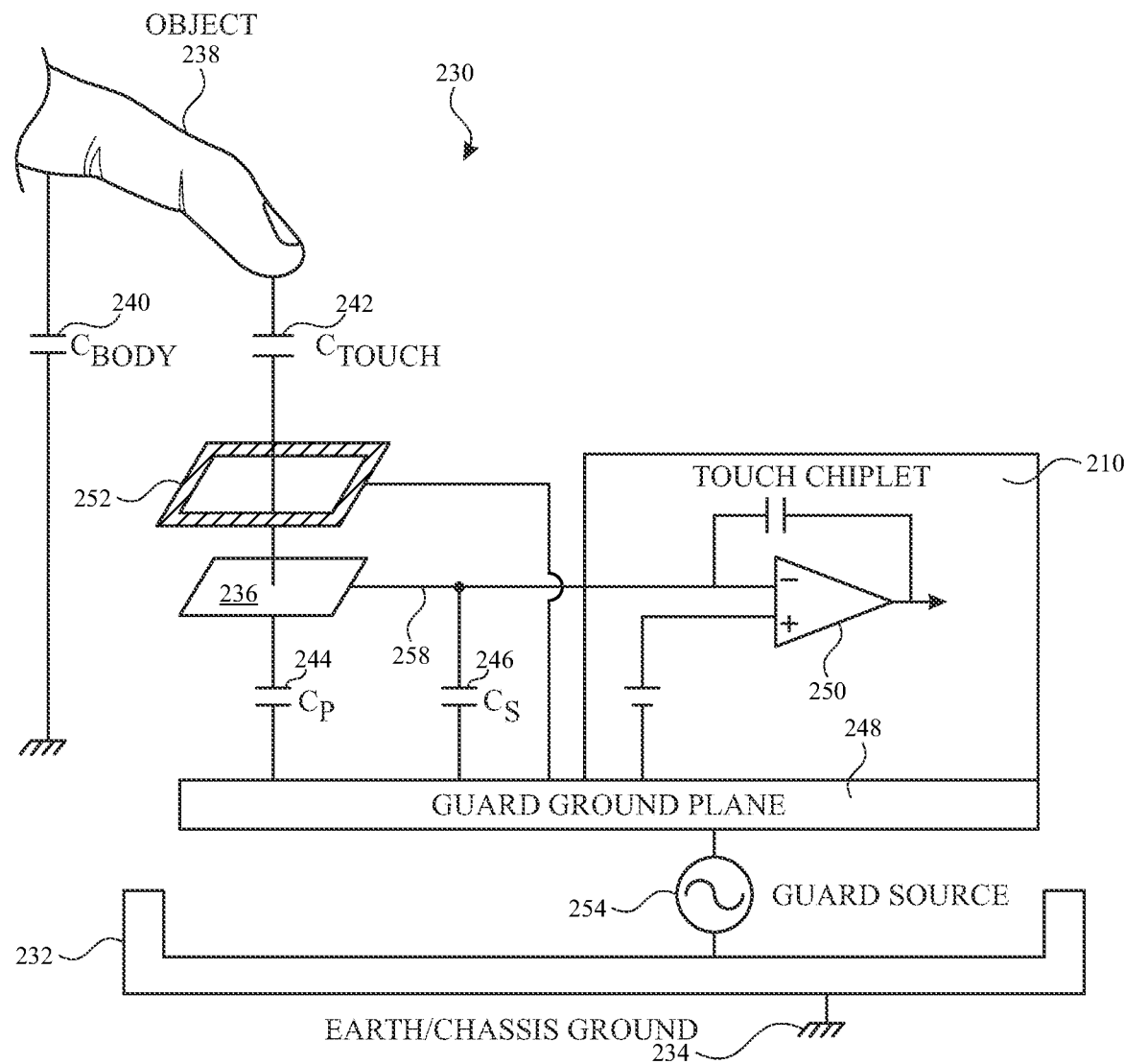
FIG. 2B illustrates an exemplary touch sensing configuration 230 including various associated capacitances according to examples of the disclosure.

FIG. 2B illustrates an exemplary touch sensing configuration 230 including various associated capacitances according to examples of the disclosure. In configuration 230 of FIG. 2B, the touch sensing circuitry of integrated touch screen 204 can be referenced to a guard ground rather than a chassis ground. Specifically, in configuration 230 of FIG. 2B, touch sensing circuitry (e.g., sense amplifier 250) in touch chiplet 210 can be coupled to a touch node electrode 236 by a routing trace 258. Touch chiplet 210 can be disposed or fabricated on a substrate including a guard ground plane 248 ("guard plane"), which can represent a virtual ground plane of touch chiplet 210 that is different from chassis ground 234 (also referred to herein as earth ground or device ground). In particular, stimulation source 254 ("guard source"), e.g., generated in guard IC 216, can be referenced to chassis ground 234, and can output a guard voltage (e.g., a guard stimulation signal, such as a square or trapezoid wave) that can establish the voltage at guard plane 248. In this manner, the guard plane 248 acting as a guard ground for touch chiplet 210 can be referenced to the guard voltage. Because touch chiplet 210 can be mounted on a substrate including guard plane 248, the sense amplifier in touch chiplet 210 can be referenced to the guard signal (and receive other guard-referenced voltages produced by PMU 214, for example), and can be isolated from chassis ground 234 by guard plane 248. In this way, touch chiplet 210 can operate in the guard power domain, whereas the guard source 254 (e.g., in guard IC 216) can operate in the chassis power domain. Guard plane 248 can be any conductive material of a substrate on which touch chiplet 210 can be disposed or fabricated (e.g., silver, copper, gold, etc.). For example, touch chiplet 210 may be assembled on a printed circuit board (PCB), and may be referenced to the PCB ground layer 248 driven, during guarded self-capacitance scans, by guard source 254. Guard source 254 can be implemented, for example, using a waveform generator (e.g., generating arbitrary waveforms, such as a square wave referenced to chassis ground 234) whose output can be inputted in to a digital-to-analog converter (DAC). Analog output from the DAC can be provided to a linear buffer (e.g., with unity or some other gain) whose output can correspond to the output of guard source 254.

Additionally, guard plane 248 can be disposed between touch node electrode 236 and chassis 232 (or, more generally, chassis ground 234), and guard plane 248 can be disposed between a routing trace that couples touch node electrode 236 to touch chiplet 210 and chassis 232 (or, more generally, chassis ground 234). Thus, guard plane 248 can similarly isolate touch node electrode 236 and routing trace 258 that couples touch node electrode 236 to touch chiplet 210 from chassis ground 234. Guard plane 248 can reduce or eliminate parasitic or stray capacitances that may exist between touch node electrode 236 and chassis ground 234, as will be described below. Optionally, a guard plane can be included in a layer above the touch node electrodes and/or between touch node electrodes (e.g., as illustrated by guard plane 252) and can be referenced to the same guard voltage. Guard plane 252 can include openings corresponding to touch node electrodes to enable detection of touch activity on the touch sensor panel (or proximity activity) while guarding the touch node electrodes and routing from stray capacitances that can form due to a touch or other stray capacitances. In some examples, the material(s) out of which guard planes 248 and 252 are made can be different. For example, guard plane 252 above the touch node electrodes can be made of ITO, or another fully or partially transparent conductor), and guard planes 248 in the substrate (e.g., PCB) can be made of a different conductor, such as copper, aluminum, or other conductor that may or may not be transparent.

Various capacitances associated with touch and/or proximity detection using configuration 230 are also shown in FIG. 2B. Specifically, an object 238 (e.g., a finger) can be in touching or in proximity to touch node electrode 236. Object 238 can be grounded to earth ground 234 through capacitance 240 (e.g., $C_{body}$), which can represent a capacitance from object 238 through a user's body to earth ground 234. Capacitance 242 (e.g., $C_{touch}$) can represent a capacitance between object 238 and touch node electrode 236, and can be the capacitance of interest in determining how close object 238 is to touch node electrode 236. Typically, $C_{body}$ 240 can be significantly larger than $C_{touch}$ 242 such that the equivalent series capacitance seen at touch node electrode 236 through object 238 can be approximately $C_{touch}$ 242.

Capacitance 242 can be measured by touch sensing circuitry (e.g., sense amplifier 250) included in touch chiplet 210 to determine an amount of touch at touch node electrode 236 based on the sensed touch signal (e.g., as described with reference to FIG. 8B). As shown in FIG. 2B, touch sensing circuitry in touch chiplet 210 can be referenced to guard ground (with some DC biasing provided by the touch chiplet 210 and/or PMU 214). In some examples, capacitance 244 (e.g., $C_p$) can be a parasitic capacitance between touch node electrode 236 and guard plane 248. Capacitance 246 (e.g., $C_s$) can be a stray capacitance between routing trace 258 coupled to touch node electrode 236 and guard plane 248, for example. In some examples, the impact of capacitances 244 and 246 on a sensed touch signal can be mitigated because guard plane 248 and touch sensing circuitry in chiplet 210 are all referenced to the virtual ground signal produced by guard source 254 during a guarded self-capacitance scan.

When guarded, the voltage at touch node electrode 236 and trace 258 can mirror or follow the voltage at guard plane 248, and thereby capacitances 244 and 246 can be reduced or eliminated from the touch measurements performed by touch chiplet 210. Without stray capacitances 244 and 246 affecting the touch measurements, the offset in the output signal of sense amplifier 250 (e.g., when no touch is detected at touch node electrode 236) can be greatly reduced or eliminated, which can increase the signal to noise ratio and/or the dynamic range of sense circuitry in touch chiplet 210. This, in turn, can improve the ability of touch sensing circuitry in touch chiplet 210 to detect a greater range of touch at touch node electrode 236, and to accurately detect smaller capacitances $C_{touch}$ 242 (and, thus, to accurately detect proximity activity at touch node electrode 236 at larger distances). Additionally, with a near-zero offset output signal from touch sensing circuitry in touch chiplet 210, the effects of drift due to environmental changes (e.g., temperature changes) can be greatly reduced. For example, if the signal out of sense amplifier 250 consumes 50% of its dynamic range due to undesirable/un-guarded stray capacitances in the system, and the analog front end (AFE) gain changes by 10% due to temperature, the sense amplifier 250 output may drift by 5% and the effective signal-to-noise ratio (SNR) can be limited to 26 dB. By reducing the undesirable/un-guarded stray capacitances by 20 dB, the effective SNR can be improved from 26 dB to 46 dB.

Figure 2C:
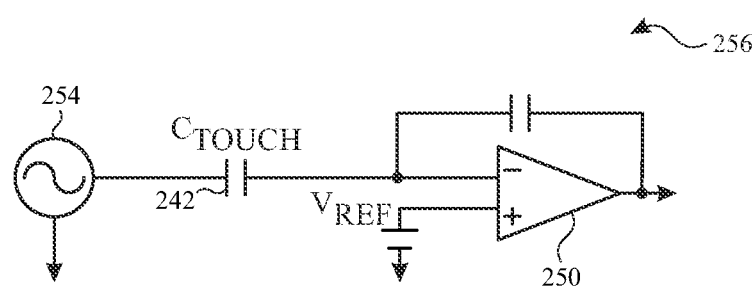
FIG. 2C illustrates an exemplary equivalent circuit diagram of an exemplary touch sensing configuration 256 according to examples of the disclosure.

FIG. 2C illustrates an exemplary equivalent circuit diagram of an exemplary touch sensing configuration 256 according to examples of the disclosure. As described herein, guarding can reduce or eliminate capacitances 244 and 246 from the touch measurements performed by touch sensing circuitry in touch chiplet 210. As a result, the sense amplifier 250 can simply detect $C_{touch}$ 242, which can appear as a virtual mutual capacitance between object 238 and touch node electrode 236. Specifically, object 238 can appear to be stimulated (e.g., via $C_{body}$ 240) by guard source 254, and object 238 can have $C_{touch}$ 242 between it and the inverting input of sense amplifier 250. Changes in $C_{touch}$ 242 can, therefore, be sensed by sense amplifier 250 as changes in the virtual mutual capacitance $C_{touch}$ 242 between object 238 and sense amplifier 250. As such, the offset in the output signal of sense amplifier 250 (e.g., when no touch is detected at touch node electrode 236) can be greatly reduced or eliminated, as described above. As a result, sense amplifier 250 (e.g., the input stage of touch chiplet 210) need not support as great a dynamic input range that self-capacitance sense circuitry might otherwise need to support in circumstances/configurations that do not exhibit the virtual mutual capacitance effect described here.

Because the self-capacitance measurements of touch node electrodes in self-capacitance based touch screen configurations can exhibit the virtual mutual capacitance characteristics described above, touch chiplet 210 can be designed with a simpler architecture to support both self-capacitance measurements and mutual capacitance measurements. Various exemplary configurations of the touch chiplet are described herein with respect to FIGS. 8A-8F).

Figure 3A:
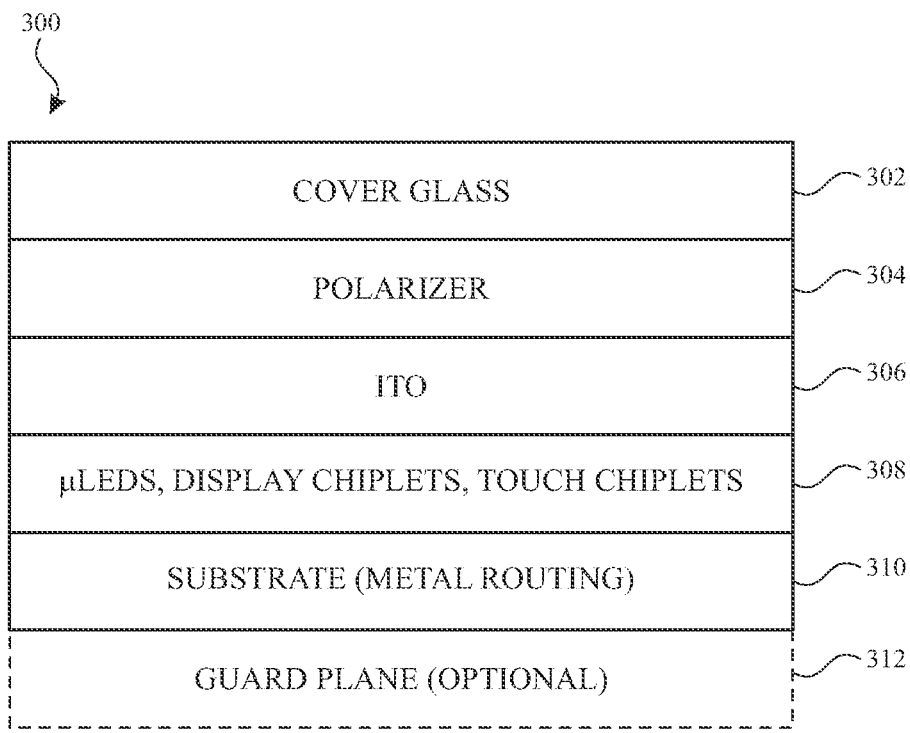
FIGS. 3A-3B illustrate exemplary stack-ups of an integrated touch screen according to examples of the disclosure.
Figure 3B:
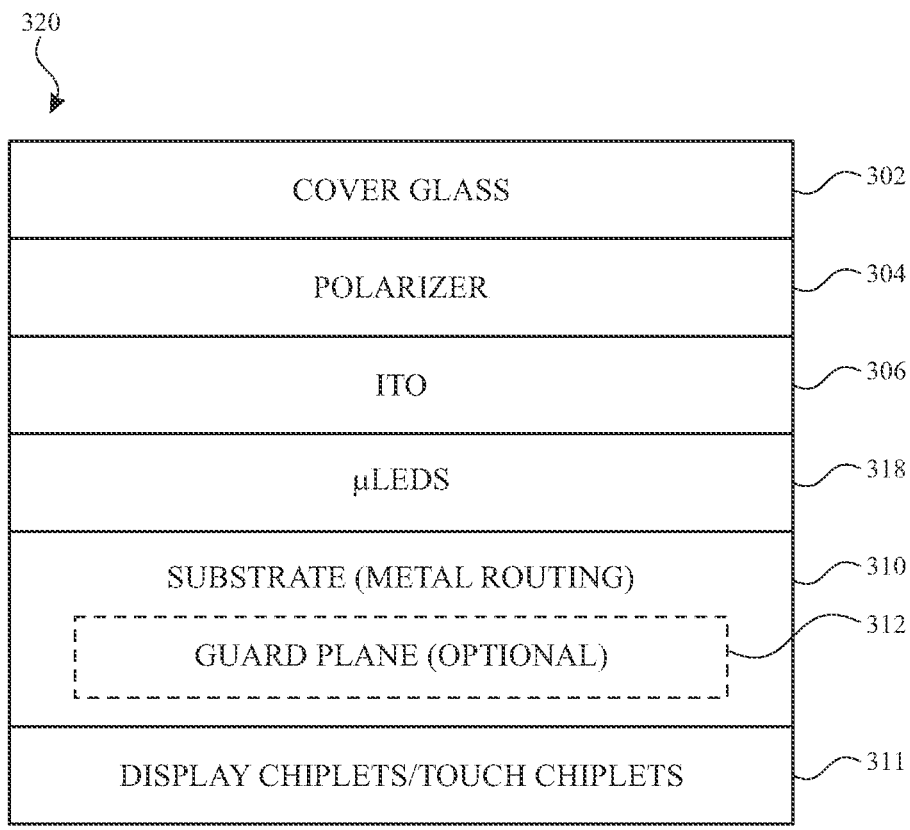

Referring back to FIG. 2A, integrated touch screen 204 can be integrated such that touch sensing circuit elements of the touch sensing system can be integrated with the display stack-up and some circuit elements can be shared between touch and display operations. It is noted that circuit elements are not limited to whole circuit components, such as a whole capacitor, a whole transistor, etc., but can include portions of circuitry, such as a conductive plate. FIGS. 3A-3B illustrate exemplary stack-ups of an integrated touch screen according to examples of the disclosure. FIG. 3A illustrates an exemplary stack-up of a touch screen including touch chiplets and display chiplets in the visible area of the display. Integrated touch screen 300 comprises a substrate 310 (e.g., a printed circuit board) upon which touch chiplets 210, display chiplets 208 and micro-LEDs 206 can be mounted in touch and display circuit layer 308. In some examples, the touch chiplets 210, display chiplets 208 and/or micro-LEDs 206 can be partially or fully embedded in the substrate (e.g., the components can be placed in depressions in the substrate). In some examples, the display chiplets 208 and/or touch chiplets 210, can be mounted on one and/or both sides of substrate 310. For example, some or all of the touch chiplets and/or some or all of the display chiplets can be mounted on a second side of substrate 310. In some examples, the touch chiplets and/or display chiplets can be disposed on the second side of the substrate. FIG. 3B illustrates an exemplary stack-up of a touch screen including touch chiplets and display chiplets outside the visible area of the display. Unlike the stack-up of integrated touch screen 300, in which touch chiplets 210, display chiplets 208 and micro-LEDs 206 can be mounted in touch and display circuit layer 308, stack-up of integrated touch screen 320 can include touch chiplets and display chiplets mounted in a touch and display chiplet layer 311 on a second (bottom) side of substrate 310 than the micro-LEDs 206 mounted on in a display pixel layer 318 on a first (top, visible) side of substrate 310. In some examples, placing the touch chiplets and display chiplets on the second side of the substrate can allow for uniform spacing of the micro-LEDs and/or increased density of micro-LEDs.

The substrate 310 can include routing traces in one or more layers to route signals between micro-LEDs 206, display chiplets 208, touch chiplets 210 and touch and display controller 212. Substrate 310 can also optionally include a guard plane 312 for guarded operation (e.g., corresponding to guard plane 248 in FIG. 2B). Although illustrated on the bottom of substrate 310 in FIG. 3A, guard plane 312 can be formed as a layer of substrate 310 other than the bottom layer (e.g., as illustrated in FIG. 3B in an internal layer of substrate 310).

After mounting micro-LEDs 206, display chiplets 208 and touch chiplets 210 in the touch and display circuit layer 308 in FIG. 3A (e.g., during a pick-and-place assembly), a planarization layer (e.g., transparent epoxy) can be deposited over the micro-LEDs 206, display chiplets 208 and touch chiplets 210. The planarization layer can be deposited over the micro-LEDs 206 in the display pixel layer 318 in the stack-up of FIG. 3B. A fully or partially transparent conductor layer 306 (e.g., ITO) can be deposited above planarized touch and display circuit layer 308 in FIG. 3A or above the display pixel layer 318 in FIG. 3B. Conductor layer 306 can include a pattern of individual conductor plates that can be used for touch and display functions of integrated touch screen 300. For example, individual conductor plates can be used as cathode terminals for micro-LEDs during display operations and groups of conductor plates can form touch node electrodes for touch operations. Polarizer 304 can be disposed above the transparent conductor layer 306 (optionally with another planarization layer disposed over the transparent conductor layer 306). Cover glass (or front crystal) 302 can be disposed over polarizer 304 and form the outer surface of integrated touch screen 300. The stack-up of integrated touch screens 300 and/or 320 can provide numerous benefits including reduced costs (e.g., due to simplified assembly of devices including integrated touch and display module 202 and a reduced number of integrated circuits by combining touch and display functionality into integrated touch and display controller 212), reduced stack-up height (sharing conductors eliminates a separate touch node electrode layer; integrating touch chiplets 210 into the stack-up on the same layer with the micro-LEDs 206 and display chiplets 208 does not add to the stack-up height for FIG. 3A), simplified support for guarded self-capacitance scans (by including touch circuitry 213 on integrated touch and display module 202 with a guard plane extending throughout the substrate of integrated touch and display module 202), and shrinking the border region around the touch screen (because routing can be done through the substrate rather than in the border regions).

Figure 4:
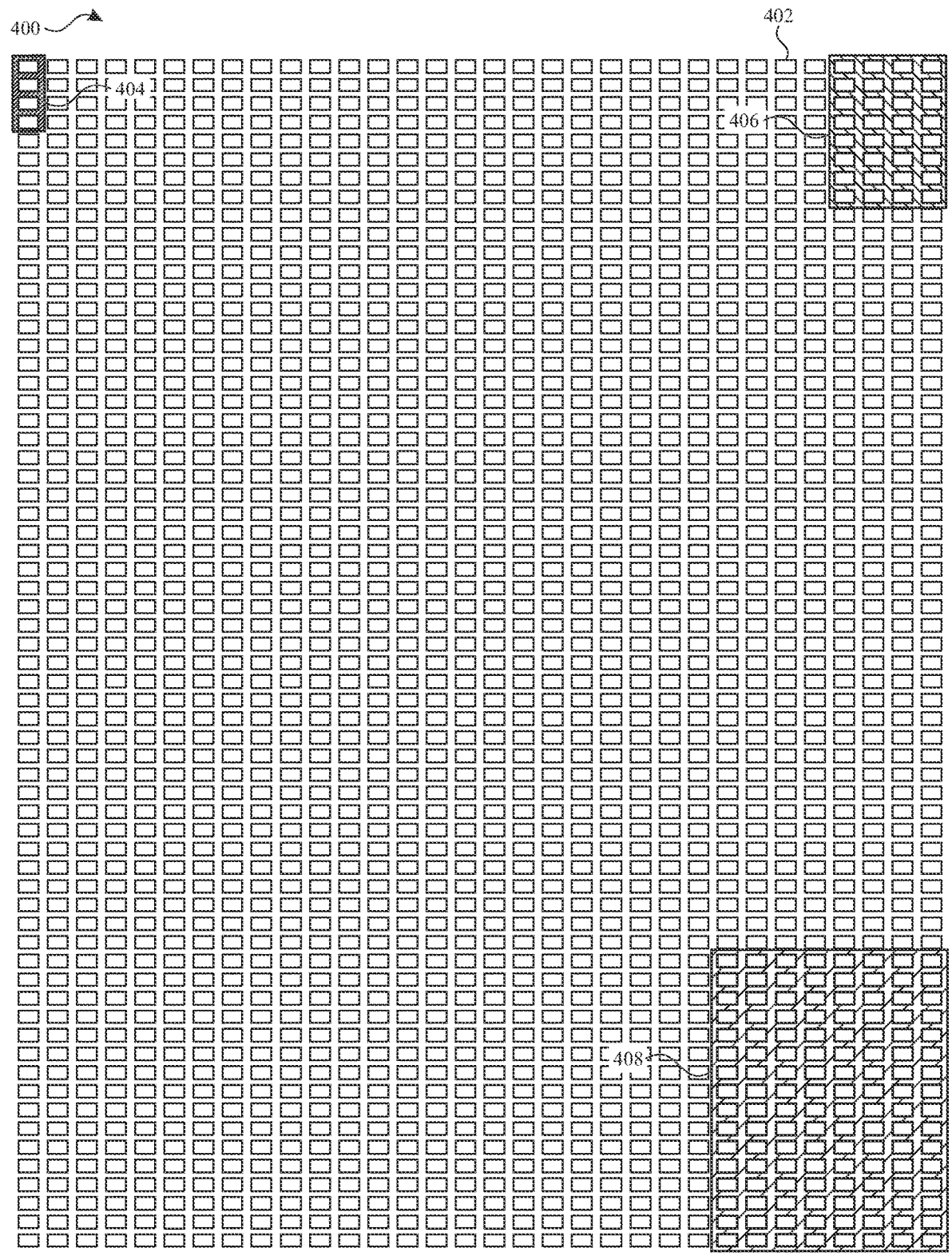
FIG. 4 illustrates an exemplary pattern of ITO patches according to examples of the disclosure.

Conductor layer 306 can include a pattern of individual conductor plates (e.g. ITO patches). FIG. 4 illustrates an exemplary pattern of ITO patches according to examples of the disclosure. ITO layer 400 (e.g., corresponding to conductor layer 306) can include 2048 rectangular ITO patches 402 arranged in a 64 row by 32 column array. Although the pattern illustrated in FIG. 4 is of a rectangular array of rectangular patches, it should be understood that other shapes of ITO patches 402 and other patterns can be used. Additionally, it should be understood that the number of ITO patches 402 and size of the array can be different than illustrated in FIG. 4. Each of the ITO patches 402 can be formed over a bank of micro-LEDs (and may therefore be referred to as ITO banks herein) and can serve as the cathode terminal for the bank of micro-LEDs during display operations. As described below in more detail, a group of ITO banks (such as ITO group 404 of four ITO patches 402) can be coupled to one or more (redundant) display chiplets. Groups of ITO patches 402 can be coupled together to form touch node electrodes for touch sensing operations. Each of the touch node electrodes can be coupled during touch operations to a touch chiplet. In some examples, touch node electrode 406 can be formed of by grouping together 32 ITO patches 402 (8 rows; 4 columns) or by grouping together 8 ITO groups 404 (2 rows; 4 columns). In such a configuration, the area of ITO layer 400 can be represented by 64 touch node electrodes 406 (forming a touch image with 64 touch nodes). In some examples, touch node electrode 408 can be formed of by grouping 128 ITO patches 402 (16 rows; 8 columns), by grouping together 32 ITO groups 404 (4 rows; 8 columns), or grouping together 4 touch node electrodes 406 (2 rows; 2 columns). In such a configuration, the area of ITO layer 400 can be represented by 16 touch node electrodes (forming a touch image with 16 touch nodes).

The number of ITO patches in a touch node electrode can be selected according to the desired sensing resolution. For example, as described above, touch node electrodes 406 are smaller than touch node electrodes 408 and therefore provide a higher resolution level for the touch image (64 touch nodes versus 16 touch nodes). The number of ITO patches in a touch node may be limited by space available for touch chiplets, which can be a function of the density of LEDs/display pixels and the number of display chiplets. In some examples, the touch data of a first resolution of touch nodes can be combined digitally to form a reduced resolution touch image. For example, a touch image with data corresponding to 64 touch nodes can be combined digitally (e.g., by touch and display controller 212) to form a lower resolution touch image including 16 touch nodes. The combination can be performed by averaging or other image filtering techniques. One advantage of combining touch data to form a lower resolution touch image can be to leverage touch detection algorithms designed for the lower resolution touch image when a higher resolution touch image may not be required. In some examples, touch detection algorithms can be modified to handle different resolution touch images.

Figure 5A:
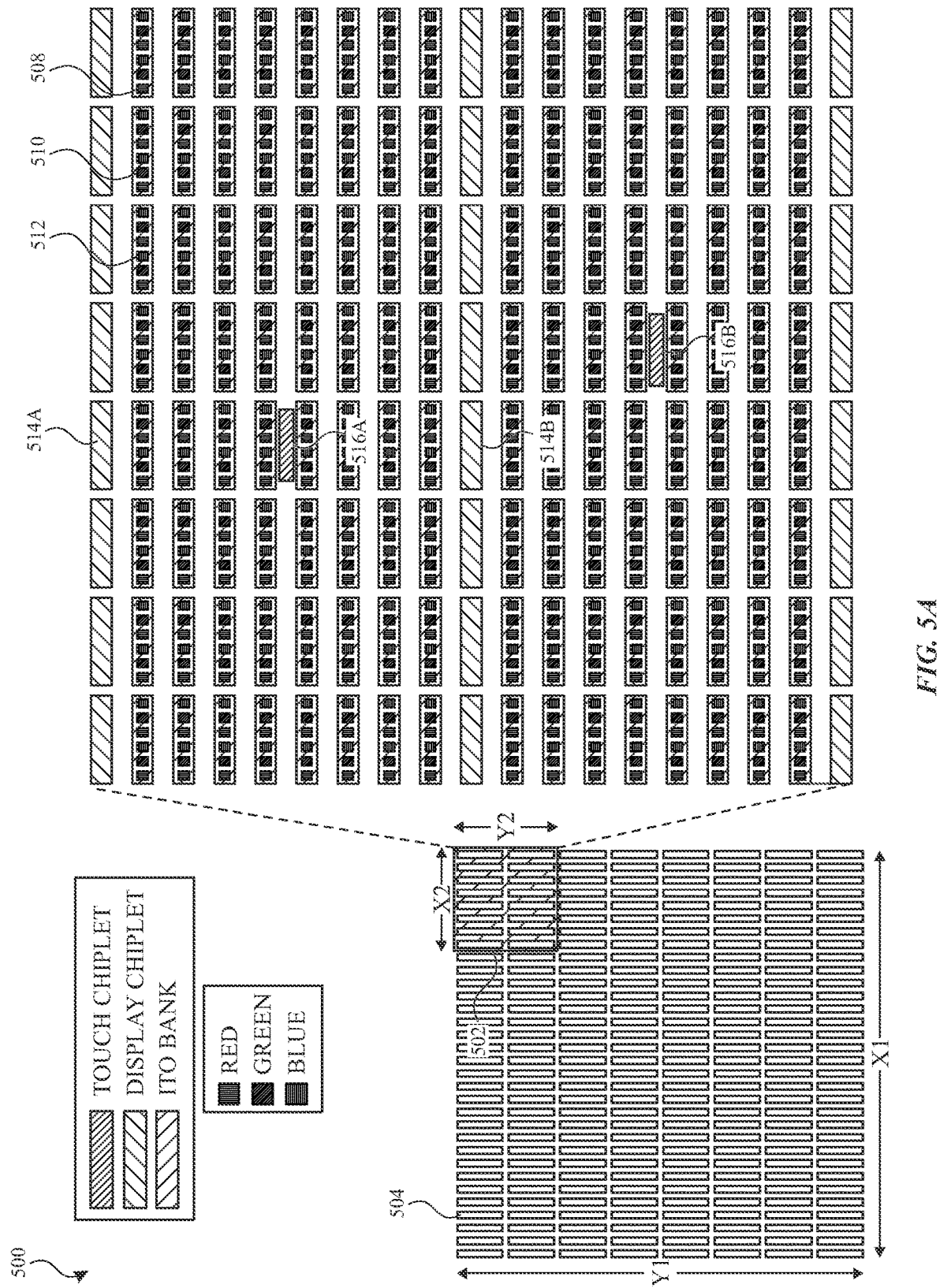
FIG. 5A illustrates a portion of an exemplary conductive layer and corresponding circuitry of a portion of an exemplary touch and display circuit layer according to examples of the disclosure.

FIG. 5A illustrates a portion of an exemplary conductive layer and corresponding circuitry of a portion of an exemplary touch and display circuit layer according to examples of the disclosure. Integrated touch screen 500 can include a conductive layer (e.g., corresponding to conductive layer 306), a portion of which is shown in FIG. 5A. The portion of the conductive layer can define a region having an area X1 by Y1 (e.g., 5 mm×5 mm) including 16 touch node electrodes 502. Each touch node electrode 502 can be formed from 16 ITO groups 504 (2 rows; 8 columns) and can define an area X2 by Y2 smaller than X1 by Y1 (e.g., 1.25 mm×1.25 mm).

Figure 5B:
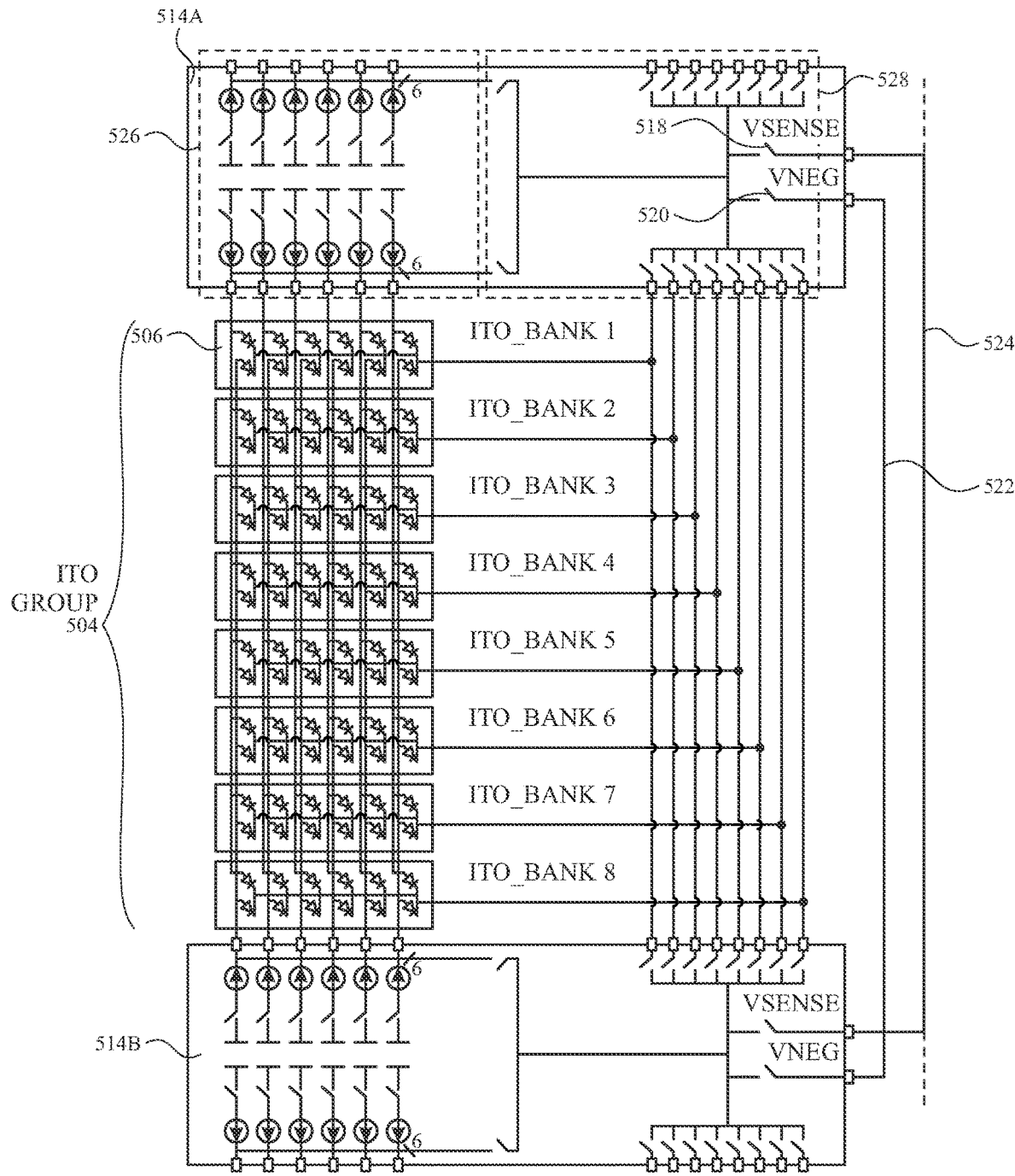
FIG. 5B illustrates an exemplary ITO group and corresponding display chiplets according to examples of the disclosure.

FIG. 5A also illustrates an expanded view of touch node electrode 502 showing the component ITO banks 506 of the ITO groups 504 and touch and display circuitry (e.g., corresponding to components of touch and display circuit layer 308). The touch and display circuitry can include micro-LEDs 508, 510, 512, display chiplets 514A, 514B and touch chiplets 516A, 516B. Touch node electrode 502 of FIG. 5A includes 128 ITO banks 506 (i.e., 8 ITO banks 506 per ITO group 504). Each ITO bank can be coupled to two display chiplets 514A and 514B. One of the display chiplets 514A or 514B can update the micro-LEDs in the corresponding ITO group, and the second of the display chiplets 514A or 514B can be a spare or redundant display chiplet. The display chiplets can be programmed or operated such that only one of the two display chiplets for a corresponding ITO group 504 is operating on the corresponding ITO group. As illustrated in FIG. 5A, each ITO bank can serve as a cathode for two display pixels (e.g., each including red, green and blue sub-pixels). In some examples, each ITO bank can serve as the cathode for more or fewer display pixels. In some examples (e.g., as illustrated in FIG. 5B), each ITO bank can include duplicate display pixels. Anodes of one set of pixels can be coupled to display chiplet 514A and anodes of the second set of pixels can be coupled to display chiplet 514B. The cathodes of both sets of pixels can be coupled to the same ITO bank.

Although illustrated in FIG. 5A as coupling two display chiplets 514A, 514B to each ITO group 504, it should be understood that additional display chiplets can be included to provide additional redundancy. During touch operation, ITO banks 506 can be coupled together to form touch node electrode 502, and touch node electrode 502 can be coupled to two touch chiplets 516A and 516B. One of the touch chiplets 516A or 516B can be configured for touch sensing operations, and the second of the display chiplets 5164A or 516B can be a spare or redundant chiplet. The touch chiplets can be programmed or operated such that only one of the two touch chiplets coupled to touch node electrode 502 is operating on touch node electrode 502. Although illustrated in FIG. 5A as using two touch chiplets for touch node electrode 502, it should be understood that additional touch chiplets can be included to provide additional redundancy. Additionally, although illustrated in FIG. 5A as using a main and redundant touch chiplet for each touch node electrode and a main and redundant display chiplet for each ITO group, it should be understood that in some examples, redundant touch chiplets or redundant display chiplets can be omitted.

FIG. 5B illustrates an exemplary ITO group and corresponding display chiplets according to examples of the disclosure. Display chiplet 514A can include display micro-drivers 526 and can include ITO switches 528. Display chiplet 514B can include similar circuitry and its description is omitted here for brevity. Display micro-drivers 526 and ITO switches 528 can include duplicate circuitry (micro-drivers, ITO switches), in some examples, to enable operation on LEDs corresponding to ITO banks on either side of the display chiplet. In some examples, the display chiplet can be configured to reuse the circuitry without duplication and update internal connections to operate on LEDs corresponding to ITO banks on the operating side of the display chiplet.

Display chiplet 514A can be coupled to one or more red, green, and blue LED/OLED devices 508, 510, 512 that emit different colors of light. In a red-green-blue (RGB) subpixel arrangement, each pixel includes three sub-pixels that emit red, green and blue light, respectively. The RGB arrangement is exemplary and other examples may include alternative sub-pixel arrangements (e.g., red-green-blue-yellow (RGBY), red-green-blue-yellow-cyan (RGBYC), or red-green-blue-white (RGBW), or other sub-pixel matrix schemes where the pixels may have a different number of sub-pixels). As illustrated in FIGS. 5A and 5B, display chiplet 514A can be coupled to an 8 row and 2 column array of pixels. Each row of the array can correspond to an ITO bank 506. The ITO bank 506 can serve as a cathode node when selected by switching circuitry of ITO switches 528, for example. The cathode node can be connected to a voltage, Vneg, via switch 520 during display operations (while switch 518 can remain open during display operation). Display micro-drivers 526 can include six current drivers, one for each sub-pixel element in the two columns of pixels. The anode of each sub-pixel of a column can be coupled to a respective current driver in display micro-drivers 526. For example, the anode of each blue sub-pixel in the first column of pixels can be coupled together and to one of the current drivers and the anode of each blue sub-pixel in the second column of pixels can be coupled together and to a different one of the current drivers. Likewise, the anode of each green sub-pixel or red sub-pixel in the first and second columns of pixels can be respectively coupled together and to respective current sources. Thus, during display operations, selecting one of the ITO banks 506 using switches of ITO switches 528 and adjusting and providing the operating current of respective current drivers in display micro-drivers can address the illumination adjustment for each pixel controlled by display chiplet 514A. In some examples, refresh and/or timing signals can be provided by the touch and display controller to address each LED device individually, to enable asynchronous or adaptively synchronous display updates. In some examples display brightness can be adjusted by manipulation of reference voltages (not shown) supplied to the display micro-drivers.

As described above, during display operations switches of ITO switches 528 can select a respective bank to couple to the cathode node, which is in turn coupled to Vneg by switch 520 (while switch 518 remains open). During touch operations by an integrated touch screen, ITO switches 528 of display chiplet 514A can instead couple together each of the ITO banks 506 in ITO group 504, and couple ITO group 504 to a touch chiplet via switch 518 (while switch 520 remains open). Additionally, multiple ITO groups corresponding to multiple display chiplets can be coupled together to form touch node electrodes, and be coupled to one or more touch chiplets.

Figure 5C:
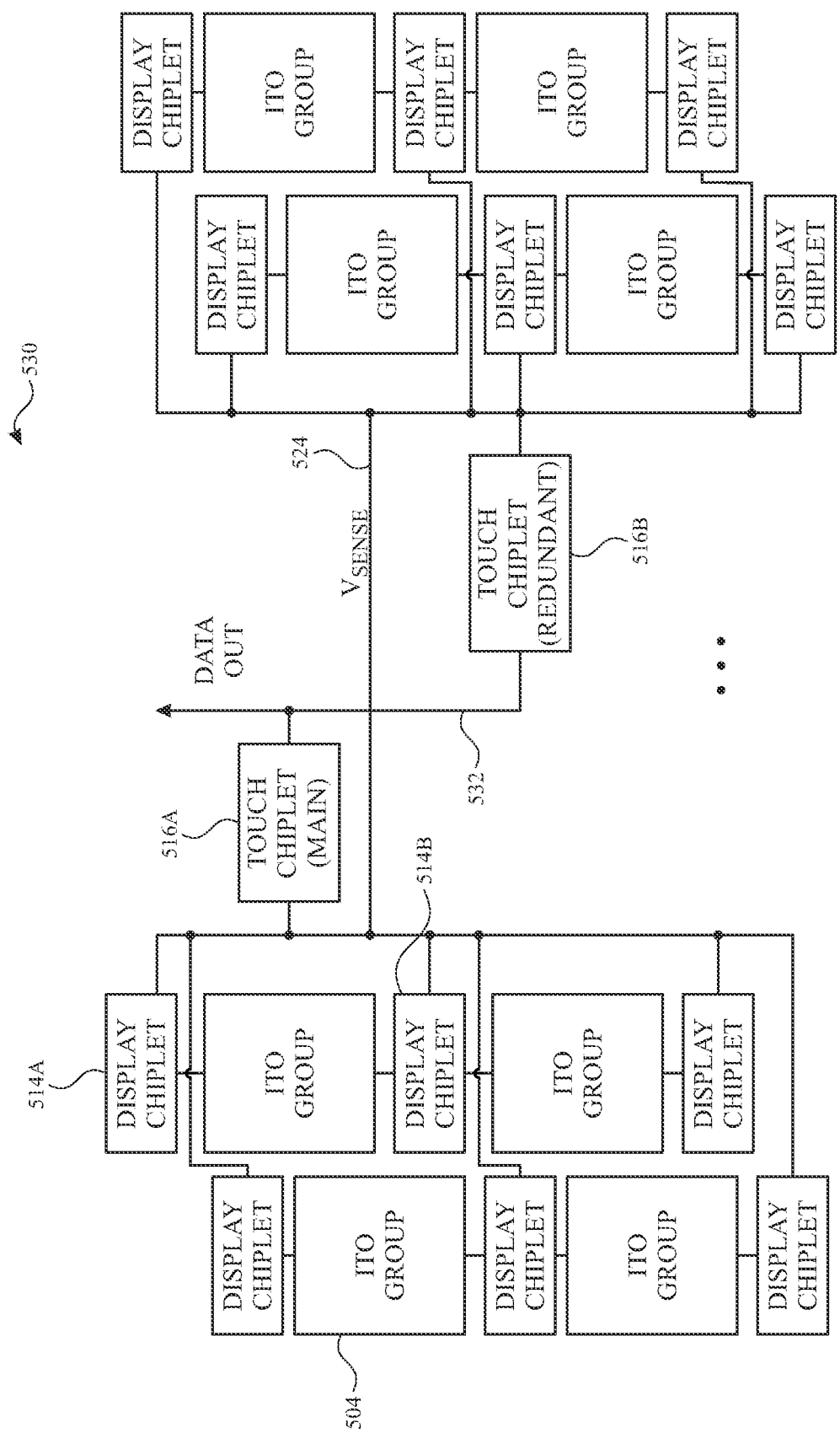
FIG. 5C illustrates coupling together of ITO groups corresponding to multiple display chiplets into a touch node electrode (e.g., corresponding to touch node electrode 502), and coupling the touch node electrode to one or more touch chiplets according to examples of the disclosure

FIG. 5C illustrates coupling together of ITO groups corresponding to multiple display chiplets into a touch node electrode (e.g., corresponding to touch node electrode 502), and coupling the touch node electrode to one or more touch chiplets according to examples of the disclosure. FIG. 5C illustrates configuration 530 including multiple ITO groups 504 and corresponding display chiplets (e.g., display chiplets 514A and 514B). Each of the display chiplets in FIG. 5C can include ITO switches 528 as shown in FIG. 5B to couple the ITO banks in each of the ITO groups together. Additionally, the Vsense pins of each of the display chiplets of FIG. 5C can be tied together by Vsense line 524. As a result, when switch 518 is closed in each of the display chiplets, the ITO groups illustrated in FIG. 5C can form a touch node electrode with an area corresponding to the collective area of each of the ITO banks. Touch chiplet 516A can be coupled to Vsense line 524 to enable touch sensing operations of the touch node electrode. Additionally, in some examples, one (or more) redundant touch chiplets 516B can also be coupled to Vsense line 524 to enable touch sensing operations of the touch node electrode should touch chiplet 516A fail to operate properly. In examples including one or more redundant touch chiplets, the touch chiplets can be configured so that only one of the touch chiplets coupled to a respective touch node electrode operates for any given touch operation, as described in more detail herein. Additionally, as described in more detail herein, the main and redundant touch chiplets corresponding to a touch node electrode can share a touch data output line 532 (data out).

Figure 5D:
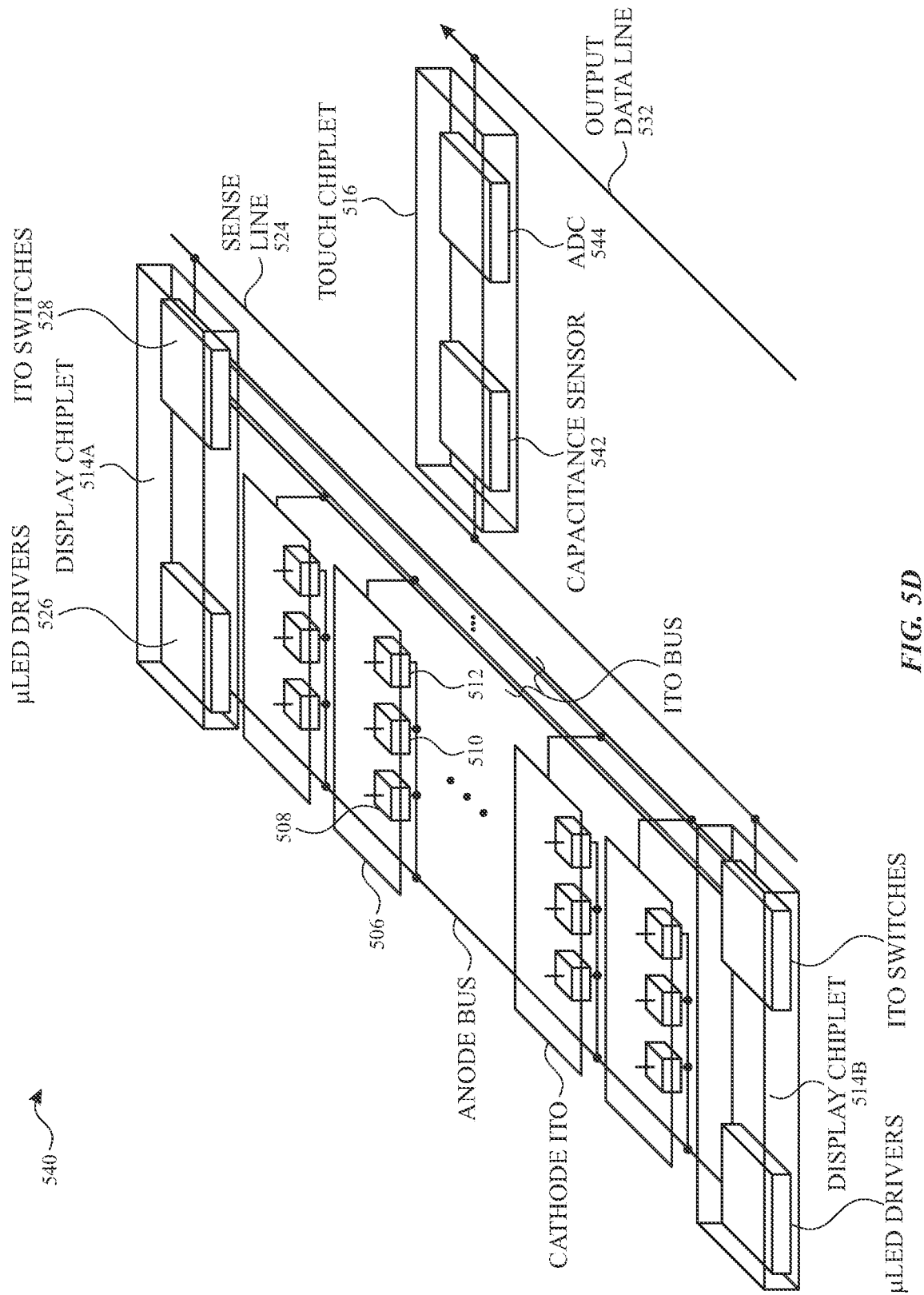
FIG. 5D illustrates an exemplary mechanical view of an exemplary group of ITO banks, corresponding display chiplets and a corresponding touch chiplet according to examples of the disclosure.

FIG. 5D illustrates an exemplary mechanical view of an exemplary group of ITO banks, corresponding display chiplets and a corresponding touch chiplet according to examples of the disclosure. Display chiplets 514A and 514B, micro-LEDs 508, 510 and 512, and touch chiplet 516 can be mounted on a substrate (e.g., in touch and display circuit layer 308 on substrate 310). ITO banks 506 can be deposited on a layer above the touch and display circuitry (e.g., in conductor layer 306). ITO banks 506 can be coupled to the cathode node of corresponding pixels (e.g., including red, green and blue micro-LEDs 508, 510 and 512). The micro-drivers 526 in display chiplets 514A and/or 514B can be coupled to the anode node of the pixels (e.g., one current micro-driver per column of sub-pixel elements). The display chiplets 514A and 514B can each include ITO switches 528. ITO switches 528 can be coupled to the ITO banks via an ITO bus. ITO switches 528 can selectively couple ITO banks to a voltage (Vneg) during display operation (e.g., in a serial sequence to update each row of pixels during a display refresh). ITO switches 528 can also selectively couple ITO banks 506 in an ITO group together and to touch chiplet 516 (via a sense line) during touch operations. The touch chiplet 516 can include sensing circuitry (a sense channel) for a touch node electrode. For example, as illustrated in FIG. 5D, touch chiplet 516 can include a capacitance sensor 542 and an analog-to-digital converter (ADC) 544 to perform analog touch sensing and send digital touch data via touch data output line 532 (e.g., to touch and display controller 212). All of the routing illustrated in FIG. 5D can be implemented by metallic routing in the substrate upon which the touch and display circuitry can be mounted, except for the short connections between ITO banks 506 and micro-LEDs 508, 510, 512 and between ITO banks 506 and the ITO bus.

As described above, the touch chiplets may include analog circuitry (e.g., capacitance sensor 542 and ADC 544) to perform analog touch sensing locally (e.g., by circuitry within the integrated touch screen stack-up) and send digital touch data to the touch and display controller for processing. Performing analog sensing locally can reduce touch non-idealities by shortening the distance of routing compared with performing analog sensing using a touch sensing chip routed outside the touch screen) and by simplifying the process of matching of analog signal routing (which can also reduce baseline drift across the touch screen). Shorter distance can reduce cross-talk between analog lines and can reduce the need to compensate measurements across various touch sensors in the touch screen to account for routing mismatch and delays. For example, the short routing can result in an effective RC constant of approximately 100 ps (far lower than the effective time constant in touch screens that have to route analog drive and sense signals through long ITO traces across the touch screen). The digital signals routed in metal (rather than transparent conductors such as ITO) are far less susceptible to noise and delay issues (by one or more orders of magnitude).

Figure 6A:
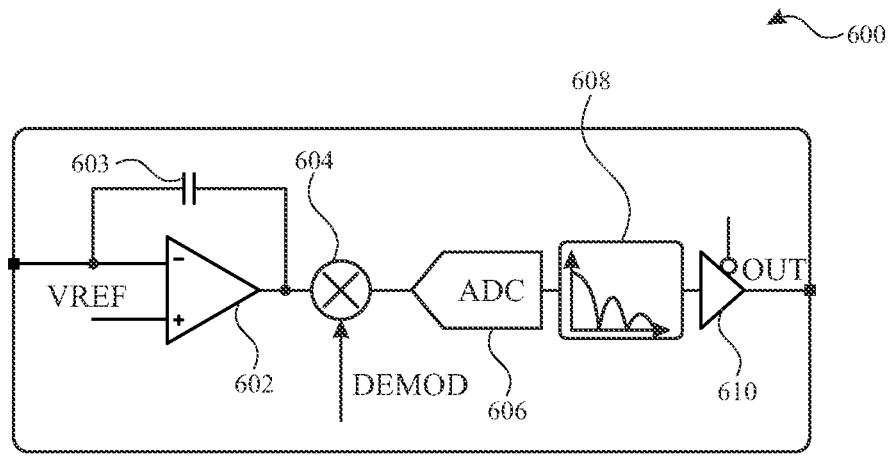
FIG. 6A illustrates exemplary circuitry for an exemplary touch chiplet according to examples of the disclosure.

FIG. 6A illustrates exemplary circuitry for an exemplary touch chiplet according to examples of the disclosure. A touch node electrode (e.g., touch node electrode 236, 502) can have an inherent self-capacitance to ground associated with it, and also an additional self-capacitance to ground that is formed when an object, such as finger 238, is in proximity to or touching the electrode. Referring back to FIG. 2B, the total self-capacitance to ground of touch node electrode 236 can be illustrated as capacitance 242. Touch chiplet 600 can include a capacitance sensing circuit (capacitive circuit) including an operational amplifier 602 (sense amplifier) and a feedback network including a feedback capacitor 603 (e.g., corresponding to the touch circuitry illustrated in touch chiplet 210). It should be understood that other capacitance sensing circuit configurations may be employed, such as those including a feedback resistor or switched capacitor resistor as well as a feedback capacitor. A touch node electrode to be sensed can be coupled to the inverting input (−) of operational amplifier 602. For self-capacitance sensing, an AC voltage source and DC biasing (not shown) can be coupled to the non-inverting input (+) of operational amplifier 602 (at Vref). The capacitance sensing circuit can be configured to sense changes in the total self-capacitance of the touch node electrode induced by a finger or object either touching or in proximity to the touch sensitive surface opposite the touch node electrode to be sensed. Output of operation amplifier 602 can be demodulated by mixer 604, which can receive a demodulation signal matching the AC voltage source applied to the non-inverting input of operational amplifier 602. The demodulated output can be converted to a digital signal by ADC 606. The digital signal output by ADC 606 can be filtered by an anti-aliasing filter (AAF) 608. In some examples, the anti-aliasing filter can be implemented earlier in the signal chain and in the analog domain (e.g., prior to analog-to-digital conversion). The filtered digital data can be output using data buffer 610 and sent to the touch and display controller for touch processing (e.g., by one or more touch processors, discrete logic network, hardware accelerator, etc.) to determine the presence of a proximity or touch event. Although described above for self-capacitance sensing, it should be understood that touch chiplet 600 can be used for mutual capacitance sensing (as described in more detail with respect to FIGS. 8A-8F).

Figure 6B:
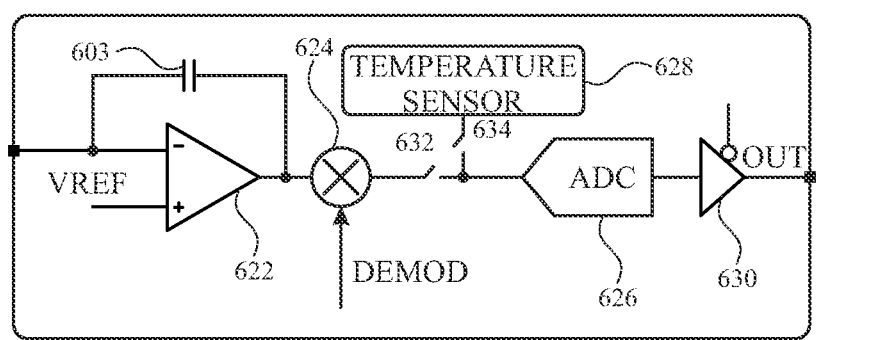
FIG. 6B illustrates exemplary circuitry for an exemplary touch chiplet including a temperature sensor according to examples of the disclosure.

In some examples, the touch chiplets can also include temperature sensors to enable localized temperature sensing. Localized temperature information can be used to reduce baseline drift within touch measurements (e.g., by compensating offset and/or gain for touch sensing circuitry) and to calibrate brightness of display pixels for more uniform touch and display performance across the integrated touch screen. FIG. 6B illustrates exemplary circuitry for an exemplary touch chiplet including a temperature sensor according to examples of the disclosure. Touch chiplet 620 can include a capacitance sensing circuit including an operational amplifier 622 and feedback network, mixer 624, ADC 626 and data buffer 630 (e.g., corresponding to operational amplifier 602, mixer 604, ADC 606 and data buffer 610). Although not illustrated, touch chiplet 622 can also include an anti-aliasing filtering (e.g., corresponding to AAF 608), for example, between mixer 624 and switch 632). The operation of these components can be the same as described above for touch sensing with touch chiplet 600 when switch 632 is in the closed position and switch 634 is in the open position. Touch chiplet 620 can further include an analog temperature sensor 628, which can be coupled to ADC 626 by switch 634. During temperature sensing, switch 634 can be closed and switch 632 can be opened, allowing the temperature data sampled by temperature sensor 628 to be converted to a digital signal by ADC 626 and transmitted via data buffer 630 to the touch and display controller. Temperature sensor 628 can be implemented, for example, using analog circuitry for a sensor outputting a voltage proportional to absolute temperature (VPTAT). Implementing temperature sensing in the touch chiplet can provide localized temperature measurements because the touch chiplets including temperature sensors can be distributed across the integrated touch screen. Furthermore, implementing temperature sensor 628 in touch chiplet 620 can reduce hardware costs because ADC 626 and data buffer 630 (and data lines) can be time multiplexed for touch and temperature operations. In some examples, the temperature sensing can be performed simultaneously with display operations (during display update while touch sensing is not occurring). In some examples, temperature sensing can have a dedicated operating period (while neither touch sensing or display operations occur).

Figure 7A:
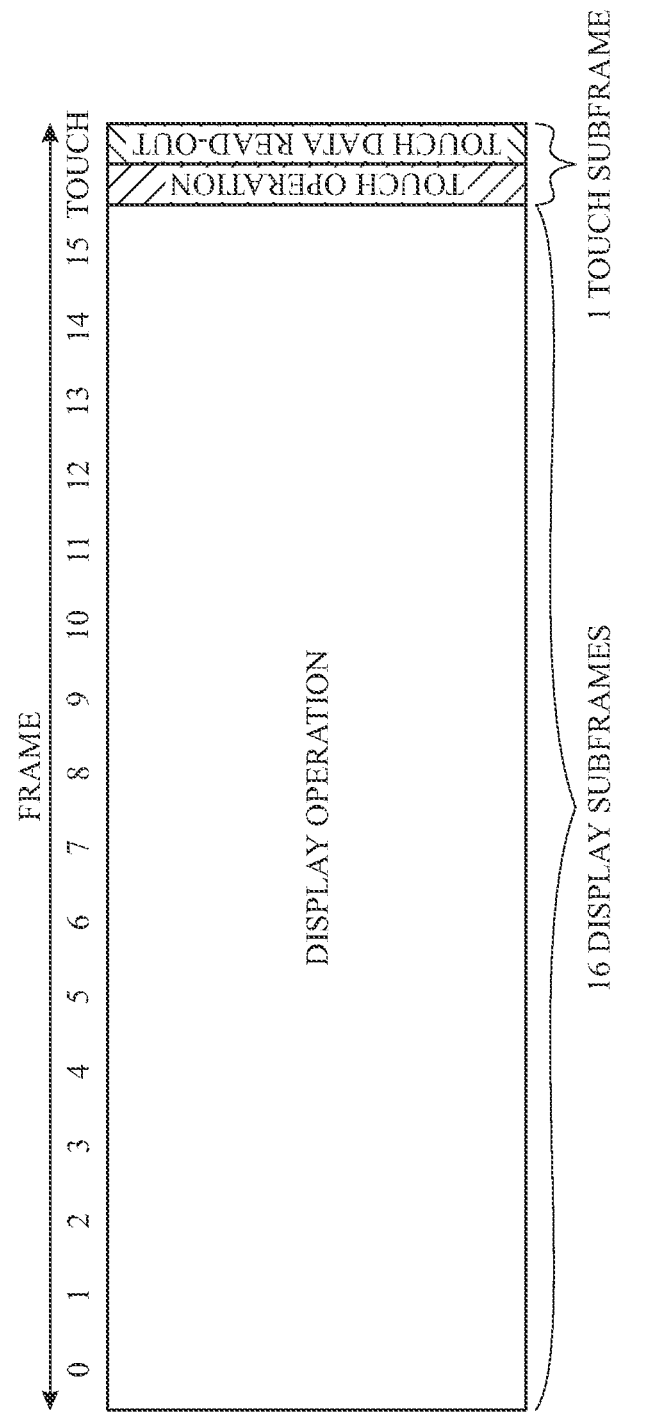
FIGS. 7A and 7B illustrate exemplary timing diagrams for touch and display operations according to examples of the disclosure.
Figure 7B:
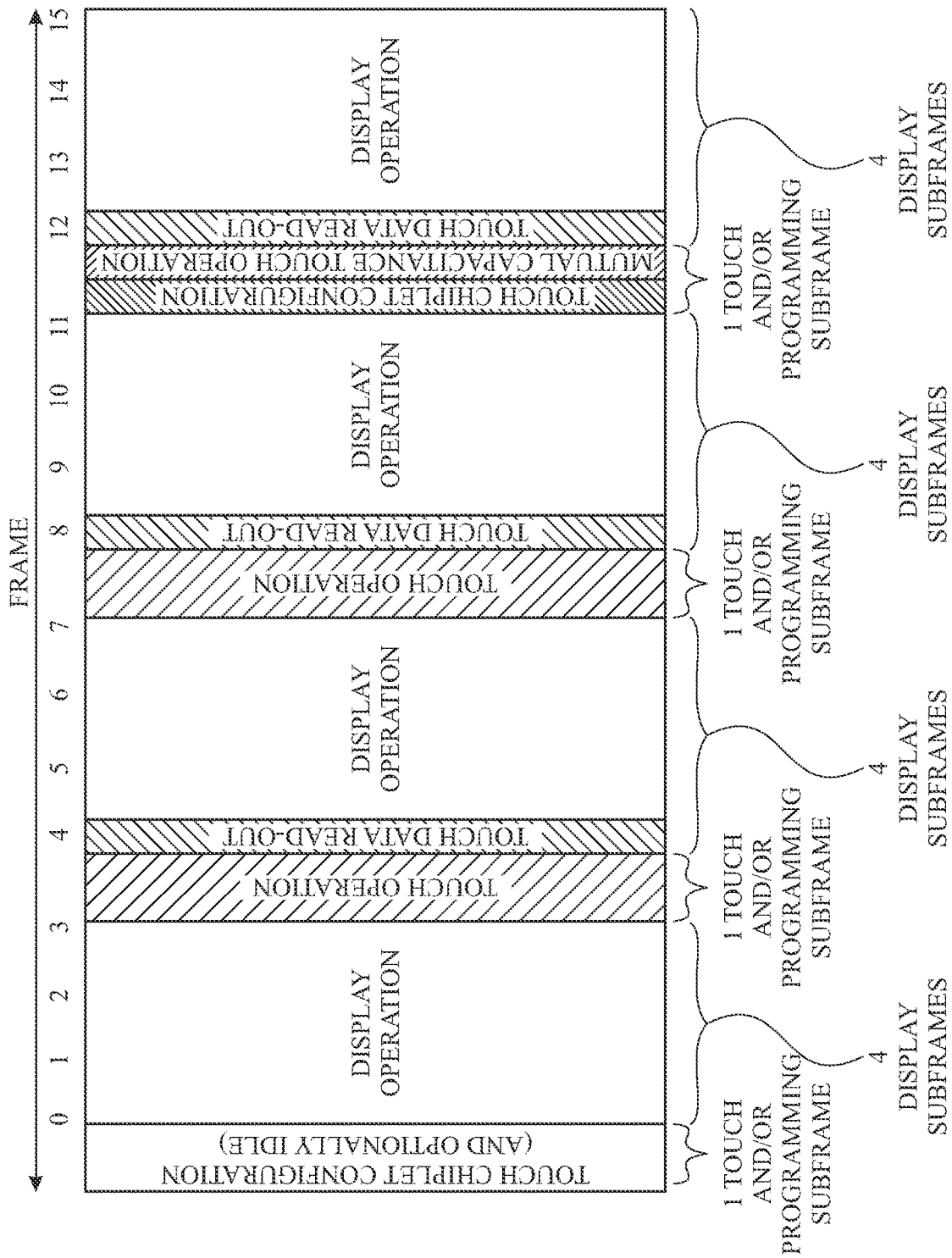

As discussed herein, sharing circuitry (e.g., ITO banks, data lines) between touch and display functionality can require time-multiplexing touch and display operations. FIGS. 7A and 7B illustrate exemplary timing diagrams for touch and display operations according to examples of the disclosure. It should be understood that these timing diagrams are exemplary and different timing can be employed. FIG. 7A illustrates a timing diagram for one operating frame (e.g., a 60 Hz frame). The frame can include 16 display sub-frames (sub-frames 0-15) during which time the display operations by display circuitry can occur (e.g., display refresh/update of the LEDs by the display chiplets) and 1 touch sub-frame during which time the touch node electrodes can be formed (e.g., by display chiplets) and sensed (e.g., by touch chiplets) in a touch operation. The touch data can be subsequently read out from the touch chiplets (e.g., using data buffers 610, 630) after the touch operation and before the end of the frame. The display operations for the panel can be divided into 16 parts (e.g., updating 1/16 of the display pixels each display sub-frame). For example, during each display sub-frame, one of the pixels in the 8 row and 2 column array of 16 pixels coupled to a display chiplet (e.g., as illustrated in FIGS. 5B, 5C) can be updated for each display chiplet. In some examples, during each display sub-frame 1/16 of the rows of pixels of the touch screen can be updated or 1/16 of the number of pixels of the touch screen in some other configuration can be updated, such that each pixel in the touch screen can be updated in the 16 display sub-frames of the frame. Additionally, in some examples, touch sensing by the touch chiplets can acquire data forming a touch image for the touch screen each 60 Hz frame.

Time-multiplexing touch and display functionality can be beneficial to avoid interference between touch and display operations. In particular, transients due to micro-driver currents used to drive pixels in close proximity to touch node electrodes and touch chiplets can introduce noise into touch measurements that can reduce touch performance if display and touch operations occurred concurrently. To further reduce noise, the input-output lines of the integrated touch screen may be further isolated from the system during touch sensing operations. For example, referring back to FIG. 2B, during the touch operations the integrated touch and display module ground can be modulated by a guard signal from the guard IC. However, during display operations (and optionally during touch data read-out), the integrated touch and display module ground can be at the chassis ground.

FIG. 7B illustrates a timing diagram for one operating frame (e.g., a 60 Hz frame). The frame can include 16 display sub-frames (sub-frames 0-15) during which time the display operations by display circuitry can occur (e.g., display refresh/update by display chiplets). However, the display operations can be broken up into groups of four display sub-frames and touch operations or other operations can occur during intra-frame pauses (IFPs). Beginning at the far left of the timing diagram, during a first IFP, the touch chiplets can be configured for touch operations (e.g., self-capacitance scans). If sufficient time remains during the IFP to execute the touch operation, the touch operation can be performed. Additionally or alternatively, the touch chiplets can idle the remaining portion of the first IFP. During a second IFP and a third IFP, self-capacitance touch operations can be performed by the touch chiplets (as configured during the first IFP). During a fourth IFP, the touch chiplets can be reconfigured for a different touch operation (e.g., mutual capacitance scans). In some examples, during the remaining portion of the fourth IFP the mutual capacitance touch operation can be performed. It should be understood that the reconfiguring of the touch chiplets can occur when switching the state of the chiplet from "main" to "redundant" or "redundant" to "main," or when changing the type of scan e.g., mutual capacitance, self-capacitance, etc.

The display operations can be performed subsequent to each IFP. For example, display operations can be performed during display sub-frames 0-3 after the first IFP, during display sub-frames 4-7 after the second IFP, during display sub-frames 8-11 after the third IFP and during display sub-frames 12-15 after the fourth IFP. Touch data from the touch operations can be read out during the display operations using separate touch data lines (i.e., data line used for touch operations, not display operations). In some examples, shared data lines for touch and display can be used and the touch data read out can occur during an IFP when the display is not updating. The configuration of the touch chiplets and touch operations by the touch chiplets can occur according to instructions from the touch and display controller 212 (e.g., from a scan plan stored therein). Touch and display controller 212 can also provide the data, control and timing signals for time-multiplexing the touch and display operations and configuration of the touch and/or display chiplets, as well as receive the touch data and/or temperature data from the touch chiplets.

As discussed herein, touch chiplets can be configured to sense touch node electrodes according to various touch detection scans. FIGS. 8A-8F illustrate an exemplary touch chiplet and various configurations according to examples of the disclosure. Touch chiplet 800 of FIG. 8A can include a capacitance sensing circuit including an operational amplifier 802 and feedback network, mixer 804, ADC 806, AAF 808 and data buffer 810 (e.g., corresponding to operational amplifier 602, mixer 604, ADC 606, AAF 608, and data buffer 610). The operation of these components can be the same as described above for touch sensing with touch chiplet 600 when in a sense configuration. Touch chiplet 800 can include pins including pin 812 coupled to the touch node electrode (e.g., via sense line 524), pin 814 for a low voltage reference or ground, pin 816 for a stimulation signal and/or demodulation signal, pin 818 for a high voltage reference ($V_{high}$), and pin 820 for outputting data (e.g., touch data or temperature data). Additionally, touch chiplet 800 can include configuration switches 822, 824, 826, 828 to configure touch chiplet 800 for various touch sensing operations.

Figure 8A:
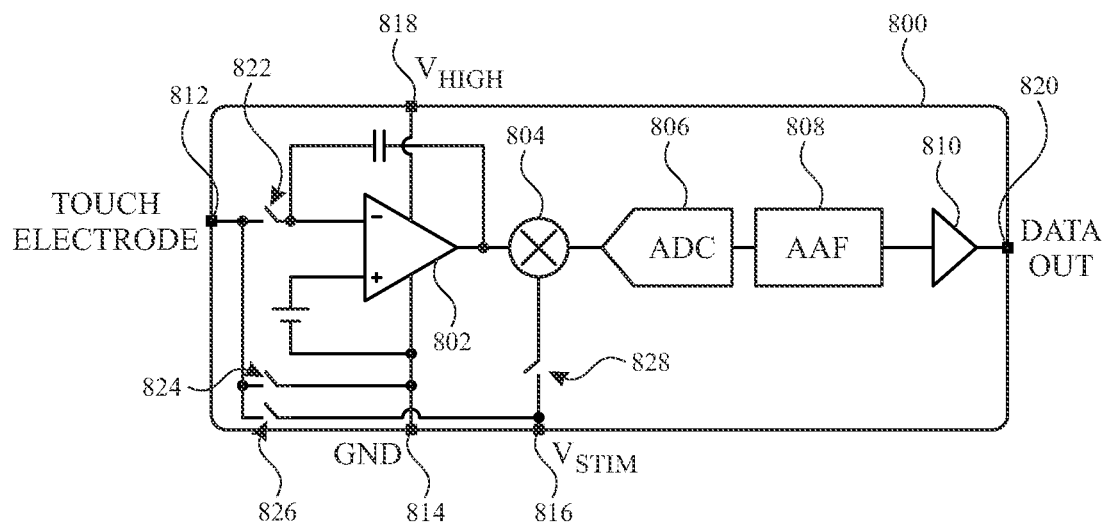
FIGS. 8A-8F illustrate an exemplary touch chiplet and various configurations according to examples of the disclosure.
Figure 8B:
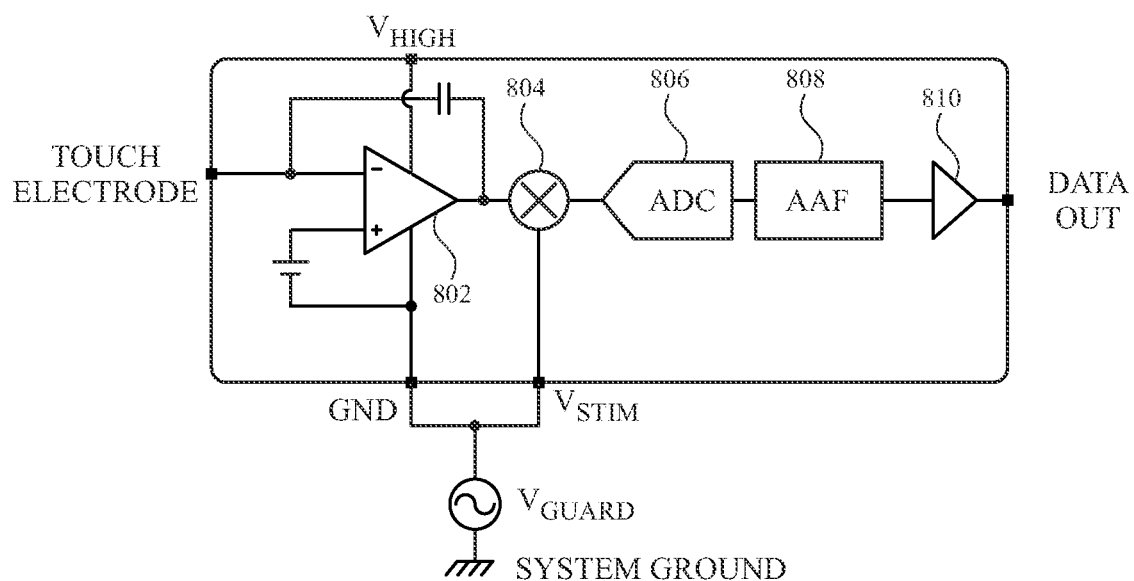

FIG. 8B illustrates touch chiplet 800 in a guarded self-capacitance touch sensing configuration. In such a configuration, configuration switches 822 and 828 can be closed and configuration switches 824 and 826 can be opened. As described above (e.g., with respect to FIGS. 2B and 6A), in a guarded self-capacitance touch sensing configuration, touch chiplet 800 can operate in a guarded domain with ground and $V_{high}$ provided with reference to a guard signal. The AC component of the guard signal coupled to the non-inverting terminal of operational amplifier 802 can be used to stimulate a touch node electrode coupled to touch chiplet 800, as and can be used as the demodulation signal supplied to mixer 804 to demodulate the output of operational amplifier 802 sensing the touch node electrode coupled to the inverting terminal of operational amplifier 802. In some examples, each touch node electrode in an integrated touch screen can be driven and sensed by a corresponding one of the touch chiplets configured for guarded self-capacitance scans. The integration of touch chiplets into the touch screen can enable simultaneous stimulation and sensing of each touch node electrode which can reduce scan time for the touch screen (e.g., because the entire touch screen can be scanned in parallel in one scan period, rather than in serial scans of portions of the touch screen in multiple scan periods) and can enable the use of common mode noise cancellation algorithms. Integrating the touch chiplets into the touch screen can provide for a large number of sense channels, without the hardware penalties of doing so in one or more touch sensing chips not integrated into the touch screen stack-up. In particular, the touch chiplets can implement the sense channels in empty areas of the touch screen (e.g., area of substrate 310 not occupied by display chiplets 308 or micro-LEDs 206) distributed across the touch screen rather than occupying area in one or more touch sensing chips outside of the touch screen. Additionally, as described herein, the sensitive routing between touch node electrodes and sense channels can be localized (between the touch node electrode and the corresponding touch chiplet) rather than globally routing the touch node electrodes to one or more touch sensing chips outside of the touch screen stack-up.

Mutual capacitance scans can also be performed using groups of touch node electrodes. For example, FIG. 8F illustrates a group of four touch node electrodes 830, 832, 834, 836 coupled to touch chiplets configured to drive (D), sense (S) or ground (G) a corresponding touch node electrode. In the configuration of FIG. 8F, a mutual capacitance 838 (or change in mutual capacitance) between touch node electrodes 830 and 832 can be measured. In particular, Touch node electrode 830 can be stimulated by a stimulation signal (e.g., an AC voltage signal) supplied by a touch chiplet in a drive configuration. The stimulation signal can be capacitively coupled to touch node electrode 832 through mutual capacitance 838 between touch node electrode 830 and touch node electrode 832. When a finger or object approaches a touch node created by the proximity of touch node electrodes 830 and 832, mutual capacitance 838 can be altered. This change in mutual capacitance 838 can be detected to indicate a touch or proximity event at the touch node. The change in mutual capacitance can be measured by a touch chiplet in the sensing configuration coupled to touch node electrode 832. The pattern of D, S and G configurations for four touch node electrodes in FIG. 8F can be applied to groups of four touch nodes across the touch screen.

It should be understood that the pattern of D, S and G configurations presented in FIG. 8F is for illustration purposes only, and that other patterns can be used to measure mutual capacitance between various touch node electrodes in an integrated touch screen.

Figure 8C:
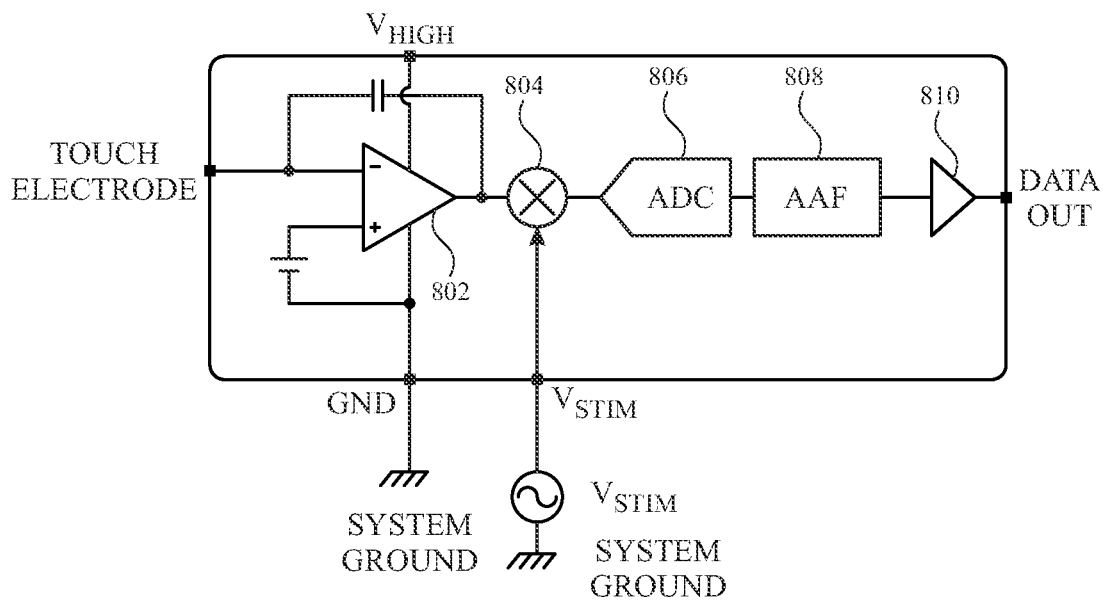
Figure 8D:
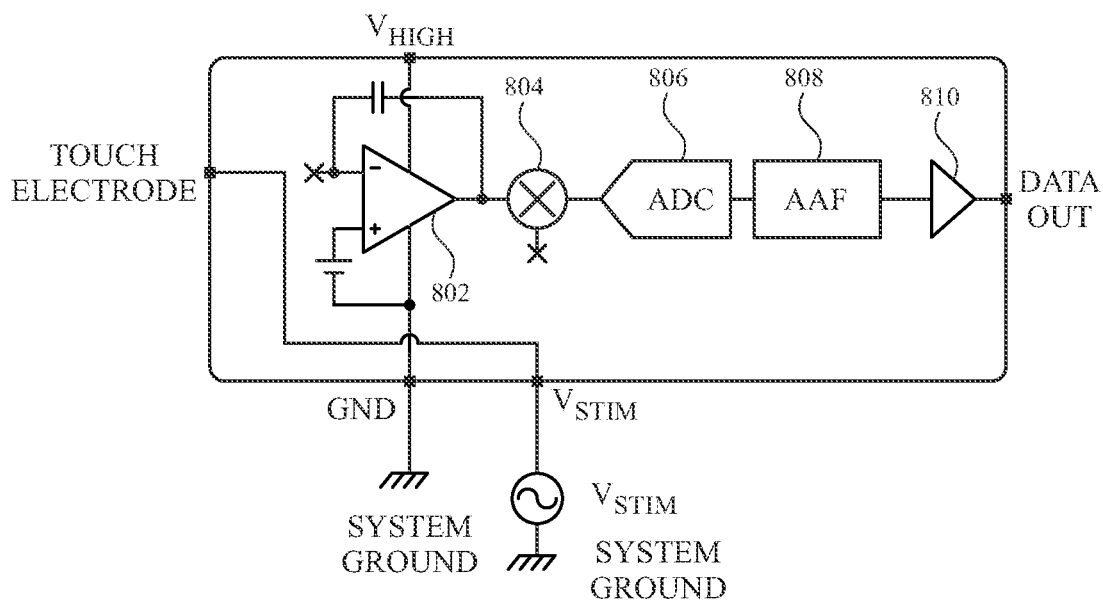
Figure 8E:
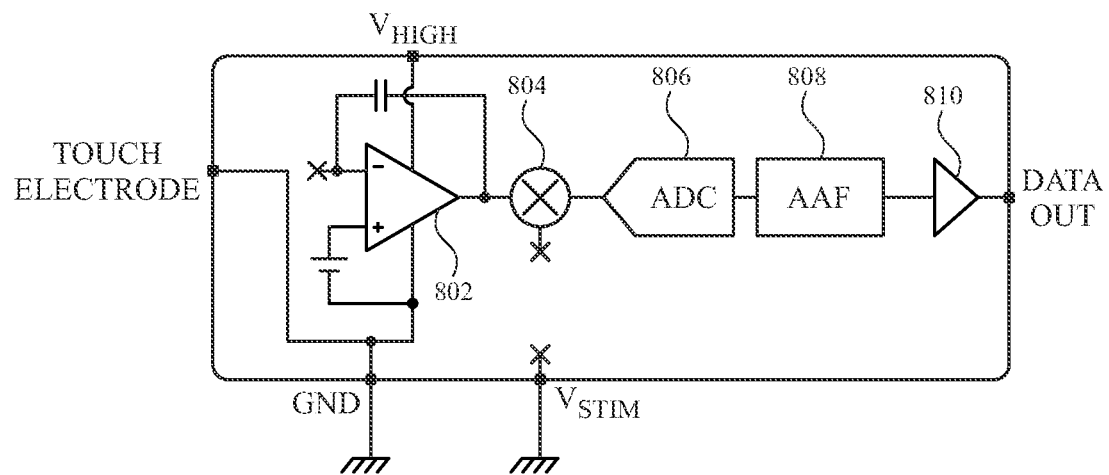
Figure 8F:
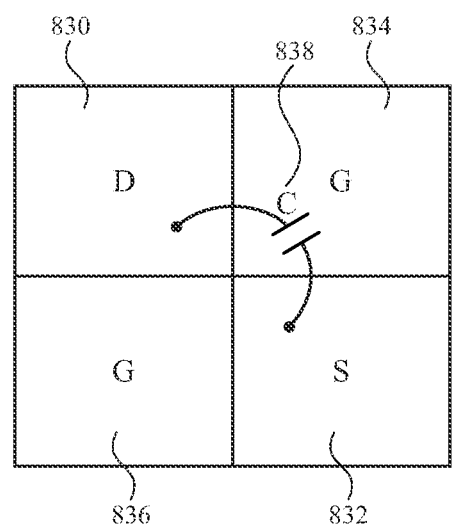

FIG. 8C illustrates touch chiplet 800 in a mutual capacitance touch sensing configuration and can correspond to the configuration of the touch chiplet coupled to touch node electrode 832 in the sense configuration. In such a configuration, configuration switches 822 and 828 can be closed and configuration switches 824 and 826 can be opened. Unlike in FIG. 8B, in a mutual capacitance touch sensing configuration, touch chiplet 800 can operate in a chassis ground domain with a chassis ground and $V_{high}$ provided with reference to the chassis ground. A demodulation signal supplied to mixer 804 can be used to demodulate the output of operational amplifier 802 sensing the touch node electrode (e.g., touch node electrode 832) coupled to the inverting terminal of operational amplifier 802. The demodulation signal can be the same signal as used to stimulate a second touch node electrode (e.g., touch node electrode 830). FIG. 8D illustrates touch chiplet 800 in a mutual capacitance drive configuration and can correspond to the configuration of the touch chiplet coupled to touch node electrode 830 in the drive configuration. In such a configuration, configuration switches 824 can be closed and configuration switches 822, 826 and 828 can be opened. The stimulation signal can be supplied from the Vstim pin and routed via configuration switch 824 to the driven touch node electrode (e.g., touch node electrode 830). In some examples, some or all of the sense channel (e.g., amplifier 802, mixer, 804, ADC 806, AAF 808 and/or data buffer 810) can be powered down when in the drive configuration. In some examples, rather than powering down the circuitry, ADC 806 and output buffer 810 can be used to measure the temperature sensor during the mutual capacitance sensing scan. FIG. 8E illustrates touch chiplet 800 in a mutual capacitance ground configuration and can correspond to the configuration of the touch chiplets coupled to touch node electrodes 834 and 836 in the ground configuration. In such a configuration, configuration switches 826 can be closed and configuration switches 822, 824 and 828 can be opened. The ground signal can be supplied from the ground pin and routed via configuration switch 826 to the touch node electrode to be grounded (e.g., touch node electrodes 834 and 836). In some examples, some or all of the sense channel (e.g., amplifier 802, mixer, 804, ADC 806, AAF 808 and/or data buffer 810) can be powered down when in the ground configuration.

Touch chiplets can be configured into various sensing modes as described above with respect to FIGS. 8A-8F by programming logic registers within the touch chiplets. In some examples, the logic registers can be volatile memory. In some examples, non-volatile memory within the touch chiplet can be used to store the configuration of the touch chiplet and the non-volatile memory can be programmed with the proper configuration. The data in the registers or non-volatile memory can be used, for example, to configure the switches 822, 824, 826 and 828 for the corresponding touch sensing operation.

Additionally, registers within the touch chiplets can be programmed to indicate whether a touch chiplet is a "main" or "redundant" touch chiplet. Referring back to FIGS. 5A and 5C, an integrated touch screen can include two touch chiplets for each touch node electrode. One touch chiplet can be configured as a "main" touch chiplet and a second can be configured as a "spare" or "redundant" touch chiplet. The configuration of a touch chiplet as "main" or "redundant" can include determining a functional state of the touch chiplets. In some examples, each touch chiplet of the integrated touch screen can be determined to be a functional chiplet or a non-functional chiplet at an initial calibration stage (e.g., factory testing). One of the functional touch chiplets for a touch node electrode can be identified as the "main" chiplet (main state) and the second touch chiplet (either functional or non-functional) can be identified as the "redundant" chiplet (redundant state). The main or redundant state of each touch chiplet for the integrated touch screen can, in some examples, be stored (e.g., in a memory in a touch and display controller) and a factory programming can be used to program each touch chiplet in the appropriate state as "main" or "redundant." In some examples, the functional state of touch chiplets can be re-determined at a recalibration stage (e.g., at a time of repair). The re-determined identification of functional or non-functional touch chiplets can be updated and stored for programming the touch chiplets as "main" or "redundant." In some examples, the functionality of touch chiplets (e.g., all touch chiplets or only "main" touch chiplets) can be monitored dynamically during operation of a device including the integrated touch screen, and the identification of functional or non-functional touch chiplets can be updated and stored for programming the touch chiplets as "main" or "redundant." In some examples, the main or redundant state can be programmed into a non-volatile memory (EEPRPOM, etc.) in the touch chiplet. In some examples, the main or redundant state can be programmed into a volatile memory (e.g., logic registers) in the touch chiplet.

Figure 9:
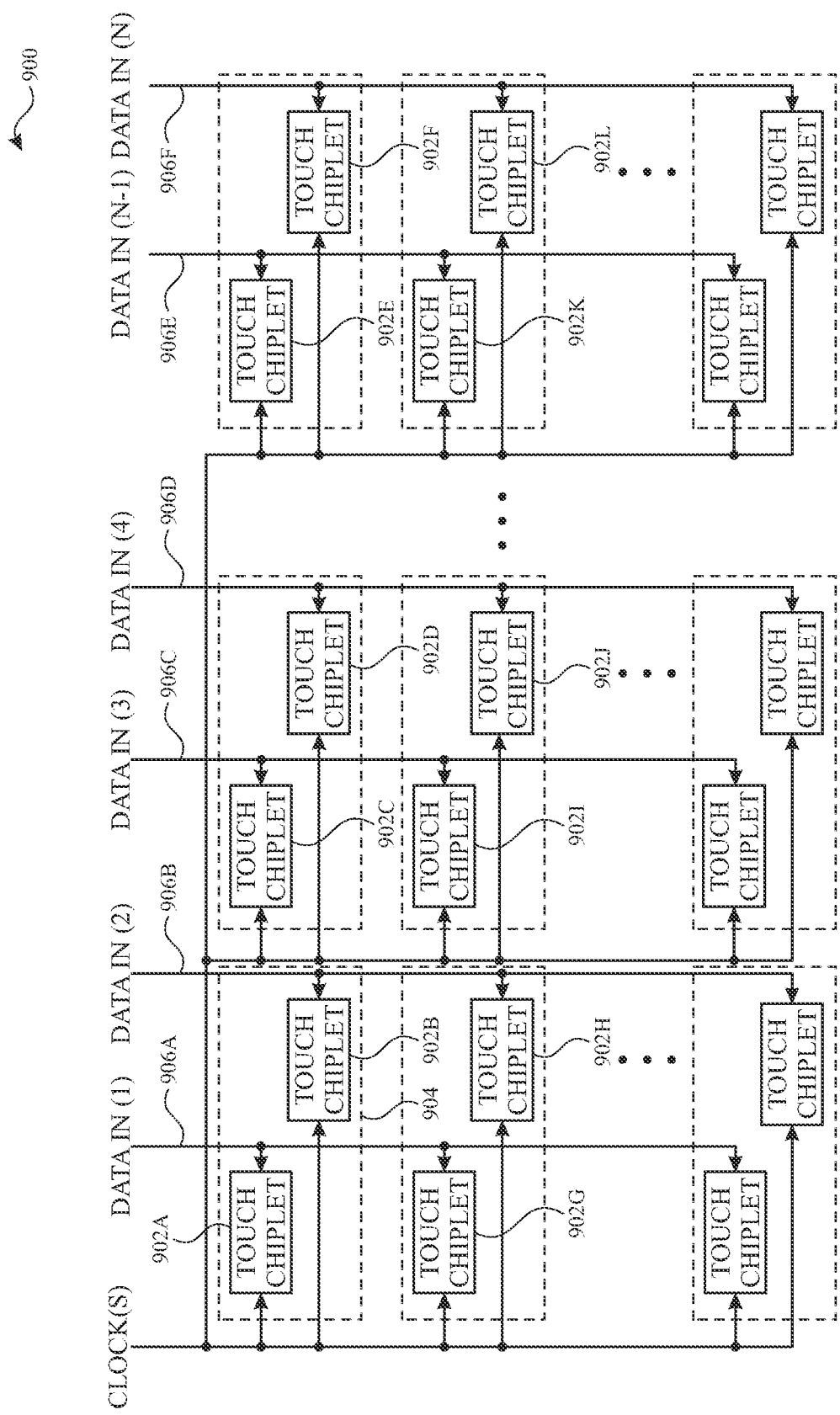
FIG. 9 illustrates an exemplary configuration for programming touch chiplets according to examples of the disclosure.

In some examples, both the main/redundant state and the touch sensing configuration can be stored in logic registers within each touch chiplet. The main/redundant state and the touch sensing configuration information can be programmed into the touch chiplets each time the touch chiplets are powered on, reset and/or programmed (e.g., as illustrated in FIG. 7B). Various programming schemes can be used to program the touch chiplets. In some examples, each touch chiplet can include dedicated data inputs to enable programming the touch chiplets in parallel. In some examples, the data input(s) can be shared for each of the touch chiplets, and the touch chiplets can be programmed in series. In some examples, some data inputs can be shared between touch chiplets and other data inputs may not be shared, such that programming of touch chiplets can include series and parallel characteristics. For example, FIG. 9 illustrates an exemplary configuration 900 for programming touch chiplets according to examples of the disclosure. Configuration 900 can include a plurality of touch chiplets corresponding to a plurality of touch node electrodes arranged in a plurality of rows and columns. For example, representative touch node electrode 904 (e.g., corresponding to the touch node electrode in the first row and first column) can include a first touch chiplet 902A and a second touch chiplet 902B (a pair of touch chiplets). Likewise, the remaining touch node electrodes can each be coupled to a corresponding first touch chiplet and second touch chiplet (corresponding pair of touch chiplets). Each column of touch node electrodes can include two data-in lines (or two groups of data-in lines). One data-in line (or one group of data-in lines) can be coupled to one of the pair of touch chiplets for each of the touch node electrodes in the column and a second data-in line (or second group of data-in lines) can be coupled to a second of the pair of touch chiplets for each of the touch node electrodes in the column. In some examples, the data-in lines or groups of data-in lines can be shared as data lines for display chiplets during display operations. For example, during display operations, the data lines can be used to set the display pixel color and intensity. During a non-display operation (e.g., programming operation illustrated in FIG. 7B), all or a subset of the data lines can be used for programming the touch chiplets in preparation for a touch operation. Each of the touch chiplets can receive one or more global clock signals. A row enable token can be generated, as described in more detail herein, to cause the pair of touch chiplets corresponding to one row of touch node electrodes to register data input on a corresponding data line while the pairs of touch chiplets corresponding to the remaining rows of touch node electrodes do not register the data input on the corresponding data line. For example, while the first row of FIG. 9 is enabled, touch chiplets 902A-F can be programmed by registering data on corresponding data-in lines 906A-F. The non-enabled touch chiplets in the remaining rows do not register the data on the corresponding data-in lines 906A-F. While the second row of FIG. 9 is enabled, touch chiplets 902G-902L can likewise be programmed by registering data on corresponding data-in lines 906A-F (while the remaining rows do not). Likewise, the remaining touch chiplets can be programmed in this fashion. Thus, configuration 900 enables serial-row and parallel-column programming of pairs of two touch chiplets (one main, one redundant). It should be understood that additional data-in lines can be added for each column of touch node electrodes for configurations with additional touch chiplets (e.g., two redundant touch chiplets) rather than a pair of touch chiplets (one main, one redundant). It should be understood that a serial-column and parallel-row programming can be implemented instead or serial-row and parallel-column programming.

FIGS. 10A-10E illustrate exemplary logic circuitry for configuration of touch chiplets according to examples of the disclosure. Logic circuitry 1000 illustrated in FIG. 10A can be included in each touch chiplet in an integrated touch screen. Logic circuitry 1000 can be implemented in a programmable logic device (e.g., FGPA, CPLD, etc.) or with discrete logic elements (e.g., logic gates, flip flops, etc.). Logic circuitry 1000 can include configuration registers 1002 to store configuration data including main/redundant state and touch sensing configuration (touch sensing mode). Logic circuitry 1000 can also include shift register logic 1004 to shift data (e.g., from touch and display controller 212) loaded from the data-in lines into touch chiplet. Shift register logic 1004 can be enabled in the touch chiplet while the touch chiplet is enabled to accept data (e.g., as described above with respect to FIG. 9). A token enable ("token_en") can be generated by token enable logic 1006 to enable the shifting of data by shift register logic 1004. The token enable logic 1006 can generate the token enable based on a system clock, programming clock and status indicators from other touch chiplets (e.g., corresponding to a touch node electrode in the row immediately adjacent to the touch chiplet being programmed). Additionally, latch enable logic 1008 can generate a latch enable signal ("latch_en") to latch the data from the shift registers into the configuration registers 1002 once the data in has been shifted fully by shift register 1004. The latch enable logic 1008 can generate the latch_en based on the token_en and the programming clock. Data in configuration registers 1002 can cause a touch chiplet in a redundant state to power down and can cause a touch chiplet in a main state to be configured according to other data in configuration registers 1002 for the touch sensing operation as explained with respect to FIGS. 8A-8F.

Figure 10A:
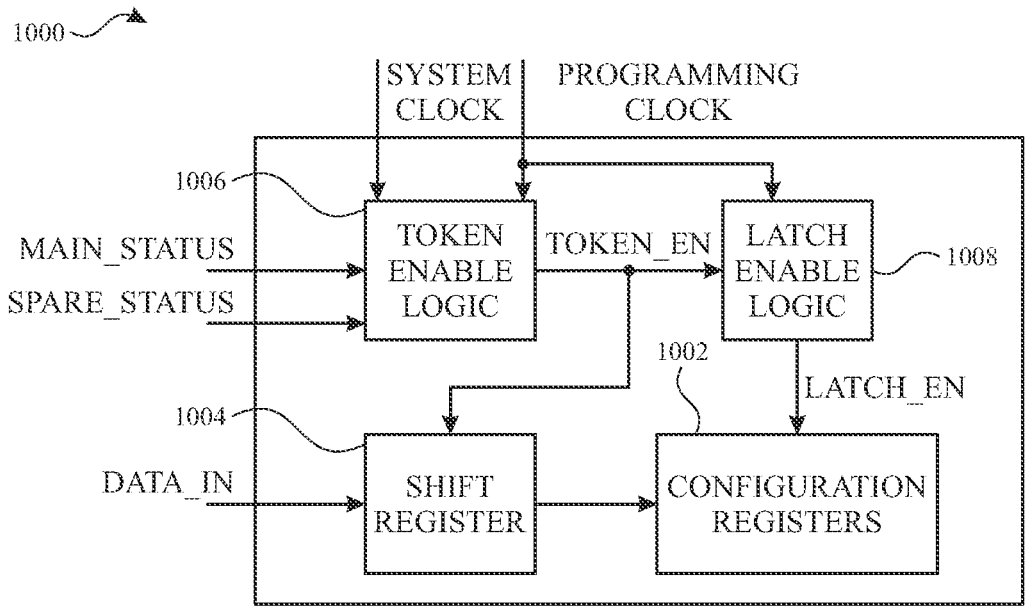
FIGS. 10A-10E illustrate exemplary logic circuitry for configuration of touch chiplets according to examples of the disclosure.
Figure 10B:
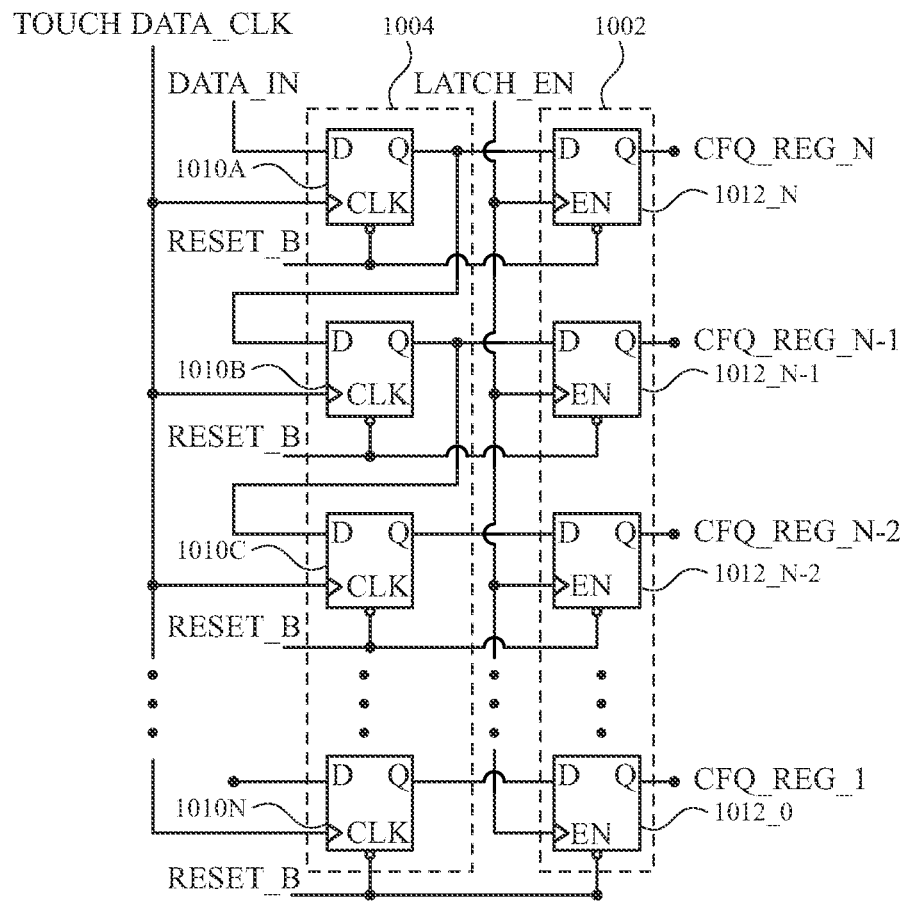

FIG. 10B illustrates exemplary logic circuitry corresponding to configuration registers 1002 and shift register logic 1004. Configuration registers 1002 can include N number of D flip-flops (DFFs). The input of each DFF in configuration registers 1002 can be coupled to the output of a corresponding DFF in shift register 1004. The output of each DFF in configuration registers 1002 can correspond to the latched data in configuration registers 1002. Each DFF in configuration registers 1002 can be latched when the latch enable signal toggles (i.e., latch_en acts as the clock signal).

Shift register 1004 can also include N number of DFFs. The output of each DFF in shift register 1004A can be coupled to the input of a corresponding DFF in configuration registers 1002. Additionally, with the exception of the first DFF in shift register 1004 (e.g., corresponding to the highest bit DFF of configuration registers 1002), each DFF in shift register 1004 can receive its input from the output of the adjacent DFF (e.g., the DFF above it). The first DFF can receive its input from the data-in line of the touch chiplet. The output of the last each DFF (e.g., corresponding to the lowest bit DFF of configuration registers 1002) can be connected to the corresponding configuration register. The DFFs of the shift registers 1002 can be clocked by a touch data clock generated in the touch chiplet while token_en enables the touch chiplet. The touch data clock can shift in the data for the configuration registers 1002 using shift registers 1004. Once the data has been shifted through shift register 1004 such that the configuration data to be programmed until the shift register completes loading/shifting the data into the touch chiplet (occupies all DFFs in the shift register 1002 in FIG. 10B), the latch enable signal can be generated to latch the data into configuration registers 1002.

Figure 10C:
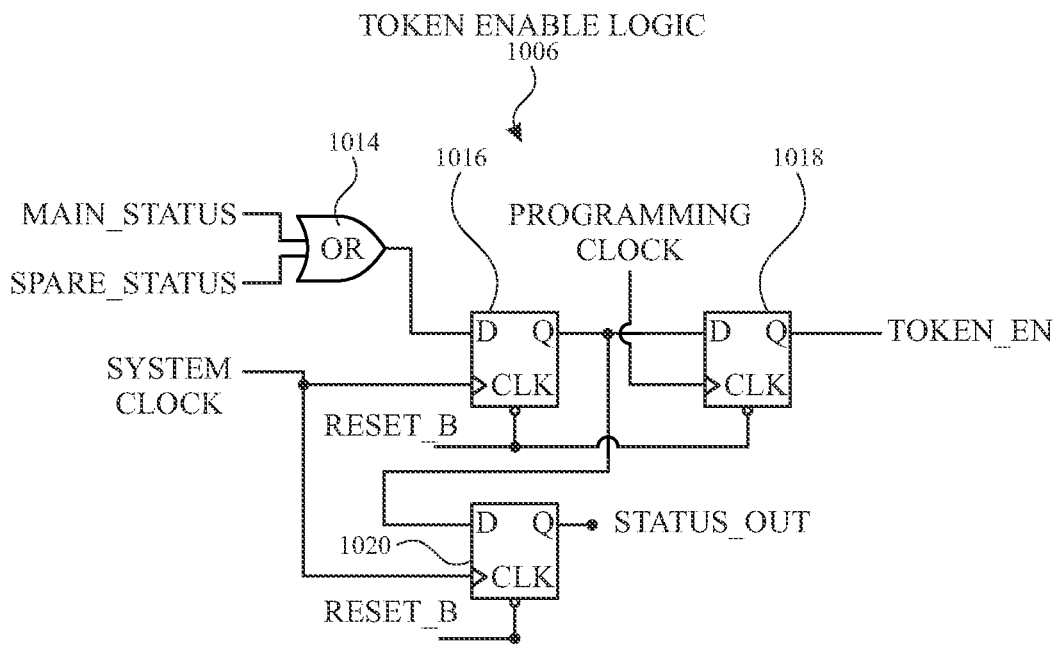

FIG. 10C illustrates exemplary logic circuitry corresponding to token enable logic 1006. Token enable logic 1006 can include 3 DFFs and one OR gate. OR gate 1014 can receive the status indicators from other touch chiplets (e.g., corresponding to a touch node electrode in same column and in an adjacent row (e.g., immediately above) the touch chiplet being programmed). When either of the pair of touch chiplets corresponding to the touch node electrode in the adjacent row (e.g., immediately above) indicate a programming operation status output (logic high), OR gate 1014 can provide a logic high input DFF 1016. The output of DFF 1016 can be coupled to the input of DFFs 1018 and 1020. DFF 1018 can output a token_en signal and DFF 1016 can output the status indicator for the chiplet being programmed. DFFs 1016 and 1020 can be clocked by the system clock and DFF 1018 can be clocked by the programming clock.

Figure 10D:
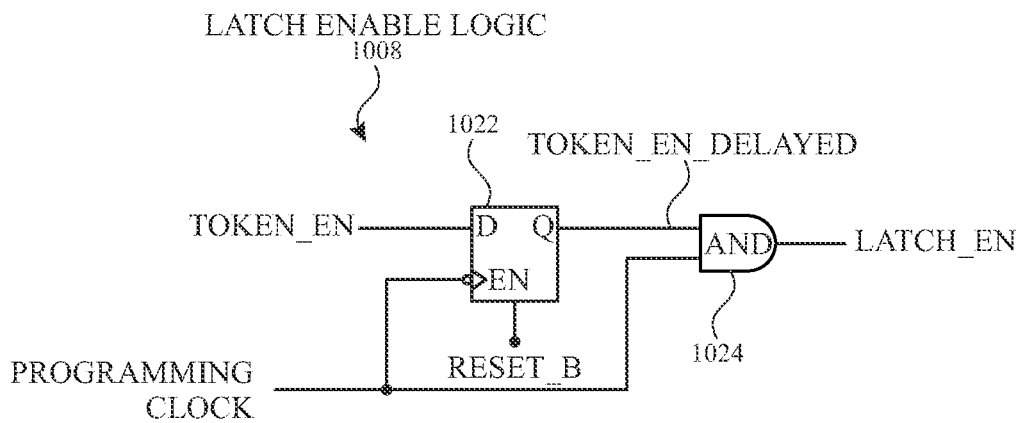

FIG. 10D illustrates exemplary logic circuitry corresponding to latch enable logic 1008. Latch enable logic 1008 can include DFF 1022 and AND gate 1024. DFF 1022 can receive token_en from token enable logic 1006 as its input and can be clocked by the inverse of the programming clock. The output of DFF 1022 can represent a delayed token enable signal ("token_en_delayed") which can be one of the inputs of AND gate 1024. The second input of the AND gate can be the programming clock.

Figure 10E:
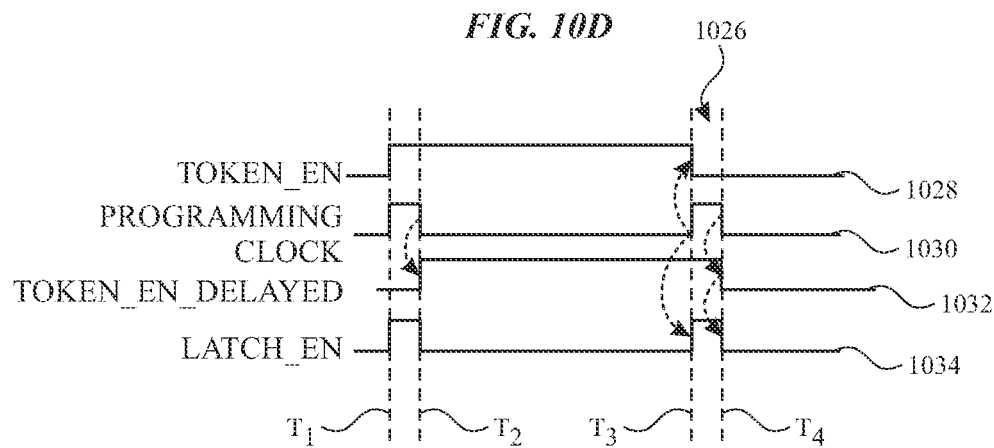

FIG. 10E illustrates exemplary timing diagrams for token enable logic 1006 and latch enable logic 1008 according to examples of the disclosure. At t1, the rising edge of programming clock can cause token_en to toggle to a logic high state, while token_en_delayed can toggle high on the falling edge of the programming clock at t2. From t2 to t3, shift registers 1004 can shift in the data. At t3, on the next rising edge of the programming clock, the token_en can transition to logic low and latch_en can transition to logic high to latch the data into configuration registers 1002. At t4, on the falling edge of the programming clock, the token_en_delayed can transition to logic low and latch enable can also transition back to logic low.

Figure 11A:
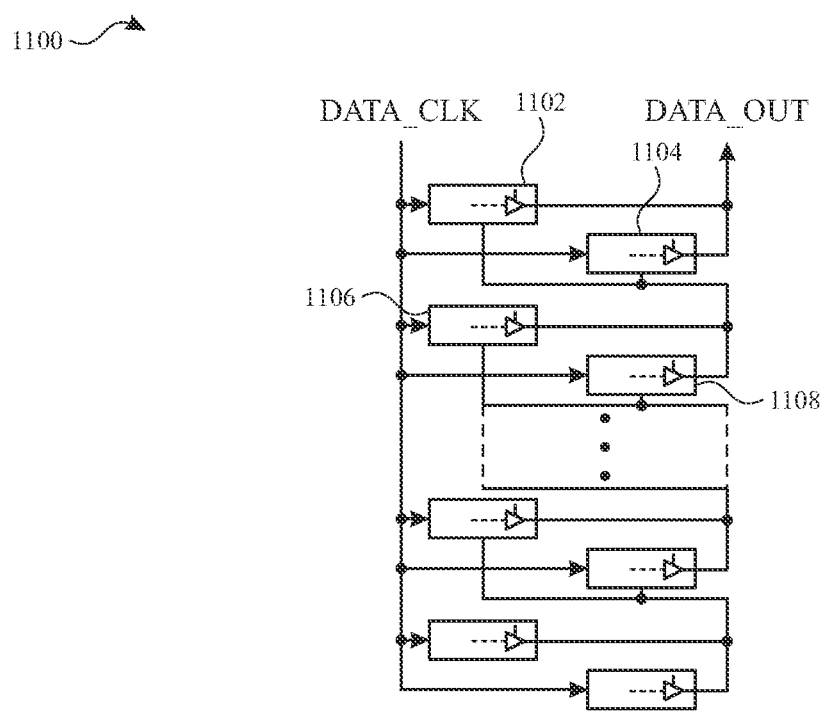
FIG. 11A-11B illustrate exemplary daisy chain configurations according to examples of the disclosure.

Referring back to FIG. 5C, the data output line of a pair of two touch chiplets corresponding to a touch node electrode (e.g., one main and one redundant) can be shared. In the shared configuration, the output buffers of a main touch chiplet can output data on the data clock and the redundant chiplet can have its output buffers in a high-z state. In some examples, the data output can also be daisy chained for pairs of touch chiplets in a column of touch node electrodes. FIG. 11A illustrates an exemplary daisy chain configuration 1100 according to examples of the disclosure. FIG. 11A illustrates pairs of touch chiplets corresponding to each touch node electrodes in a column of touch node electrodes. Each touch chiplet (main and redundant) can share a data clock used to shift data from the touch chiplets out from the column of touch node electrodes. For each column, the outputs of each pair of touch chiplets in each row (main and redundant) can be coupled together and as inputs into the pair of touch chiplets (main and redundant) in an adjacent row above. For example, a pair of touch chiplets 1106 and 1108 can have their outputs coupled together and input into pair of touch chiplets 1002 and 1004. Thus, the data clock can be used to shift the touch data out in a daisy chain irrespective of which of the touch chiplets in a pair of touch chiplets corresponding to a touch node electrode is the "main" touch chiplet and which is the "redundant" touch chiplet, and without requiring separate data output lines or other complicating routing and switching to read data out of the touch chiplets. The pair of touch chiplets 1002 and 1104 at the end of the daisy chain (e.g., at the top of the column) can be coupled to the data output line for the column to provide the touch data (and/or temperature data) to touch and display controller 212.

Figure 11B:
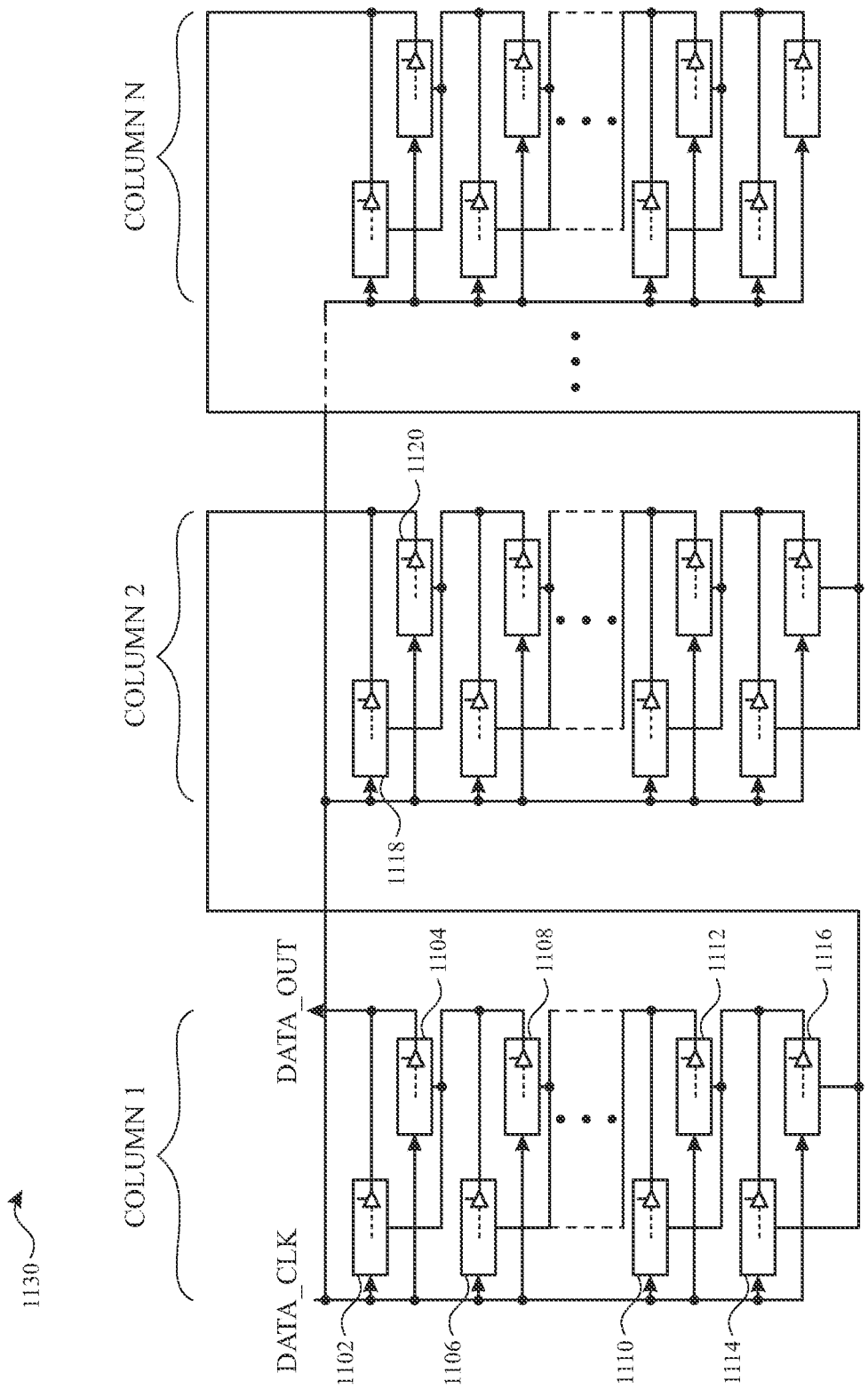

As discussed above, configuration 1100 can allow for one data out line for each column to shift the data out row by row (column-parallel and row-serial). In some examples, the data read out can be entirely serially. FIG. 11B illustrates an exemplary daisy chain configuration 1130 according to examples of the disclosure. In configuration 1130, N columns can be coupled together in a larger daisy chain. Column 1 can correspond to the column illustrated in FIG. 11A with data output from the pair of touch chiplets 1102, 1104 to the data output line. Data can be fed up column 1 from pair of touch chiplets 1114, 1116 to pair of touch chiplets 1110, 1112, to pair of touch chiplets 1106, 1108 and to pair of touch chiplets 1102, 1104. Unlike in FIG. 11A, however, pair of touch chiplets 1114, 1116 can receive data from pair of touch chiplets 1118, 1120 of column 2 (e.g., an adjacent column). Likewise, each column (except column 1), can receive and pass touch data in the daisy chain at the bottom pair of touch chiplets from the top pair of touch chiplets in the next column (e.g., the adjacent column).

It should be understood that the data read out can be performed fully serially as in FIG. 11B, full parallel (e.g., by providing dedicated data output lines for touch chiplet(s) corresponding to a touch node electrode) or some partially parallel and partially serial data read out (e.g., as illustrated in FIG. 11A). A trade off can be made between the number of data lines and the speed of data read out (additional data lines can increase the speed of data read-out by parallelizing the read out). Additionally, in some examples, the data read out can be performed in a dedicated time period (e.g., time-multiplexed with display as illustrated in FIG. 7A), such that the data lines for reading out touch data can be shared with data lines used for display operations during a display period. In some examples, the data read out can be performed at the same time as display operations (e.g., as illustrated in FIG. 7B) with data output line(s) dedicated for touch data read out and not shared with display operations.

In addition to performing mutual capacitance scans and self-capacitance scans, touch chiplets in an integrated touch screen can also be configured to simultaneously sense touch data, measured without applying stimulation to touch node electrodes, for spectral analysis by touch and display controller 212. In some conventional touch sensing systems, a spectral analysis can be performed by aggregating touch data sensed from touch sensor panel in a touch controller integrated circuit (e.g., a monolithic touch sensing chip). The aggregated touch data can then be demodulated by digital or analog processing circuitry of the touch controller integrated circuit using multiple demodulation signals including in-phase and quadrature-phase signals having a plurality of different frequencies. For example, analog or digital signals measured from a touch sensor panel by multiple sense channels (e.g., channel including a sense amplifier) can be aggregated (e.g., by an adder circuit) and/or stored in memory in the touch controller integrated circuit. The aggregated and/or stored signal can be demodulated by one or more demodulators (e.g., mixers) receiving a different demodulation signal. For example, where 30 mixers are available in a touch controller integrated circuit, an in-phase (I) and a quadrature-phase (Q) demodulation signal can be generated for each of 15 demodulation frequencies (e.g., between 50 kHz and 800 kHz, or between 100 kHz and 500 kHz). An aggregated signal from the entire touch sensor panel can then be demodulated using the 30 IQ demodulation signals, and the results of the I and Q demodulation (IQ demodulation) can represent the amount of signal content at each of the demodulation frequencies. A higher magnitude of signal (e.g., calculated from the I and Q components) can mean a higher background noise level at that frequency. Thus, the IQ demodulation can be used to identify one or more relatively clean frequencies (i.e., the one or more frequencies with the least background noise among the candidate demodulation frequencies or the or more frequencies with background noise levels below a threshold level), which can be used as a stimulation frequency for mutual or self-capacitance operations. In some examples, each of the 30 mixers can be used to demodulate a sensed signal, without stimulation, at a corresponding touch node (e.g., without aggregating). The sensed signal can be stored in memory within the touch controller integrated circuit, each mixer can demodulate the stored signal using 30 demodulation signals (I and Q for 15 frequencies) over thirty time periods to determine noise at each touch node.

In some examples, touch chiplets of an integrated touch screen as described herein, can be used to perform spectral analysis without requiring aggregation and/or storing the touch data. Without aggregation and/or storing, localized noise information rather than global noise information can be generated, and the localized noise information can be generated simultaneously without the storage and processing time penalties.

For example, an integrated touchscreen can include touch node electrodes. Each of the touch node electrodes can define a first area. For example, referring back to FIG. 5A, touch node electrode 502 can define a first area x2 by y2. The first area can be, for example, between 1 and 4 square millimeters (e.g., between 1 mm by 1 mm and 2 mm by 2 mm). In some examples, the first area can be 1.25 mm by 1.25 mm. The touch node electrodes can be arranged into groups of touch nodes electrodes. Each group of touch node electrodes can define a second area. For example, referring back to FIG. 5A, a group of touch node electrodes can define a second area x1 by y1. The second are can be, for example, between 16 and 64 square millimeters. In some examples, the second area can be 5 mm by 5 mm. The second area can correspond to the size of an interaction area of a finger or other touch object, which typically provide a pathway for noise entering the touch sensing system. In some examples, the second area can correspond to the size of a fingertip (e.g., a pinky or another finger). In some examples, the second area can correspond to empirical measured minimum size of a small finger in contact with a touch screen. Each touch node electrode (corresponding to the first area) can have a touch chiplet (e.g., the touch chiplet of FIG. 6A), such that each group of touch node electrodes (corresponding to the second area) can be sensed during a spectral analysis scan (without applying stimulation) by multiple touch chiplets. The multiple touch chiplets of a group of touch node electrodes can simultaneously receive multiple demodulation signals that can be used to simultaneously demodulate at different operating frequencies and phases to identify noise corresponding to the second area (without aggregating and storing data).

FIG. 12A illustrates an exemplary configuration 1200 of touch chiplets corresponding to multiple touch node electrodes corresponding to a region defining a second area according to examples of the disclosure. Configuration 1200 can correspond to 16 touch node electrodes, each of the first area, collectively covering the second area. The touch chiplet measuring noise (e.g., by sensing the touch node electrode without applying a stimulus) for each touch node electrode can be configured to demodulate the signal measurement sensed by the touch chiplet (e.g., using sense amplifier 602) with an in phase (I) or quadrature (Q) demodulation signal at a respective frequency (e.g., f1-f8). Thus, the 16 touch chiplets for 16 touch nodes can provide simultaneous measurements at each of f1-f8 for an I or Q demodulation signal to allow for spectral analysis of noise corresponding to the second area without requiring aggregating or storing. The same simultaneous measurement can performed for the other groups of touch node electrodes of the touch sensor panel using their respective touch chiplets without aggregating or storing. This data can be evaluated by the touch and display controller to determine one or more clean frequencies from f1-f8.

The clean frequencies can be determined on a local or global basis. For example, a clean (low-noise) frequency can be selected for each group of touch node electrodes, and the selected clean frequency can be used for mutual or self-capacitance touch operations in the respective group of touch node electrodes. In some examples, one global clean frequency can be determined and can be used for mutual or self-capacitance touch operations for all groups of touch node electrodes. Localizing the spectral analysis (without than aggregating) can allow for the identification of localize noise aggressors that may on average across the panel appear not noisy, but may appear highly noisy in a particular location. In this way, even the selection of a global clean frequency can be improved by excluding a frequency with a low average noise, but with spikes of localized noise. In some examples, an intermediate region can be defined (larger than a group and smaller than the entire touch screen) and each intermediate region can use a respective clean frequency.

It should be understood that the number of frequencies that can be evaluated simultaneously during a spectral analysis for the group of touch nodes defining the second area can dependent on the number of touch node electrodes (and corresponding touch chiplets) defining the first area. For example, in FIG. 12A, 16 touch node electrodes sensed by 16 touch chiplets can allow for 16 simultaneous demodulation signals, including I and Q demodulation signals for 8 different frequencies. In some examples, 64 touch node electrodes (defining a first area) in a group (defining a second area) sensed by 64 touch chiplets can allow for 64 simultaneous demodulation signals, including I and Q demodulation signals for 32 different frequencies.

In some examples, as illustrated in FIG. 12A, the demodulation signals can be applied such that touch chiplets in pairs of adjacent touch node electrodes can be stimulated with the same frequency and different phases. In some examples, two touch chiplets demodulating with demodulation signals with the same frequency, but different phases can be coupled to non-adjacent touch node electrodes or a different adjacent touch node electrodes. Additionally, as illustrated in FIG. 12A, in some examples, rows of configuration 1200 can have the same phase. For example, the first and third rows can be in-phase demodulation signals and the second and fourth rows can be quadrature demodulation signals. In some examples, the phases can take on different patterns. For example, the phases can be the same for columns rather than rows, the phases could alternate I and Q demodulation phases for adjacent touch node electrodes (e.g., as shown in FIGS. 12B and 12C), or the phases could be applied without a repeating pattern of phases.

In some examples, rather than using I and Q demodulation signals for a respective frequency to demodulate signals measured at two touch chiplets corresponding to two touch node electrodes, in some examples, demodulation signals can be applied on a row or column basis. In doing so, the routing of demodulation signals can be simplified because fewer independent routing lines are needed. FIG. 12B illustrates another exemplary configuration 1210 of touch chiplets corresponding to multiple touch node electrodes corresponding to a region defining a second area according to examples of the disclosure. Configuration 1210 can correspond to 16 touch node electrodes, each of the first area, in a group collectively covering the second area. The touch chiplets measuring noise (e.g., by sensing the touch node electrode without applying a stimulus) for each touch node electrode in a column can be configured to demodulate the signal measurement sensed by the touch chiplet (e.g., using sense amplifier 602) with an in-phase (I) or quadrature (Q) demodulation signal at a respective frequency (e.g., f1-f4). Thus, the 16 touch chiplets for 16 touch nodes can provide simultaneous measurements at each of f1-f4 for an I or Q demodulation signal to allow for spectral analysis of noise corresponding to the second area without requiring aggregating or storing. In some examples, the noise measurements for each pair of IQ demodulation measurements can be averaged in the touch and display controller. The same simultaneous measurement can performed for the other groups of touch node electrodes of the touch sensor panel using their respective touch chiplets without aggregating or storing. This data can be evaluated by the touch and display controller to determine one or more clean frequencies from f1-f4 (in a similar manner as discussed above with respect to FIG. 12A).

It should be understood that in configuration 1210, the number of frequencies that can be evaluated simultaneously during a spectral analysis for the group of touch nodes defining the second area can dependent on the number of columns of touch node electrodes (and corresponding touch chiplets) defining the first area. For example, in FIG. 12B, 16 touch node electrodes arranged in 4 rows and 4 columns (and sensed by 16 touch chiplets) can enable 8 demodulation signals, for I and Q demodulation signals at 4 frequencies. In some examples, 64 touch node electrodes (defining a first area) in an 8 row by 8 column group (defining a second area) sensed by 64 touch chiplets can enable 16 demodulation signals, for I and Q demodulation signals at 8 frequencies.

The configuration of FIG. 12B allows for a reduction in the number of demodulation lines because two touch chiplets out of the four in a column receive a first demodulation signal (e.g., f1, in-phase) and two touch chiplets out of the four in a column received a second demodulation signal (e.g., f1, quadrature). Thus, the number of traces can be reduced by half. In some examples, the routing can be further reduced. For example, one demodulation signal can be used per column such that a first column of touch chiplets can use a first demodulation signal having a first frequency and phase (e.g., f1, in-phase) and a second column of touch chiplets can use a second demodulation signal having the first frequency and the other phase (e.g., f1, quadrature). In such a configuration a 4 row by 4 column configuration of touch chiplets/touch node electrodes could analyze two frequencies.

In some examples, the number of frequencies that can be analyzed in configuration 1210 can be increased by performing a second spectral analysis with different frequencies during a second time period. FIG. 12C illustrates an exemplary configuration 1220 of touch chiplets corresponding to configuration 1210, but demodulating with a different set of frequencies according to examples of the disclosure. For example, in configuration 1210, f1 can be applied in I or Q form as the demodulation signal for column 1, f2 can be applied in I or Q form as the demodulation signal for column 2, f3 can be applied in I or Q form as the demodulation signal for column 3, and f4 can be applied in I or Q form as the demodulation signal for column 4. In configuration 1220, f5 can be applied in I or Q form as the demodulation signal for column 1, f6 can be applied in I or Q form as the demodulation signal for column 2, f7 can be applied in I or Q form as the demodulation signal for column 3, and f8 can be applied in I or Q form as the demodulation signal for column 4. Thus, by using different frequencies in different time periods, the number of frequencies that can be scanned may be increased. In the example of FIGS. 12B and 12C, eight frequencies rather than four frequencies could be analyzed (at the cost of requiring more time or frames of spectral analysis scans). Likewise, the number of frequencies for configuration 1200 can be increased from 8 frequencies to 16 (or more) frequencies by using different frequencies in different frames.

As described herein, the IQ demodulation can be performed simultaneously by touch chiplets coupled to corresponding touch node electrodes. The touch chiplets can correspond to touch chiplet 600 and can include a capacitance sensing circuit (capacitive sensor) including an operational amplifier and a mixer. The mixer can be configured to demodulate the output of the operational amplifier by mixing it with a demodulation signal. Thus, the IQ demodulation can be performed in the analog domain at each chiplet. The touch chiplet can also include an ADC to digitize an output of the mixer. The digitized output from the touch chiplets can be provided to the touch and display controller. Additionally, as discussed herein the touch and display controller can provide the demodulation signals. In some examples, the demodulation signal provided by the touch and display controller to the touch chiplets can be analog signals. In some examples, the touch and display controller can provide a digital signals and a digitally controller oscillator circuit (e.g., a numerically controlled oscillator (NCO)) in each of the touch chiplets can generate the appropriate frequency and phase demodulation signal based on these digital signals. The digital output signals from the demodulators can be processed in the touch and display controller for spectral analysis. For example, the magnitude of noise at each frequency can be calculated from the I and Q components for each group of touch chiplets. The touch and display controller can also determine identify one or more frequencies meeting one or more criteria to be classified as low-noise frequencies as discussed herein.

Figure 13A:
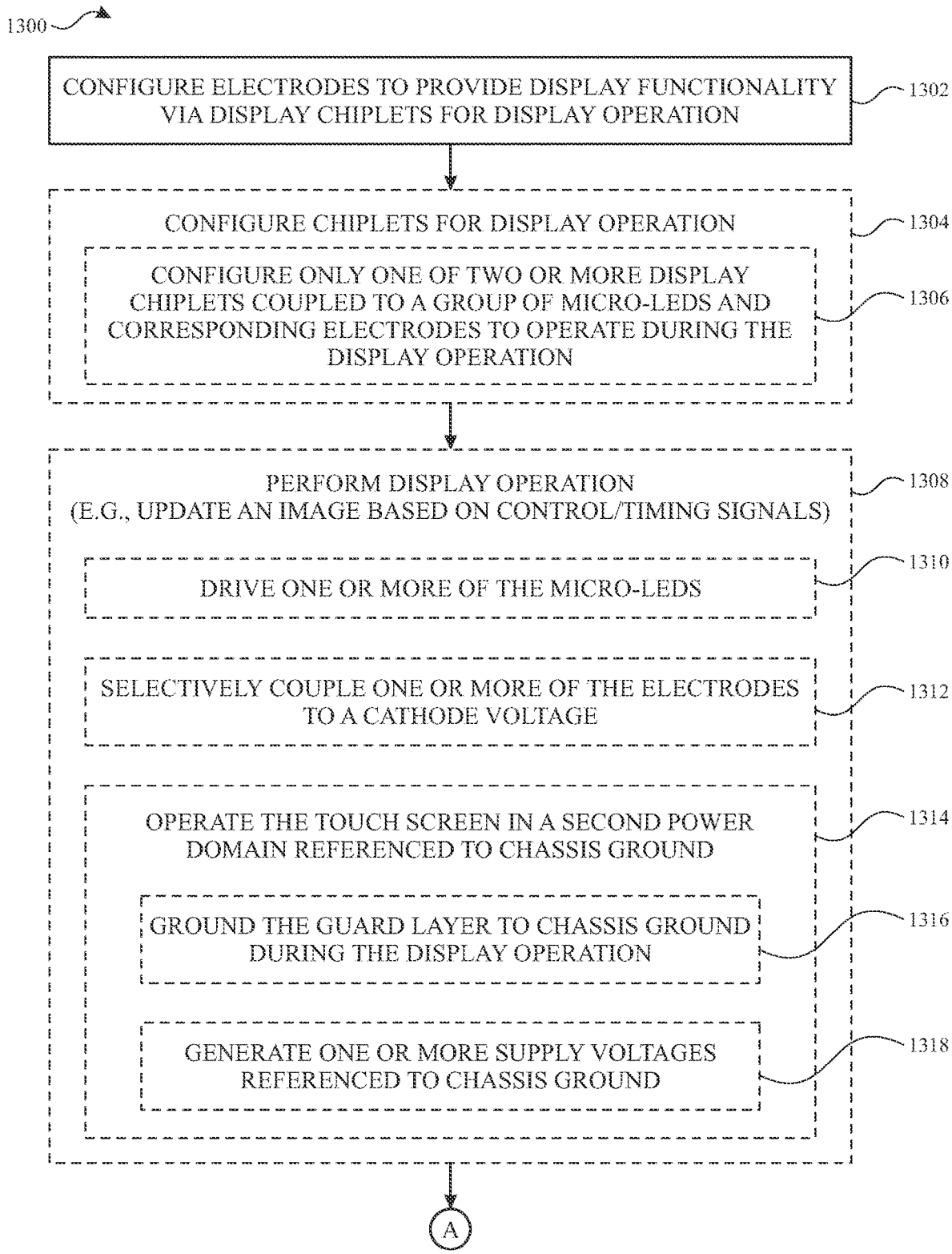
FIGS. 13A-13B illustrates an exemplary process of operating an integrated touchscreen according to examples of the disclosure.
Figure 13B:
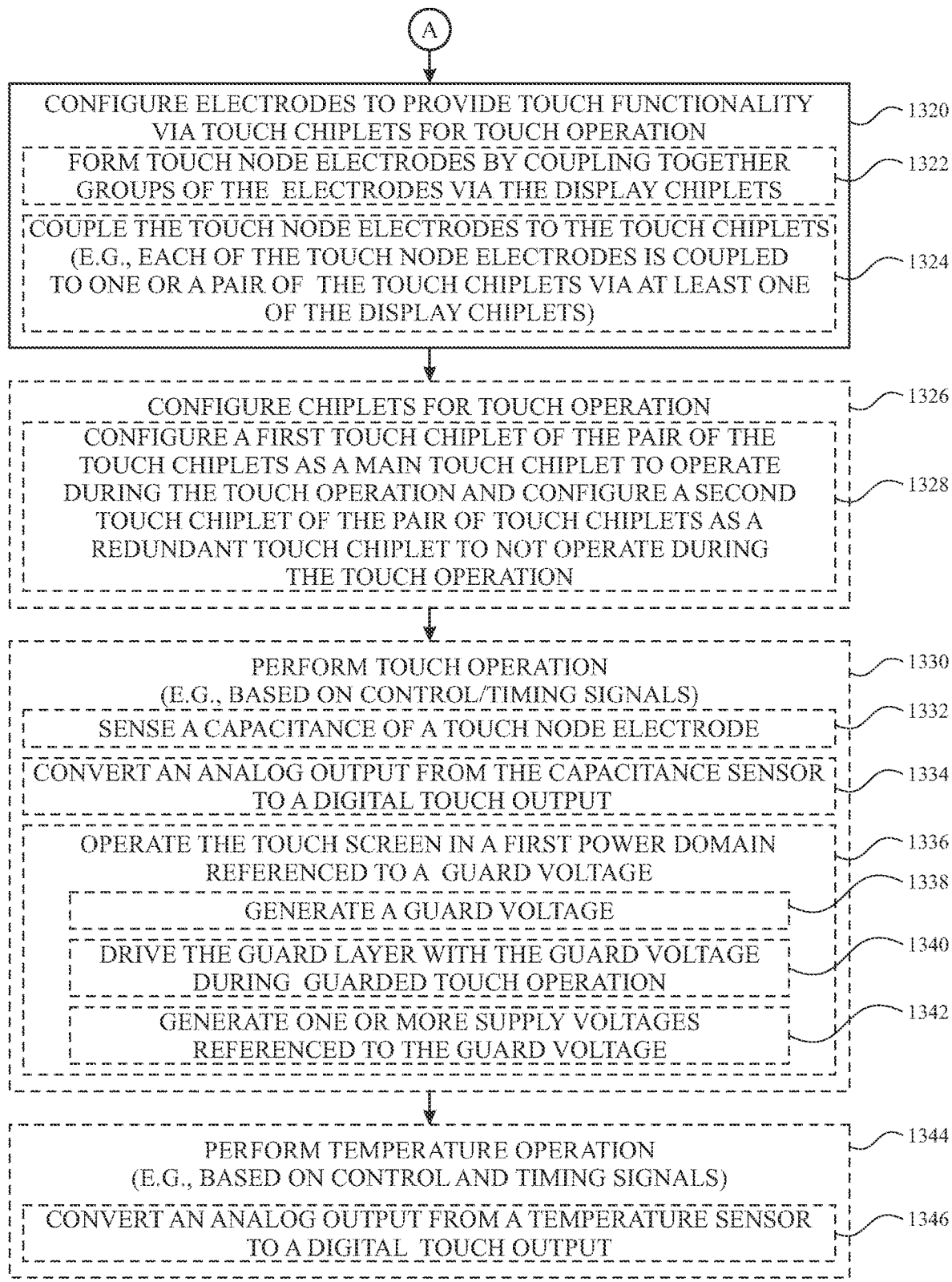

FIGS. 13A-13B illustrates an exemplary process 1300 of operating an integrated touchscreen according to examples of the disclosure. As described herein, the integrated touch screen can include display operation and touch operation (and optionally temperature operation). The electrodes of an integrated touch screen can be capable of providing display functionality via the one or more display chiplets during display operation and capable of providing touch functionality via the touch chiplets during touch operation. For example, at 1302, electrodes can be configured to provide display functionality via display chiplets for display operation. As described herein, unlike in touch operations where electrodes can be grouped to form touch node electrodes (e.g., by closing ITO switches 528 illustrated in display chiplet 514A in FIG. 5B), during the display operations, the electrodes can be selectively switched (e.g., by ITO switches 528) to apply a cathode voltage to electrodes operating as cathode terminals as described herein. In some examples, multiple display chiplets may be used for redundancy. In such examples, the display chiplets can be configured for display operation at 1304. In some examples, the display chiplets can be configured such that only one of the multiple display chiplets coupled to a group of micro-LEDs and corresponding electrodes operates on the group of micro-LEDs and corresponding electrodes (1306). At 1308, the touch screen can perform display operations. For example, the display operation can include updating an image on the display (e.g., display refresh), based on timing and/or control signals (e.g., from the touch and display controller). As described herein, the display operation can include driving one or more of the micro-LEDs (1310) and selectively coupling one or more of the electrodes to a cathode voltage (1312). For example, as described herein (e.g., with reference to FIG. 5B), selecting one of the ITO banks 506 using switches of ITO switches 528 and adjusting and providing the operating current of respective current drivers in display micro-drivers can address the illumination adjustment for each pixel controlled by a display chiplet. Additionally, as described herein, the touch screen can operate in a power domain referenced to chassis ground during display operation (1314). A guard layer can be grounded to chassis ground (1316) and the supply voltages (e.g., for display chiplets) can be referenced to chassis ground (1318).

At 1320, electrodes can be configured to provide touch functionality via touch chiplets for touch operation. As described herein, during the touch operation, touch node electrodes can be formed by coupling together groups of the electrodes. In some examples, the touch node electrodes can be formed by coupling together groups of the electrodes via the display chiplet(s) (1322). Touch node electrodes can be coupled to touch chiplets for sensing (1324). In some examples, each touch node electrode can be coupled to one corresponding touch chiplet via at least one display chiplet (e.g., as illustrated and described with reference to FIG. 5D). In some examples, each touch node electrode can be coupled to a pair of touch chiplets via at least one display chiplet (e.g., as illustrated and described with reference to FIG. 5C). In some examples, multiple touch chiplets (e.g., pairs) may be used for redundancy. The touch chiplets can be configured for touch operation at 1326. In some examples, a first touch chiplet of a pair of touch chiplets can be configured as a main touch chiplet to operate during the touch operation, and a second touch chiplet of the pair of touch chiplets can be configured as a redundant touch chiplet to not operate during the touch operation (1328). Additionally, in some examples, the touch chiplets can be configured to perform a specific type of touch scan. For example, the touch chiplets can be configured to drive (D), sense (S) and/or ground (G) a touch node electrode and to operate in self-capacitance and/or mutual capacitance configurations (e.g., as described herein with reference to FIGS. 8A-8F). At 1330, the touch screen can perform touch operations (e.g., based on timing and/or control signals from the touch and display controller). For example, the touch operation can include sensing a capacitance of a touch node electrode (1332). In some examples, an analog measurement by the touch chiplet can be converted to a digital value and output by the touch chiplet (1334). Additionally, as described herein (e.g., with reference to FIGS. 2B and 2C), the touch screen can operate in a power domain referenced to a guard voltage during touch operation (1336). A guard voltage can be generated at 1338 (e.g., by a guard integrated circuit). A guard layer can be driven by the guard voltage (1340) and the supply voltages (e.g., for touch chiplets) can be referenced to the guard voltage (1342).

In some examples, touch chiplets can also include touch sensors. In such examples, at 1344, the touch screen can perform touch operations (e.g., based on timing and/or control signals from the touch and display controller). In some examples, an analog measurement by the temperature sensor in the touch chiplet can be converted to a digital value (e.g., by an ADC) and output by the touch chiplet (1346).

Figure 14A:
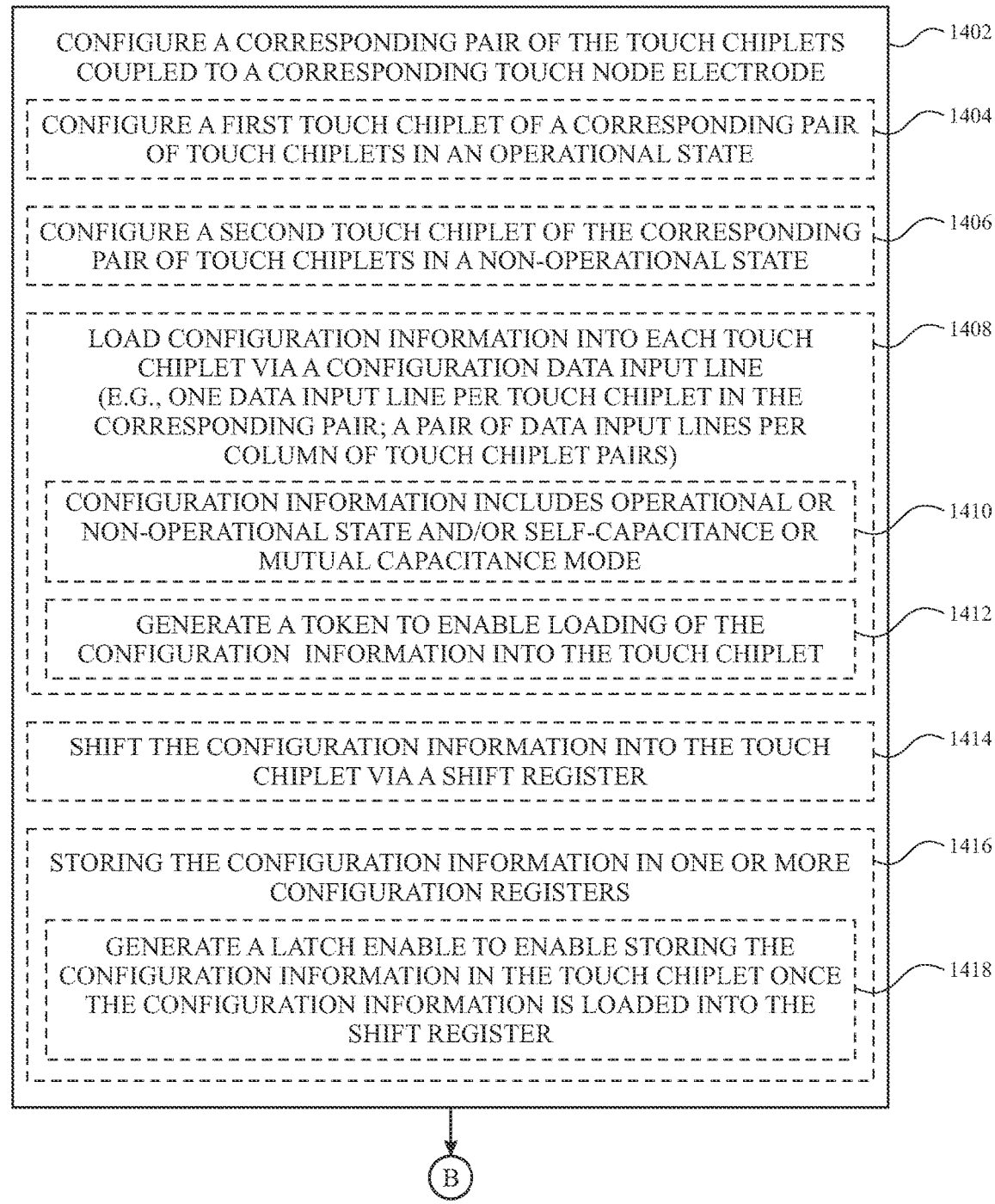
FIGS. 14A-14B illustrates an exemplary process of configuring touch chiplets and some operations with chiplets according to examples of the disclosure.
Figure 14B:
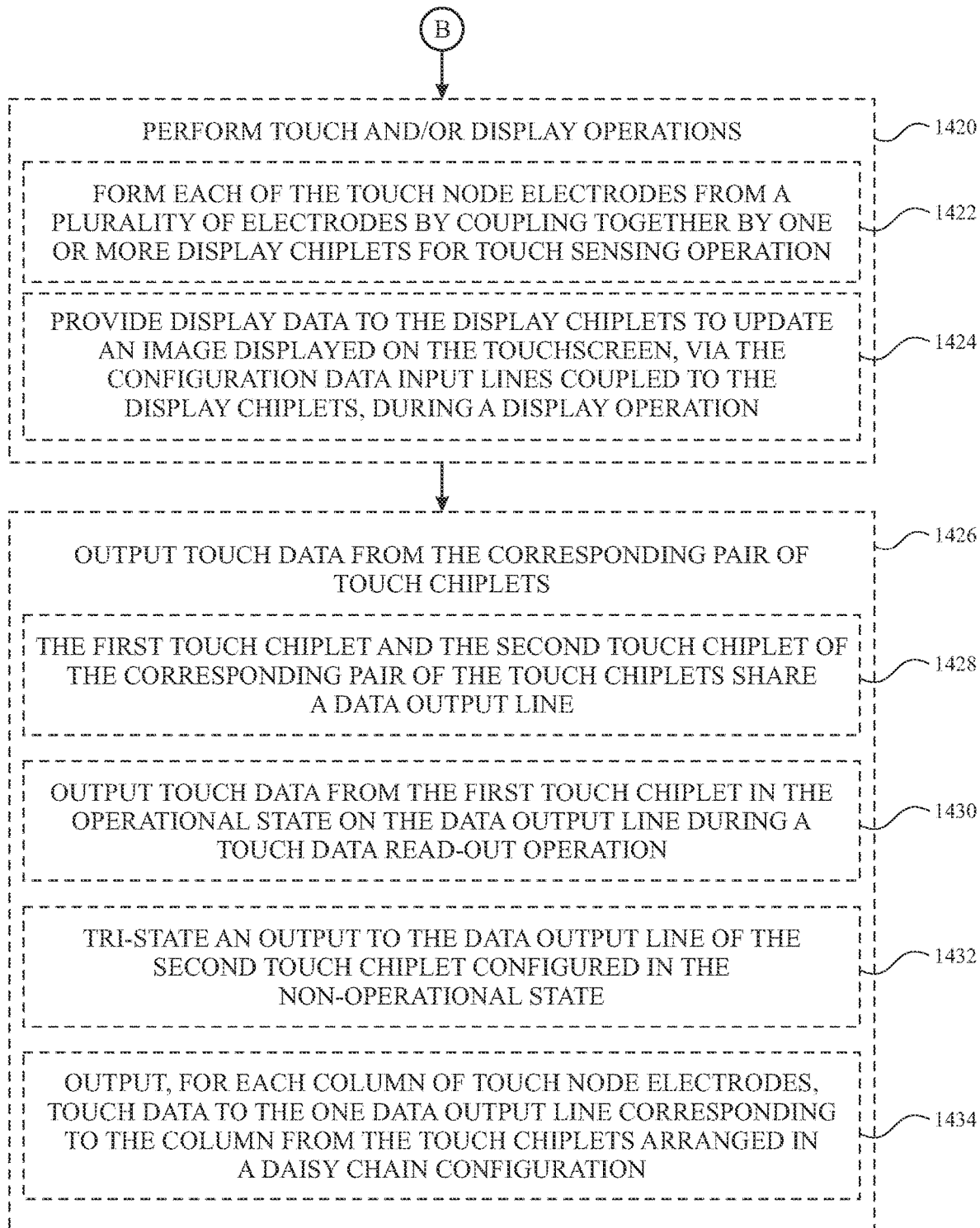

FIGS. 14A-14B illustrates an exemplary process 1400 of configuring touch chiplets and some operations with chiplets according to examples of the disclosure. As described herein, one of the touch chiplets in a pair of touch chiplets can be a "main" touch chiplet and the second touch chiplet of the pair of touch chiplets can be a "redundant" touch chiplet. The touch chiplets can be programmed (e.g., by the touch and display controller) with state information, so that one touch chiplet per touch node electrode can perform touch operations associated with the corresponding touch node electrode. At 1402, the system can configure a corresponding pair of the touch chiplets coupled to a corresponding touch node electrode with configuration information. The configuring can include configuring a first touch chiplet of a corresponding pair of touch chiplets in an operational state (1404) and configuring a second touch chiplet of the corresponding pair of touch chiplets in a non-operational state (1406). As described with reference to FIGS. 9 and 10A, the configuration information can be loaded into pair of touch chiplets via configuration data input lines (1408). In some examples, each column of touch node electrodes can include two data-in lines, one data-in line can be coupled to one of the pair of touch chiplets for each of the touch node electrodes in the column and a second data-in line can be coupled to a second of the pair of touch chiplets for each of the touch node electrodes in the column, to load data. The configuration information can include the operational or non-operational state (e.g., main or redundant) and/or a touch sensing mode, such as a mutual capacitance or self-capacitance mode (1410). In some examples, the information on the data line can be loaded into touch chiplet using a token (e.g., as described with reference to FIGS. 10A and 10C). In such examples, a token can be generated to enable loading of the configuration information into the touch chiplet (1412). At 1414, configuration information loaded into the touch chiplets can be shifted into the touch chiplet via a shift register (e.g., as described with reference to FIGS. 10A and 10B). At 1416, the configuration information can be stored in configuration registers after the configuration information is shifted into the touch chiplet (e.g., as described with reference to FIG. 10B). In some examples, the configuration information can be stored by latching the information in response to a latch enable signal. In such examples, the system can generate a latch enable to enable storing the configuration information in the touch chiplet (1418), as described with reference to FIG. 10D.

At 1420, touch and/or display (and/or temperature) operations can be performed. For example, as described herein, touch sensing operations can include forming touch node electrodes from a plurality of electrodes by coupling them together via one or more display chiplets (1422). In some examples, as described herein, display operations can include updating an image displayed on the touch screen (1424). In some examples, the data lines can be shared between touch chiplet configuration and display chiplets such that touch chiplet configuration information and display pixel data can be transmitted on the same data lines depending on the operating mode. This shared data line configuration can be achieved, for example, due to time multiplexing touch chiplet configuration and display operation as described with reference to FIG. 7B.

At 1426, touch data from touch operations can be output by the touch chiplets. In some examples, the first touch chiplet and the second touch chiplet of the corresponding pair of touch chiplets can share a data output line (1428). The first touch chiplet in the operational state can output touch data to the data line during a touch data read-out operation (1430). The second touch chiplet in the non-operational state can tri-state its output (1432). In some examples (e.g., as described in FIGS. 11A-11B, the data output line can be daisy chained. For example, touch data output for each column of touch node electrodes can be output to one data output corresponding to the column from the touch chiplets arranged in a daisy chain configuration (1434).

FIG. 15 illustrates an exemplary process 1500 of spectral analysis using touch chiplets according to examples of the disclosure. An integrated touch screen can include a plurality of regions and each of the plurality of regions including a plurality of touch node electrodes. In some example examples, the each of the touch node electrodes can have dimensions corresponding to the first area described above and each of the plurality of regions can have dimensions corresponding to the second area described above. The integrated touch screen can include touch chiplets coupled to the plurality of touch node electrodes. In some examples, each of the plurality of touch node electrodes can be coupled to a corresponding one of the touch chiplets. At 1502, touch chiplets can simultaneously sense the plurality of touch nodes electrodes of a plurality of regions in a spectral analysis mode while the touch chiplets do not stimulate the plurality of touch node electrodes, such that noise at multiple frequencies are simultaneously sensed for each of the plurality of regions. As described herein, simultaneously sensing the plurality of touch node electrodes can provide for spectral analysis without requiring aggregation and/or storing the touch data.

In some examples, simultaneously sensing the plurality of touch nodes electrodes of one of the plurality of regions can include, for each respective frequency of the multiple frequencies, configuring a first of the touch chiplets coupled to one of the touch node electrodes in the one of the plurality of regions to demodulate the sensed signal using a first demodulation signal at the respective frequency and having a first phase and configuring a second of the touch chiplets coupled to a second of the touch node electrodes in the one of the plurality of regions to demodulate the sensed signal using a second demodulation signal at the respective frequency and having a second phase, 90 degrees out of phase with the first phase (1504). For example, as illustrated in FIG. 12A, pairs of touch chiplets corresponding to multiple touch node electrodes in a region can be demodulated using in-phase and quadrature phases of respective frequencies f1-f8. In some examples, the plurality of touch node electrodes can be arranged in rows and columns. In some examples, as illustrated in FIGS. 12B and 12C, pairs of touch chiplets corresponding to multiple touch node electrodes in a region can be demodulated using in-phase and quadrature phases of respective frequencies f1-f8, where one frequency (but multiple phases) are applied to each column. In some examples, simultaneously sensing the noise at the multiple frequencies for one of the plurality of regions can include, for each respective frequency of the plurality of frequencies: configuring touch chiplets corresponding to a first column of the touch node electrodes to demodulate using a first demodulation signal at the respective frequency and having a first phase, and configure touch chiplets corresponding to a second column of the touch node electrodes to demodulate using a second demodulation signal at the respective frequency and having a second phase, 90 degrees out of phase with the first phase (1506). For example, as described above, two column of touch chiplets corresponding to multiple touch node electrodes in a region can be demodulated using a respective frequency, where one column can use in-phase demodulation signals and a second column can use quadrature demodulation signals, where the first and second columns use the same respective frequency for each touch chiplet.

In some examples (e.g., as illustrated in FIG. 12A), the region can correspond to sixteen touch nodes electrodes, and simultaneous sensing can include configuring sixteen corresponding touch chiplets to sense noise at eight different frequencies (1508). In some examples (e.g., as illustrated in each of FIGS. 12B and 12C), the region can correspond to sixteen touch nodes electrodes, and simultaneous sensing can include configuring sixteen corresponding touch chiplets to sense noise at four different frequencies (1510). In some examples, the region can correspond to sixty-four touch nodes electrodes, and simultaneous sensing can include configuring sixty-four corresponding touch chiplets to sense noise at thirty-two different frequencies (1508). In some examples, the region can correspond to sixty-four touch nodes electrodes, and simultaneous sensing can include configuring sixty-four corresponding touch chiplets to sense noise at eight different frequencies (1510).

At 1516, touch chiplets can demodulate the signals sensed by the touch chiplets (e.g., an output of the capacitive sensor) according to a demodulation signal. The demodulation signal can be provided to the touch chiplets from the touch and display controller. At 1518, the touch and display controller can identify one or more frequencies meeting one or more criteria to be classified as low-noise frequencies based on the digital outputs from the touch chiplets, as discussed herein.

Therefore, according to the above, some examples of the disclosure are directed to an integrated touchscreen. The integrated touch screen can comprise micro-LEDs, display chiplets, touch chiplets (optionally disposed in a visible area of the integrated touch screen), and electrodes. The electrodes can be capable of providing display functionality via the one or more display chiplets during display operation and can be capable of providing touch functionality via the touch chiplets during touch operation. Additionally or alternatively to one or more of the examples disclosed above, in some examples, the micro-LEDs, the display chiplets, and the touch chiplets can be mounted to a common substrate. Additionally or alternatively to one or more of the examples disclosed above, in some examples, the substrate can include metallic routing in one or more layers of the substrate to route signals for the micro-LEDs, the display chiplets, and the touch chiplets. Additionally or alternatively to one or more of the examples disclosed above, in some examples, the electrodes can be patterned in a two dimensional array in a conductive layer above the micro-LEDs, the display chiplets, and the touch chiplets. Additionally or alternatively to one or more of the examples disclosed above, in some examples, a planarization layer can separate the electrodes from the micro-LEDs, the display chiplets, and the touch chiplets. The electrodes can be patterned on the planarization layer. Additionally or alternatively to one or more of the examples disclosed above, in some examples, touch node electrodes can be formed by coupling together groups of the electrodes via the display chiplets. Additionally or alternatively to one or more of the examples disclosed above, in some examples, the touch node electrodes can be coupled to the touch chiplets. Each of the touch node electrodes can be coupled to at least one of the touch chiplets via at least one of the display chiplets. Additionally or alternatively to one or more of the examples disclosed above, in some examples, each of the touch node electrodes can be coupled to a pair of the touch chiplets via the at least one of the display chiplets. Additionally or alternatively to one or more of the examples disclosed above, in some examples, a first touch chiplet of the pair of the touch chiplets can be configured as a main touch chiplet to operate during the touch operation and a second touch chiplet of the pair of touch chiplets can be configured as redundant touch chiplet to not operate during the touch operation. Additionally or alternatively to one or more of the examples disclosed above, in some examples, a touch chiplet of the touch chiplets can comprise a capacitance sensor. Additionally or alternatively to one or more of the examples disclosed above, in some examples, the capacitance sensor can comprise an amplifier configured with a feedback path between an inverting input of the amplifier and an output of the amplifier, and a mixer coupled to the output of the amplifier configured to demodulate the output of the amplifier with a demodulation signal. Additionally or alternatively to one or more of the examples disclosed above, in some examples, the touch chiplet can further comprise an analog-to-digital converter (ADC) configured to convert analog output from the capacitance sensor to a digital touch output, and a digital output buffer configured to output the digital touch output to a data line coupled to the touch chiplet. Additionally or alternatively to one or more of the examples disclosed above, in some examples, the touch chiplet can further comprise an analog or digital filter. Additionally or alternatively to one or more of the examples disclosed above, in some examples, the touch chiplet can further comprise a temperature sensor. The ADC can be further configured to convert analog output from the temperature sensor to a digital temperature output. The digital output buffer can be further configured to output the digital temperature output to the data line coupled to the touch chiplet. Additionally or alternatively to one or more of the examples disclosed above, in some examples, the integrated touchscreen can further comprise a touch and display controller coupled to the display chiplets and the touch chiplets. The touch and display controller can be configured to provide control and timing signals to the display chiplets and the touch chiplets to update an image displayed on the integrated touch screen during the display operation and to perform a touch sensing scan during the touch operation. Additionally or alternatively to one or more of the examples disclosed above, in some examples, the integrated touchscreen can further comprise a guarding integrated circuit coupled to the touch and display controller. The guarding integrated circuit can be configured to generate a guard voltage and to operate the integrated touch screen in a first power domain referenced to the guard voltage during guarded touch operation and can be configured to operate the integrated touch screen in a second power domain referenced to a chassis ground during the display operation or during non-guarded touch operation. Additionally or alternatively to one or more of the examples disclosed above, in some examples, the integrated touchscreen can further comprise a power management integrated circuit coupled to the touch and display controller and the guarding integrated circuit. The power management integrated circuit can be configured to generate a one or more supply voltages in the first power domain or the second power domain. Additionally or alternatively to one or more of the examples disclosed above, in some examples, the integrated touchscreen can further comprise a guard layer disposed between the display chiplets and the touch chiplets and the chassis ground. The guard layer can be configured to be driven with the guard voltage during the guarded touch operation and can be configured to be grounded to the chassis ground during the display operation or during the non-guarded touch operation. Additionally or alternatively to one or more of the examples disclosed above, in some examples, each of the electrodes can be capable of operating as a cathode terminal of a bank of the micro-LEDs during the display operation. Additionally or alternatively to one or more of the examples disclosed above, in some examples, a display chiplet of the display chiplets can comprise a plurality of micro-drivers configured to drive one or more of the micro-LEDs, and switching circuitry configured to selectively couple one or more of the electrodes to a cathode voltage during the display operation. Additionally or alternatively to one or more of the examples disclosed above, in some examples, the switching circuitry can be further configured to selectively couple together multiple of the electrodes into a group of electrodes and couple the group of the electrodes to a sense line during the touch operation. Additionally or alternatively to one or more of the examples disclosed above, in some examples, the group of the electrodes can be coupled to at least one of the display chiplets. Additionally or alternatively to one or more of the examples disclosed above, in some examples, the group of the electrodes can be coupled to two or more of the display chiplets. Only one the two or more display chiplets can be configured to operate during the display operation.

Some examples of the disclosure are directed to an integrated touchscreen. The integrated touchscreen can comprise an integrated touch and display controller, touch chiplets coupled to the integrated touch and display controller, and touch node electrodes. Each of the touch node electrodes can be coupled to a corresponding pair of the touch chiplets. A first touch chiplet of the corresponding pair of the touch chiplets can be configured in an operational state and a second touch chiplet of the corresponding pair of touch chiplets can be configured in a non-operational state. Additionally or alternatively to one or more of the examples disclosed above, in some examples, the integrated touchscreen can further comprise display chiplets coupled to the touch chiplets. Each of the touch node electrodes can be formed from a plurality of electrodes coupled together by one or more of the display chiplets for touch sensing operation. Additionally or alternatively to one or more of the examples disclosed above, in some examples, the first touch chiplet and the second touch chiplet of the corresponding pair of the touch chiplets can share a data output line. Additionally or alternatively to one or more of the examples disclosed above, in some examples, the first touch chiplet can be configured in the operational state outputs touch data on the data output line during a touch data read-out operation. The second touch chiplet can be configured in the non-operational state tri-states its output to the data output line. Additionally or alternatively to one or more of the examples disclosed above, in some examples, the first touch chiplet and the second touch chiplet of the corresponding pair of the touch chiplets can receive distinct data input lines. Additionally or alternatively to one or more of the examples disclosed above, in some examples, the first touch chiplet and the second touch chiplet of the corresponding pair of the touch chiplets can receive a shared clock signal. Additionally or alternatively to one or more of the examples disclosed above, in some examples, each of the touch chiplets can comprise configuration logic circuitry. The configuration logic circuitry can be configured to load configuration information into the touch chiplet via a configuration data input line, and store the configuration information in one or more configuration registers. The configuration information can include state information of the operational state or the non-operational state. Additionally or alternatively to one or more of the examples disclosed above, in some examples, the configuration information can further include touch sensing mode information including a self-capacitance mode or a mutual capacitance mode. In the self-capacitance mode, a touch node electrode coupled to the touch chiplet can be configured to be stimulated and sensed by the touch chiplet, and in the mutual-capacitance mode, the touch node electrode coupled to the touch chiplet can be configured to be stimulated, sensed or grounded by the touch chiplet. Additionally or alternatively to one or more of the examples disclosed above, in some examples, the configuration logic circuitry can comprise a shift register configured to shift the configuration information into the touch chiplet. Additionally or alternatively to one or more of the examples disclosed above, in some examples, the configuration logic circuitry comprises logic configured to generate a token to enable loading of the configuration information into the touch chiplet via the shift register. Additionally or alternatively to one or more of the examples disclosed above, in some examples, the configuration logic circuitry can comprise logic configured to generate a latch enable to enable storing the configuration information in the touch chiplet once the configuration information is loaded into the shift register. Additionally or alternatively to one or more of the examples disclosed above, in some examples, the touch node electrodes can be arranged in rows and columns. The integrated touchscreen can further comprise configuration data input lines for each column of the touch node electrodes. For each column of the touch node electrodes, a first of the configuration data input lines can be coupled to a data input pin for a first touch chiplet of each corresponding pair of the touch chiplets corresponding to the column of touch node electrodes and a second of the configuration data input lines can be coupled to a data input pin for a second touch chiplet of each corresponding pair of the touch chiplets corresponding to the column of touch node electrodes. Additionally or alternatively to one or more of the examples disclosed above, in some examples, the configuration data input lines can be coupled to the display chiplets and can be configured to provide display data to the display chiplets to update an image displayed on the integrated touchscreen during a display operation. Additionally or alternatively to one or more of the examples disclosed above, in some examples, the touch node electrodes can be arranged in rows and columns. The integrated touchscreen can further comprise data output lines including one data output line coupling each column of touch node electrodes to the integrated touch and display controller. For each column of touch node electrodes, touch data can be output to the one data output line corresponding to the column from the touch chiplets arranged in a daisy chain configuration. In the daisy chain configuration, touch data output pins of the corresponding pair of the touch chiplets can be coupled together and coupled as inputs to touch data input pins of another corresponding pair of touch chiplets in the respective column.

Some examples of the disclosure are directed to an integrated touchscreen. The integrated touchscreen can comprise a plurality of regions, each of the plurality of regions including a plurality of touch node electrodes and touch chiplets coupled to the plurality of touch node electrodes. Each of the plurality of touch node electrodes can be coupled to a corresponding one of the touch chiplets. The touch chiplets can be configured to simultaneously sense the plurality of touch nodes electrodes of the plurality of regions in a spectral analysis mode while the touch chiplets do not stimulate the plurality of touch node electrodes, such that noise at multiple frequencies can be simultaneously sensed for each of the plurality of regions. Additionally or alternatively to one or more of the examples disclosed above, in some examples, each of the touch chiplets can comprise a capacitive sensor including a mixer configured to demodulate an output of the capacitive sensor according to a demodulation signal. Additionally or alternatively to one or more of the examples disclosed above, in some examples, the integrated touchscreen can further comprise an integrated touch and display controller configured to provide one or more demodulation signals to the touch chiplets. Additionally or alternatively to one or more of the examples disclosed above, in some examples, each of the touch chiplets can comprise an ADC to digitize an output of the mixer. The integrated touch and display controller can be configured to receive digital outputs from the touch chiplets, and identify one or more frequencies meeting one or more criteria to be classified as low-noise frequencies. Additionally or alternatively to one or more of the examples disclosed above, in some examples, simultaneously sensing the noise at the multiple frequencies for one of the plurality of regions can comprise, for each respective frequency of the multiple frequencies: configuring a first of the touch chiplets to demodulate using a first demodulation signal at the respective frequency and having a first phase, and configuring a second of the touch chiplets to demodulate using a second demodulation signal at the respective frequency and having a second phase, 90 degrees out of phase with the first phase. Additionally or alternatively to one or more of the examples disclosed above, in some examples, the plurality of touch node electrodes can be arranged in rows and columns. Simultaneously sensing the noise at the multiple frequencies for one of the plurality of regions can comprise, for each respective frequency of the plurality of frequencies: configuring touch chiplets corresponding to a first column of the touch node electrodes to demodulate using a first demodulation signal at the respective frequency and having a first phase, and configuring touch chiplets corresponding to a second column of the touch node electrodes to demodulate using a second demodulation signal at the respective frequency and having a second phase, 90 degrees out of phase with the first phase. Additionally or alternatively to one or more of the examples disclosed above, in some examples, the area of each of the plurality of touch node electrodes can be 1-2 square millimeters. Additionally or alternatively to one or more of the examples disclosed above, in some examples, the area of each of the plurality of regions can be 16-64 square millimeters. Additionally or alternatively to one or more of the examples disclosed above, in some examples, the area of each of the plurality of touch node electrodes can be 1.25 millimeters by 1.25 millimeters and the area of each of the plurality of regions can be 5 millimeters by 5 millimeters. Additionally or alternatively to one or more of the examples disclosed above, in some examples, the area of each of the plurality of regions can correspond to a size of a fingertip. Additionally or alternatively to one or more of the examples disclosed above, in some examples, each region can comprise sixteen touch node electrodes. Simultaneously sensing the noise at the multiple frequencies can comprise configuring sixteen corresponding touch chiplets to sense the noise at eight different frequencies. Additionally or alternatively to one or more of the examples disclosed above, in some examples, each region can comprise sixteen touch node electrodes. Simultaneously sensing the noise at the multiple frequencies can comprise configuring sixteen corresponding touch chiplets to sense the noise at four different frequencies. Additionally or alternatively to one or more of the examples disclosed above, in some examples, each region can comprise sixty-four touch node electrodes. Simultaneously sensing the noise at the multiple frequencies can comprise configuring sixty-four corresponding touch node touch chiplets to sense the noise at thirty-two different frequencies. Additionally or alternatively to one or more of the examples disclosed above, in some examples, each region can comprise sixty-four touch node electrodes. Simultaneously sensing the noise at the multiple frequencies can comprise configuring sixty-four corresponding touch node touch chiplets to sense the noise at eight different frequencies.

Some examples of the disclosure are directed to a method of operating a touchscreen comprising micro-LEDs, display chiplets, touch chiplets (optionally disposed in a visible area of the touch screen) and electrodes. The method can comprise configuring the electrodes to provide display functionality via the one or more display chiplets during display operation, and configuring the electrodes to provide touch functionality via the touch chiplets during touch operation. Additionally or alternatively to one or more of the examples disclosed above, in some examples, the method can further comprise forming touch node electrodes by coupling together groups of the electrodes via the display chiplets. Additionally or alternatively to one or more of the examples disclosed above, in some examples, the method can further comprise coupling the touch node electrodes to the touch chiplets. Each of the touch node electrodes can be coupled to at least one of the touch chiplets via at least one of the display chiplets. Additionally or alternatively to one or more of the examples disclosed above, in some examples, each of the touch node electrodes can be coupled to a pair of the touch chiplets via the at least one of the display chiplets. Additionally or alternatively to one or more of the examples disclosed above, in some examples, the method can further comprise configuring a first touch chiplet of the pair of the touch chiplets as a main touch chiplet to operate during the touch operation and configuring a second touch chiplet of the pair of touch chiplets as a redundant touch chiplet to not operate during the touch operation. Additionally or alternatively to one or more of the examples disclosed above, in some examples, a touch chiplet of the touch chiplets can comprise a capacitance sensor and an ADC. The method can further comprise sensing, during touch operation, a capacitance of a touch node electrode, and converting, at the ADC, an analog output from the capacitance sensor to a digital touch output. Additionally or alternatively to one or more of the examples disclosed above, in some examples, the touch chiplet can further comprise a temperature sensor. The method can further comprise converting, at the ADC, an analog output from the temperature sensor to a digital temperature output. Additionally or alternatively to one or more of the examples disclosed above, in some examples, the method can further comprise providing, from a touch and display controller, control and timing signals to the display chiplets and the touch chiplets to update an image displayed on the integrated touch screen during the display operation and to perform a touch sensing scan during the touch operation. Additionally or alternatively to one or more of the examples disclosed above, in some examples, the method can further comprise generating, at a guarding integrated circuit coupled to the touch and display controller, a guard voltage; operating the touch screen in a first power domain referenced to the guard voltage during guarded touch operation; and operating the touch screen in a second power domain referenced to a chassis ground during the display operation or during non-guarded touch operation. Additionally or alternatively to one or more of the examples disclosed above, in some examples, the method can further comprise generating, at a power management integrated circuit coupled to the touch and display controller and the guarding integrated circuit, one or more supply voltages in the first power domain or the second power domain. Additionally or alternatively to one or more of the examples disclosed above, in some examples, the method can further comprise driving a guard layer disposed between the chassis ground and the display chiplets and touch chiplets with the guard voltage during the guarded touch operation; and grounding the guard layer to chassis ground during the display operation or during the non-guarded touch operation. Additionally or alternatively to one or more of the examples disclosed above, in some examples, a display chiplet of the display chiplets can comprise a plurality of micro-drivers and switching circuitry. The method can further comprise driving one or more of the micro-LEDs during the display operation, and selectively coupling one or more of the electrodes to a cathode voltage during the display operation. Additionally or alternatively to one or more of the examples disclosed above, in some examples, the method can further comprise selectively coupling together multiple of the electrodes a group of electrodes and coupling the group of the electrodes to a sense line during the touch operation. Additionally or alternatively to one or more of the examples disclosed above, in some examples, the group of the electrodes can be coupled to two or more of the display chiplets. Only one the two or more display chiplets can be configured to operate during the display operation. Some examples of the disclosure are directed to a non-transitory computer readable storage medium. The non-transitory computer readable storage medium can store instructions, which when executed by a device comprising a touchscreen and one or more processing circuits, can cause the one or more processing circuits to perform any of the above methods.

Some examples of the disclosure are directed to a method of operating a touchscreen comprising an integrated touch and display controller, touch chiplets coupled to the integrated touch and display controller, and touch node electrodes. The method can comprise configuring a first touch chiplet of a corresponding pair of the touch chiplets coupled to a corresponding touch node electrode in an operational state, and configuring a second touch chiplet of the corresponding pair of touch chiplets coupled to the corresponding touch node electrode in a non-operational state. Additionally or alternatively to one or more of the examples disclosed above, in some examples, the touchscreen can further comprise display chiplets coupled to the touch chiplets. The method can further comprise forming each of the touch node electrodes from a plurality of electrodes by coupling together by one or more of the display chiplets for touch sensing operation. Additionally or alternatively to one or more of the examples disclosed above, in some examples, the first touch chiplet and the second touch chiplet of the corresponding pair of the touch chiplets share a data output line. Additionally or alternatively to one or more of the examples disclosed above, in some examples, the method can further comprise outputting touch data from the first touch chiplet in the operational state on the data output line during a touch data read-out operation, and tri-stating an output to the data output line of the second touch chiplet configured in the non-operational state. Additionally or alternatively to one or more of the examples disclosed above, in some examples, each of the touch chiplets can comprise configuration logic circuitry. The method can further comprise loading configuration information into the touch chiplet via a configuration data input line, and storing the configuration information in one or more configuration registers. The configuration information can include state information of the operational state or the non-operational state. Additionally or alternatively to one or more of the examples disclosed above, in some examples, the configuration information can further include touch sensing mode information including a self-capacitance mode or a mutual capacitance mode. The method can further comprise: stimulating and sensing, in the self-capacitance mode, a touch node electrode coupled to the touch chiplet; and stimulating, sensing or grounding, in the mutual-capacitance mode, the touch node electrode coupled to the touch chiplet. Additionally or alternatively to one or more of the examples disclosed above, in some examples, the method can further comprise shifting the configuration information into the touch chiplet via a shift register of the configuration logic circuitry. Additionally or alternatively to one or more of the examples disclosed above, in some examples, the method can further comprise generating a token to enable loading of the configuration information into the touch chiplet via the shift register. Additionally or alternatively to one or more of the examples disclosed above, in some examples, the method can further comprise generating a latch enable to enable storing the configuration information in the touch chiplet once the configuration information is loaded into the shift register. Additionally or alternatively to one or more of the examples disclosed above, in some examples, the touch node electrodes can be arranged in rows and columns. The touchscreen can further comprise configuration data input lines for each column of the touch node electrodes. The method can further comprise: coupling, for each column of the touch node electrodes, a first of the configuration data input lines to a data input pin for a first touch chiplet of each corresponding pair of the touch chiplets corresponding to the column of touch node electrodes; and coupling, for each column of the touch node electrodes, a second of the configuration data input lines to a data input pin for a second touch chiplet of each corresponding pair of the touch chiplets corresponding to the column of touch node electrodes. Additionally or alternatively to one or more of the examples disclosed above, in some examples, the method can further comprise coupling the configuration data input lines to the display chiplets; and providing display data to the display chiplets to update an image displayed on the touchscreen during a display operation. Additionally or alternatively to one or more of the examples disclosed above, in some examples, the touch node electrodes can be arranged in rows and columns. The touchscreen can further comprise data output lines including one data output line coupling each column of touch node electrodes to the integrated touch and display controller. The method can further comprise: outputting, for each column of touch node electrodes, touch data to the one data output line corresponding to the column from the touch chiplets arranged in a daisy chain configuration. In the daisy chain configuration, touch data output pins of the corresponding pair of the touch chiplets are coupled together and coupled as inputs to touch data input pins of another corresponding pair of touch chiplets in the respective column. Some examples of the disclosure are directed to a non-transitory computer readable storage medium. The non-transitory computer readable storage medium can store instructions, which when executed by a device comprising a touchscreen and one or more processing circuits, can cause the one or more processing circuits to perform any of the above methods.

Some examples of the disclosure are directed to a method of operating a touchscreen comprising a plurality of regions, each of the plurality of regions including a plurality of touch node electrodes and touch chiplets coupled to the plurality of touch node electrodes, each of the plurality of touch node electrodes coupled to a corresponding one of the touch chiplets. The method can comprise simultaneously sensing the plurality of touch nodes electrodes of the plurality of regions in a spectral analysis mode while the touch chiplets do not stimulate the plurality of touch node electrodes, such that noise at multiple frequencies can be simultaneously sensed for each of the plurality of regions. Additionally or alternatively to one or more of the examples disclosed above, in some examples, each of the touch chiplets can comprise a capacitive sensor. The method can further comprise: demodulating, at each of the touch chiplets, an output of the capacitive sensor according to a demodulation signal. Additionally or alternatively to one or more of the examples disclosed above, in some examples, the touch screen can comprise an integrated touch and display controller. The method can further comprise providing, from the integrated touch and display controller, one or more demodulation signals to the touch chiplets. Additionally or alternatively to one or more of the examples disclosed above, in some examples, each of the touch chiplets can comprise an ADC to digitize an output of the mixer. The method further comprising receiving, at the integrated touch and display controller, digital outputs from the touch chiplets; and identifying one or more frequencies meeting one or more criteria to be classified as low-noise frequencies based on the digital outputs from the touch chiplets. Additionally or alternatively to one or more of the examples disclosed above, in some examples, simultaneously sensing the noise at the multiple frequencies for one of the plurality of regions can comprise, for each respective frequency of the multiple frequencies: configuring a first of the touch chiplets to demodulate using a first demodulation signal at the respective frequency and having a first phase; and configuring a second of the touch chiplets to demodulate using a second demodulation signal at the respective frequency and having a second phase, 90 degrees out of phase with the first phase. Additionally or alternatively to one or more of the examples disclosed above, in some examples, the plurality of touch node electrodes can be arranged in rows and columns and simultaneously sensing the noise at the multiple frequencies for one of the plurality of regions can comprise, for each respective frequency of the plurality of frequencies: configuring touch chiplets corresponding to a first column of the touch node electrodes to demodulate using a first demodulation signal at the respective frequency and having a first phase; and configuring touch chiplets corresponding to a second column of the touch node electrodes to demodulate using a second demodulation signal at the respective frequency and having a second phase, 90 degrees out of phase with the first phase. Additionally or alternatively to one or more of the examples disclosed above, in some examples, each region can comprise sixteen touch node electrodes, and simultaneously sensing the noise at the multiple frequencies can comprise configuring sixteen corresponding touch chiplets to sense the noise at eight different frequencies. Additionally or alternatively to one or more of the examples disclosed above, in some examples, each region can comprise sixteen touch node electrodes, and simultaneously sensing the noise at the multiple frequencies can comprise configuring sixteen corresponding touch chiplets to sense the noise at four different frequencies. Additionally or alternatively to one or more of the examples disclosed above, in some examples, each region can comprise sixty-four touch node electrodes, and simultaneously sensing the noise at the multiple frequencies can comprise configuring sixty-four corresponding touch node touch chiplets to sense the noise at thirty-two different frequencies. Additionally or alternatively to one or more of the examples disclosed above, in some examples, each region can comprise sixty-four touch node electrodes, and simultaneously sensing the noise at the multiple frequencies can comprise configuring sixty-four corresponding touch node touch chiplets to sense the noise at eight different frequencies. Some examples of the disclosure are directed to a non-transitory computer readable storage medium. The non-transitory computer readable storage medium can store instructions, which when executed by a device comprising a touchscreen and one or more processing circuits, can cause the one or more processing circuits to perform any of the above methods.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:

1. An integrated touchscreen comprising:
a plurality of regions, each of the plurality of regions including a plurality of touch node electrodes; and
touch chiplets coupled to the plurality of touch node electrodes, wherein each of the plurality of touch node electrodes is coupled to a corresponding one of the touch chiplets;
wherein the touch chiplets are configured to simultaneously sense the plurality of touch nodes electrodes of the plurality of regions in a spectral analysis mode while the touch chiplets do not stimulate the plurality of touch node electrodes, such that noise at multiple frequencies are simultaneously sensed for each of the plurality of regions.

2. The integrated touchscreen of claim 1, wherein each of the touch chiplets comprises a capacitive sensor including a mixer configured to demodulate an output of the capacitive sensor according to a demodulation signal.

3. The integrated touchscreen of claim 2, further comprising an integrated touch and display controller configured to provide one or more demodulation signals to the touch chiplets.

4. The integrated touchscreen of claim 3, wherein each of the touch chiplets comprises an analog-to-digital converter (ADC) to digitize an output of the mixer;
wherein the integrated touch and display controller is configured to:
receive digital outputs from the touch chiplets; and
identify one or more frequencies meeting one or more criteria to be classified as low-noise frequencies.

5. The integrated touchscreen of claim 1, wherein simultaneously sensing the noise at the multiple frequencies for one of the plurality of regions comprises, for each respective frequency of the multiple frequencies:
configuring a first of the touch chiplets to demodulate using a first demodulation signal at the respective frequency and having a first phase; and
configuring a second of the touch chiplets to demodulate using a second demodulation signal at the respective frequency and having a second phase, 90 degrees out of phase with the first phase.

6. The integrated touchscreen of claim 1, wherein the plurality of touch node electrodes are arranged in rows and columns and wherein simultaneously sensing the noise at the multiple frequencies for one of the plurality of regions comprises, for each respective frequency of the multiple frequencies:

configuring touch chiplets corresponding to a first column of the touch node electrodes to demodulate using a first demodulation signal at the respective frequency and having a first phase; and
configuring touch chiplets corresponding to a second column of the touch node electrodes to demodulate using a second demodulation signal at the respective frequency and having a second phase, 90 degrees out of phase with the first phase.

7. The integrated touchscreen of claim 1, wherein an area of each of the plurality of touch node electrodes is 1-2 square millimeters and an area of each of the plurality of regions is 16-64 square millimeters.

8. The integrated touchscreen of claim 1, wherein an area of each of the plurality of regions corresponds to a size of a fingertip.

9. The integrated touchscreen of claim 1, wherein each region comprises sixteen touch node electrodes, and wherein simultaneously sensing the noise at the multiple frequencies comprises configuring sixteen corresponding touch chiplets to sense the noise at four different frequencies.

10. The integrated touchscreen of claim 1, wherein each region comprises sixty-four touch node electrodes, and wherein simultaneously sensing the noise at the multiple frequencies comprises configuring sixty-four corresponding touch node touch chiplets to sense the noise at eight different frequencies.

11. A method of operating a touchscreen comprising a plurality of regions, each of the plurality of regions including a plurality of touch node electrodes and touch chiplets coupled to the plurality of touch node electrodes, wherein each of the plurality of touch node electrodes is coupled to a corresponding one of the touch chiplets, the method comprising:
simultaneously sensing the plurality of touch nodes electrodes of the plurality of regions in a spectral analysis mode while the touch chiplets do not stimulate the plurality of touch node electrodes, such that noise at multiple frequencies are simultaneously sensed for each of the plurality of regions.

12. The method of claim 11, wherein each of the touch chiplets comprises a capacitive sensor, the method further comprising:
demodulating, at each of the touch chiplets, an output of the capacitive sensor according to a demodulation signal.

13. The method of claim 12, wherein the touchscreen comprises an integrated touch and display controller, the method further comprising:
providing, from the integrated touch and display controller, one or more demodulation signals to the touch chiplets.

14. The method of claim 13, wherein each of the touch chiplets comprises an analog-to-digital converter (ADC) to digitize an output of a mixer that is configured to demodulate an output of the capacitive sensor according to the one or more demodulation signals, the method further comprising:
receiving, at the integrated touch and display controller, digital outputs from the touch chiplets; and
identifying one or more frequencies meeting one or more criteria to be classified as low-noise frequencies based on the digital outputs from the touch chiplets.

15. The method of claim 11, wherein simultaneously sensing the noise at the multiple frequencies for one of the plurality of regions comprises, for each respective frequency of the multiple frequencies:

configuring a first of the touch chiplets to demodulate using a first demodulation signal at the respective frequency and having a first phase; and configuring a second of the touch chiplets to demodulate using a second demodulation signal at the respective frequency and having a second phase, 90 degrees out of phase with the first phase.

16. The method of claim 11, wherein the plurality of touch node electrodes are arranged in rows and columns and wherein simultaneously sensing the noise at the multiple frequencies for one of the plurality of regions comprises, for each respective frequency of the multiple frequencies:

configuring touch chiplets corresponding to a first column of the touch node electrodes to demodulate using a first demodulation signal at the respective frequency and having a first phase; and configuring touch chiplets corresponding to a second column of the touch node electrodes to demodulate using a second demodulation signal at the respective frequency and having a second phase, 90 degrees out of phase with the first phase.

17. The method of claim 11, wherein each region comprises sixteen touch node electrodes, and wherein simultaneously sensing the noise at the multiple frequencies comprises configuring sixteen corresponding touch chiplets to sense the noise at four different frequencies.

18. The method of claim 11, wherein each region comprises sixty-four touch node electrodes, and wherein simultaneously sensing the noise at the multiple frequencies comprises configuring sixty-four corresponding touch node touch chiplets to sense the noise at eight different frequencies.

19. A non-transitory computer readable storage medium storing instructions, which when executed by one or more processors, cause the one or more processors to perform a method of operating a touchscreen comprising a plurality of regions, each of the plurality of regions including a plurality of touch node electrodes and touch chiplets coupled to the plurality of touch node electrodes, wherein each of the plurality of touch node electrodes is coupled to a corresponding one of the touch chiplets, the method comprising:

simultaneously sensing the plurality of touch nodes electrodes of the plurality of regions in a spectral analysis mode while the touch chiplets do not stimulate the plurality of touch node electrodes, such that noise at multiple frequencies are simultaneously sensed for each of the plurality of regions.

20. The non-transitory computer readable storage medium of claim 19 wherein each of the touch chiplets comprises a capacitive sensor, the method of operating the touchscreen further comprising:

demodulating, at each of the touch chiplets, an output of the capacitive sensor according to a demodulation signal.

* * * * *